(12) United States Patent
Narita et al.

(10) Patent No.: US 7,005,368 B1
(45) Date of Patent: Feb. 28, 2006

(54) BUMP FORMING APPARATUS FOR CHARGE APPEARANCE SEMICONDUCTOR SUBSTRATE, CHARGE REMOVAL METHOD FOR CHARGE APPEARANCE SEMICONDUCTOR SUBSTRATE, CHARGE REMOVING UNIT FOR CHARGE APPEARANCE SEMICONDUCTOR SUBSTRATE, AND CHARGE APPEARANCE SEMICONDUCTOR SUBSTRATE

(75) Inventors: Shoriki Narita, Hirakata (JP); Yasutaka Tsuboi, Hirakata (JP); Masahiko Ikeya, Sakai (JP); Takaharu Mae, Hirakata (JP); Shinji Kanayama, Kashihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 93 days.

(21) Appl. No.: 10/651,199

(22) Filed: Aug. 29, 2003

Related U.S. Application Data

(62) Division of application No. 10/019,700, filed as application No. PCT/JP00/04280 on Jun. 29, 2000, now Pat. No. 6,818,975.

(30) Foreign Application Priority Data

| Jul. 2, 1999 | (JP) | 11-189053 |
| Oct. 15, 1999 | (JP) | 11-293702 |
| Oct. 29, 1999 | (JP) | 11-308855 |
| Nov. 15, 1999 | (JP) | 11-323979 |
| Jun. 20, 2000 | (JP) | 2000-184467 |

(51) Int. Cl.
*H01L 21/44* (2006.01)

(52) U.S. Cl. ............... 438/613; 438/800; 438/974; 438/612; 438/795; 438/110; 438/51; 438/492

(58) Field of Classification Search .......... 438/613, 438/612, 614, 615, 795, 800, 974, 110, 51, 438/55, 492
See application file for complete search history.

(56) References Cited

U.S. PATENT DOCUMENTS

| 5,341,979 A | 8/1994 | Gupta |
| 5,601,229 A | 2/1997 | Nakazato et al. |

(Continued)

FOREIGN PATENT DOCUMENTS

JP 55-87434 7/1980

(Continued)

*Primary Examiner*—Matthew Smith
*Assistant Examiner*—Igwe U. Anya
(74) *Attorney, Agent, or Firm*—Wenderoth, Lind & Ponack, L.L.P.

(57) ABSTRACT

The present invention provides a bump forming apparatus (101, 501) which can prevent charge appearance semiconductor substrates (201, 202) from pyroelectric breakdown and physical failures, a method carried out by the bump forming apparatus for removing charge of charge appearance semiconductor substrates, a charge removing unit for charge appearance semiconductor substrates, and a charge appearance semiconductor substrate. At least when the wafer is cooled after the bump bonding is connected on the wafer, electric charge accumulated on the wafer (202) because of the cooling is removed through direct contact with a post-forming bumps heating device (170), or the charge is removed by a decrease in temperature control so that charge can be removed in a noncontact state. Therefore, an amount of charge of the wafer can be reduced in comparison with the conventional art, so that the wafer is prevented from pyroelectric breakdown and damage such as a break or the like to the wafer itself.

8 Claims, 60 Drawing Sheets

U.S. PATENT DOCUMENTS

| | | | | |
|---|---|---|---|---|
| 5,665,167 A | * | 9/1997 | Deguchi et al. | ............ 118/728 |
| 5,719,739 A | * | 2/1998 | Horiguchi | .................. 361/220 |
| 6,034,578 A | | 3/2000 | Fujita et al. | |
| 6,056,191 A | | 5/2000 | Brouillette et al. | |
| 6,198,616 B1 | | 3/2001 | Dahimene et al. | |
| 6,600,137 B1 | | 7/2003 | Nonomura et al. | |

FOREIGN PATENT DOCUMENTS

| | | | | |
|---|---|---|---|---|
| JP | 62173428 A | * | 7/1987 | |
| JP | 01077111 | | 3/1989 | |
| JP | 402203180 A | | 8/1990 | |
| JP | 6-232132 | | 8/1994 | |
| JP | 07231014 A | * | 8/1995 | |
| JP | 08078418 | | 3/1996 | |
| JP | 11-87392 | | 3/1999 | |
| JP | 1116874 | | 6/1999 | |
| JP | 11-330573 | | 11/1999 | |
| JP | 2002009569 | | 1/2002 | |
| JP | 2002203995 | | 7/2002 | |

* cited by examiner

BUMP FORMING APPARATUS FOR CHARGE APPEARANCE SEMICONDUCTOR SUBSTRATE, CHARGE REMOVAL METHOD FOR CHARGE APPEARANCE SEMICONDUCTOR SUBSTRATE, CHARGE REMOVING UNIT FOR CHARGE APPEARANCE SEMICONDUCTOR SUBSTRATE, AND CHARGE APPEARANCE SEMICONDUCTOR SUBSTRATE

This is a Divisional Application of U.S. application Ser. No. 10/019,700, filed Jan. 2, 2002, now U.S. Pat. No. 6,818,975 which is the National Stage of International Application No. PCT/JP00/04280, filed Jun. 29, 2000.

TECHNICAL FIELD

The present invention relates to a bump forming apparatus for forming bumps onto a charge appearance type semiconductor substrate such as a piezoelectric substrate or the like which generate electric charge in accordance with a temperature (that is, a charge appearance semiconductor substrate), a method carried out by the bump forming apparatus for removing charge of the charge appearance semiconductor substrate, a charge removing unit installed in the bump forming apparatus for charge appearance semiconductor substrates, and a charge appearance semiconductor substrate.

BACKGROUND ART

Electronic components installed in devices, e.g., portable phones and the like have been made compact these days in association with a great miniaturization of the devices. There is a bump forming apparatus which forms bumps on electrode parts in circuit form parts formed on a semiconductor wafer without separating the circuit form parts individually from the semiconductor wafer. The bump forming apparatus of this kind comprises a carry-in device for taking out the semiconductor wafer without bumps formed yet, namely, a pre-forming bumps wafer from a first storage container where the wafers are stored before forming bumps, a second storage container for storing semiconductor wafers with formed bumps (i.e., a wafer with formed bumps) a bonding stage whereon the wafer is placed before forming bumps and which normally heats the semiconductor wafer to 250–270° C. so as to join the electrode parts and bumps, a carry-out device for moving the wafer with formed bumps into the second storage container, and a transfer device for transferring the wafer from the carry-in device to the bonding stage and from the bonding stage to the carry-out device.

Meanwhile, there are piezoelectric substrates on which SAW (Surface Acoustic Wave) filters, used in the portable phones or the like, are formed, substrates consisting of quartz unlike conventional ones of silicon, and compound semiconductor wafers having substrates formed of lithium tantalum, lithium niobium, gallium arsenide and so on. Although the compound semiconductor wafers or the like are normally heated to about 150° C. to a maximum of approximately 200° C. when bumps are formed, a speed in heating and cooling the wafers must be reduced in comparison with the conventional silicon wafers.

For example, a SAW filter 10 shown in FIG. 85 has an input side circuit 12 and an output side circuit 13 formed as a pair on a piezoelectric substrate 11. Bumps 19 are formed on electrode parts 18 of the SAW filter 10 by a bump forming head of the bump forming apparatus as shown in FIG. 88. Both of the input side circuit 12 and output side circuit 13 have a shape like a fine-toothed comb. The input side circuit 12 is oscillated by a supplied input electric signal. The oscillation propagates a surface 11a of the piezoelectric substrate 11, thereby vibrating the output side circuit 13. An electronic signal is generated and outputted by the output side circuit 13 based on the vibration. The SAW filter 10 thus passes only signals of a specific frequency. The SAW filter 10 shown in FIG. 85 is one of many SAW filters 10 formed in a matrix on the wafer-shaped piezoelectric substrate 11. Operations, for instance, forming bumps, etc. on circuit parts of the SAW filters 10 are carried out on the wafer-shaped piezoelectric substrate 11. Each SAW filter 10 is separated from the wafer-shaped piezoelectric substrate 11 at a final stage. The wafer-shaped piezoelectric substrate 11 has a characteristic that the substrate 11 is hard to charge, but it is difficult to remove electric charge from the substrate once it is charged.

Because of using the piezoelectric substrate 11 as above, electric charge is generated by deformation or the like of the wafer-shaped piezoelectric substrate 11 caused by a temperature rise and a temperature drop between a room temperature and the aforementioned approximately 150° C., so that front and rear faces of the wafer-shaped piezoelectric substrate 11 become charged. A quantity of the charge becomes approximately 9000V at maximum.

Since the wafer-shaped piezoelectric substrate 11 is thin by itself, the rear face thereof is possibly induced to vibrate by the vibration generated at the front face 11a, which adversely affects the vibration of the front face. For preventing generation of the vibration on the rear face, fine grooves 14 are formed as indicated in FIG. 87 on the rear face of the wafer-shaped piezoelectric substrate 11. Electric charge present inside the grooves 14 is difficult to remove. Although the grooves 14 are exaggeratively illustrated in FIG. 87, the grooves 14 are actually formed in a size conforming to a frequency to be processed by the SAW filter, and arranged by a pitch of approximately several $\mu$m-several hundreds Å(angstrom).

If the charged wafer-shaped piezoelectric substrate 11 is placed on, for example, the bonding stage, sparking takes place in some cases between the bonding stage and the piezoelectric substrate 11 or between the front and rear faces of the wafer-shaped piezoelectric substrate 11. If the sparking occurs, the sparking melts the comb teeth part thereby breaking the circuit as indicated by reference numerals 15–17 in FIG. 86. Also, when the wafer-shaped piezoelectric substrate 11 is brought to, for example, above the bonding stage, the wafer-shaped piezoelectric substrate 11 is attracted towards the bonding stage by charge, and consequently the wafer-shaped piezoelectric substrate 11 may be broken by the attraction force. Furthermore, when the piezoelectric substrate 11 is to be moved again after putting on the bonding stage, the piezoelectric substrate may be broken if the substrate is forced to move because a uniting force to the bonding stage is so strong.

As above, in the bump forming apparatus for forming bumps onto the substrate which generates electric charge consequent to a temperature change in the temperature rise and temperature drop such as the wafer-shaped piezoelectric substrate 11, quartz substrate wafer, compound semiconductor wafer and the like, it becomes an important issue to eliminate charge, whereas it was not a fundamental problem in the conventional bump forming apparatus for forming bumps on silicon wafers.

In the meantime, as is disclosed, for example, in the published specification of Japanese Patent Laid-Open Publication No. 55-87434, a wafer is proposed in which an aluminum film is formed along a dicing line provided on a front face of the wafer to let electric charge of the front face out to a periphery of the wafer along the dicing line, thereby removing the charge through the periphery, or in which an aluminum film is formed on the entire rear face of the wafer to facilitate elimination of charge from the rear face. It is possible to remove charge from the wafer in this manner. But the aluminum film of the rear face may be separated to cause troubles at the application of a pressure and ultrasonic vibration to the rear face by a pressing member because the pressure and ultrasonic vibration are applied with the pressing member brought into contact with the rear face, for example, when each chip cut out from the wafer is flip chip mounted to the substrate via the bump. Therefore, the aluminum film formed for the purpose of elimination of charge should be removed before the chip is mounted, resulting in an increase of processes and costs.

On the other hand, since charge is generated consequent to the temperature change in the temperature rise and temperature drop of the wafer-shaped piezoelectric substrate 11, quartz substrate wafer or compound semiconductor wafer as discussed above, a speed of the temperature rise and temperature drop should be set lower than in conventional silicon wafers. As a result, a cycle time becomes undesirably lengthy in the case of the piezoelectric substrate 11, as compared with conventional silicon wafers not accompanied with generation of charge. Moreover, for example, when the temperature change takes place as the wafer-shaped piezoelectric substrate 11, quartz substrate wafer or compound semiconductor wafer is placed on the bonding stage after being raised in temperature, the wafer-shaped piezoelectric substrate 11 is warped due to a difference between a raised temperature and a temperature of the bonding stage. This warpage should be corrected, because the wafer-shaped piezoelectric substrate 11 would crack, be chipped or break if bumps were formed on the warped substrate.

The present invention is devised to solve the above-described problems, and has for its object to provide a bump forming apparatus which can effectively remove charge generated as a result of a temperature rise and a temperature drop of charge appearance semiconductor substrates before and after bumps are formed on the substrates, can operate with a cycle time not inferior to a cycle time for substrates not accompanied with generation of charge even in the presence of a temperature difference, and will not break the charge appearance semiconductor substrates (that is, can prevent the charge appearance semiconductor substrates from pyroelectric breakdown and physical failures. A further object is to provide a method carried out by the bump forming apparatus for removing the charge of charge appearance semiconductor substrates, to provide a charge removing unit installed in the bump forming apparatus for charge appearance semiconductor substrates, and to provide a charge appearance semiconductor substrate.

SUMMARY OF THE INVENTION

In accomplishing this and other objects and features, a bump forming apparatus for charge appearance semiconductor substrates is provided according to a first aspect of the present invention, which is equipped with a bump forming head for forming bumps onto electrodes of a circuit on the charge appearance semiconductor substrate which generates electric charge in consequence of a temperature change in a state while heated to a bump bonding temperature necessary for forming the bumps.

The bump forming apparatus comprises a heating and cooling apparatus for eliminating electric charge generated on the substrate as a result of a decrease in temperature when cooling the substrate after bumps are bonded to the heated substrate; and a controller for executing a decrease in temperature control for cooling the substrate after the bonding by controlling the heating and cooling apparatus.

In the above constitution, because of the heating and cooling apparatus and the controller, at least when the charge appearance semiconductor substrate is cooled after the bumps are bonded thereto, charge accumulated on the charge appearance semiconductor substrate is removed. Therefore an amount of charge of the charge appearance semiconductor substrate can be reduced in comparison with the conventional art. Occurrences of damages such as a pyroelectric breakdown of the circuit formed on the charge appearance semiconductor substrate and a break of the charge appearance semiconductor substrate itself caused by the charging can be prevented accordingly.

In a bump forming apparatus for charge appearance semiconductor substrates according to a second aspect of the present invention, when executing the cooling, the heating and cooling apparatus can be adopted to come in contact with a rear face opposite to a front face as a circuit-formed face of the charge appearance semiconductor substrate so as to eliminate charge generated on the substrate because of the decrease in temperature in the cooling.

According to a third aspect of the present invention, there is provided a method for removing charge of charge appearance semiconductor substrates which generate charge a temperature change thereof. The method comprises forming bumps on electrodes of a circuit on the substrate with the substrate heated to a bump bonding temperature necessary for forming the bumps, and, when the substrate is cooled after forming bumps, and eliminating electric charge which is generated on the substrate as a result of a decrease in temperate in cooling the substrate through a load member on which the substrate is placed.

According to this constitution, electric charge can be eliminated, because the heating and cooling apparatus comes in direct contact with the charge appearance semiconductor substrate when the substrate is cooled after the bumps are formed thereto.

According to a fourth aspect of the present invention, the bump forming apparatus for charge appearance semiconductor substrates can be configured so that the heating and cooling apparatus preheats the substrate to a level near the bump bonding temperature before heating the substrate to the bump bonding temperature, and further eliminates charge generated on the substrate because of a temperature rise by the preheating through contact with the rear face of the substrate. The controller executes a temperature rise control for the preheating operation of the heating and cooling apparatus.

According to the above constitution, electric charge generated on the charge appearance semiconductor substrate by the preheating of the substrate to the bump bonding temperature can be removed as well. Damages such as the pyroelectric breakdown and the break, etc., can be further reduced.

According to a fifth aspect of the present invention, the bump forming apparatus for charge appearance semiconductor substrates can be constituted in a structure wherein the heating and cooling apparatus comprises a bump bonding stage for heating the substrate to the bump bonding temperature, and a cooling device for cooling the substrate in accordance with the decrease in temperature control by the controller. The cooling device includes a heat diffuser member which comes in contact with the rear face of the substrate, a heating part detachable from the heat diffuser member for raising the heat diffuser member in temperature, and a separator for separating the heat diffuser member and the heating part so as to promote cooling of the heat diffuser member.

In the bump forming apparatus for charge appearance semiconductor substrates according to a sixth aspect of the present invention, the heating and cooling apparatus may comprise a bump bonding stage for heating the substrate to the bump bonding temperature, and a preheat device for preheating the substrate in accordance with the temperature rise control by the controller. The preheat device may include a heat diffuser member which comes in contact with the rear face of the substrate, a heating part which comes in contact with the heat diffuser member so as to raise the heat diffuser member in temperature, and a separator for separating the heat diffuser member and the heating part so as to promote cooling of the heat diffuser member.

According to the above constitution, since the heat diffuser member and the heating part are separated by the separator, the cooling of the heat diffuser member is accelerated, thereby shortening a cycle time in comparison with the conventional art. Moreover, the heating part can have a longer service life.

According to a seventh aspect of the present invention, the bump forming apparatus for charge appearance semiconductor substrates may further include a gas supply device for supplying a gas to the substrate placed to the heating and cooling apparatus. The controller executes a warpage correction control for correcting a warpage of the substrate place on the heating and cooling apparatus by controlling either the gas supply device, or the heating and cooling apparatus.

In the above arrangement of blowing the gas to the charge appearance semiconductor substrate from the gas supply device, the warpage of the charge appearance semiconductor substrate can be corrected and the damage such as break or the like can be prevented.

In the bump forming apparatus for charge appearance semiconductor substrate according to an eighth aspect of the present invention, it can be so arranged that the controller executes a blowing control for charge removal for eliminating charge generated on the substrate placed on the heating and cooling apparatus by controlling the gas supply device.

According to the above constitution, since the controller executes the blowing control for charge removal by controlling the gas supply device, the blowing control enables electric charge of the charge appearance semiconductor substrate to be removed, so that the damage such as pyroelectric breakdown and break or the like can be avoided.

According to a ninth aspect of the present invention, the bump forming apparatus for charge appearance semiconductor substrates may be further equipped with a contact member for charge removal which comes in contact with the front face of the substrate thereby removing charge of an amount generated on the front face.

Not only can electric charge of the front face of the charge appearance semiconductor substrate be eliminated by the contact member, but the damage such as pyroelectric breakdown and break and the like can be prevented in the arrangement.

According to a 10th aspect of the present invention, the bump forming apparatus for charge appearance semiconductor substrates may be designed to further include an ion generator for generating ions for neutralizing charge accumulated on the substrate.

Electric charge of the charge appearance semiconductor substrate can be neutralized by the ion generator arranged as above and the damage such as pyroelectric breakdown, break and the like can be prevented.

In the bump forming apparatus for charge appearance semiconductor substrates according to an 11th aspect of the present invention, the apparatus can be configured to further comprise a wafer holding part with holding hooks for holding the substrate by the holding hooks and transferring the substrate to the heating and cooling apparatus. The wafer holding part and the holding hooks are coated with an insulating material at a portion where the ions generated from the ion generator act.

Since the holding hook portions of the wafer holding part are coated with the insulating material, ions generated from the ion generator can be prevented from acting on a metallic part to decrease the charge removal effect.

According to a 12th aspect of the present invention, in the bump forming apparatus for charge appearance semiconductor substrates, the heating and cooling apparatus may be metal plated at a portion in contact with the rear face of the substrate for improving a heat conductivity between the heating and cooling apparatus and the substrate and removing a charge from the substrate.

The metal plating in the above constitution improves the heat conductivity between the heating and cooling apparatus and the substrate, and enhances the charge removal effect for the substrate.

A charge removing unit for charge appearance semiconductor substrates according to a 13th aspect of the present invention comprises comprises a heating/cooling apparatus which comes in contact with a rear face opposite to a front face as a circuit-formed face of the charge appearance semiconductor substrate which generates charge in consequence of a temperature change, thereby removing charge generated on the substrate as a result of a decrease in temperature in cooling the substrate after heating the substrate; and a controller for executing a decrease in temperature control for cooling the substrate by controlling the heating and cooling apparatus.

A charge appearance semiconductor substrate provided according to a 14th aspect of the present invention comprises a region for charge removal which is formed at a front circuit-formed face of the charge appearance semiconductor substrate which generates charge due to a temperature change and which is formed of a conductor for eliminating charge generated to the substrate; and dicing lines, connected to the region for charge removal, for dicing circuit-formed parts formed to the front face from the substrate.

A charge removal method according to a 15th aspect of the present invention, comprises bringing a charge appearance semiconductor substrate defined in the 14th aspect into contact with a contact member for charge removal defined in the ninth aspect; and eliminating charge generated on the substrate.

According to the charge appearance semiconductor substrate of the 14th aspect and the charge removal method of the 15th aspect, the region for charge removal and the dicing lines are arranged so that charge generated on the charge appearance semiconductor substrate can be eliminated from the region for charge removal, or via the region for charge removal and the dicing lines. The damage resulting from the charge such as pyroelectric breakdown of the circuit formed on the substrate and breakage of the substrate itself can be prevented accordingly. An amount of charge of the charge appearance semiconductor substrate varies, for example, depending on the manner of earthing from the circuit-formed parts of the substrate to the dicing lines of the substrate. The amount of charge can be reduced to approximately ±20V without using the ion generator when electric charge is removed most effectively. The amount of charge can be reduced to approximately ±200V on average.

According to a 16th aspect of the present invention, a charge appearance semiconductor substrate has an amount of charge of not larger than ±200V because of eliminating charge generated on the charge appearance semiconductor substrate which generates charge due to a temperature change.

According to a 17th aspect of the present invention, electric charge of the charge appearance semiconductor substrate is removed by the charge removal method of the above-described third aspect.

The bump forming apparatus for charge appearance semiconductor substrates according to an 18th aspect of the present invention may be configured so that the decrease in temperature control by the controller eliminates charge generated on the charge appearance semiconductor substrate as a result of the decrease in temperature in the cooling. Meanwhile, the heating and cooling apparatus heats the substrate to the bump bonding temperature in a non-contact state with respect to the substrate, and cools the substrate in the non-contact state in accordance with the decrease in temperature control by the controller after the bonding.

According to a 19th aspect of the present invention, a method for removing charge of charge appearance semiconductor substrates which generates electric charge in consequence of a temperature change is provided. The method comprises forming bumps on electrodes formed in a circuit on the substrate which generates electric charge due to a temperature change with the substrate heated to a bump bonding temperature necessary for forming the bumps; and after the bump-forming, when the substrate is cooled with using a cooling device arranged in a non-contact state with respect to the substrate for heating the substrate thereby adjusting a decrease in temperature of the substrate, executing a decrease in temperature control for eliminating charge generated as a result of the decrease in temperature in cooling the substrate to the cooling device.

Since the decrease in temperature is controlled so that the heating and cooling apparatus can remove electric charge accumulated on the substrate while in the non-contact state with respect to the substrate when the substrate is cooled after having bumps formed thereon, the amount of electric charge can be reduced as compared with the conventional art. The damage caused by the charging to the circuit formed on the substrate and breakage the substrate itself can be prevented without providing the substrate with a charge removal means for removing charge.

According to a 20th aspect of the present invention, the decrease in temperature control in the bump forming apparatus of the 18th aspect can be designed to alternately repeat a decrease in temperature and a temperature rise by a temperature width smaller than a decrease temperature width of the decrease in temperature.

In the above bump forming apparatus for charge appearance semiconductor substrates of the 18th aspect, the heating of the substrate at the heating and cooling apparatus to the bump bonding temperature may include a preheating operation for preliminarily heating the substrate to near the bump bonding temperature. The controller may further execute a temperature rise control for removing charge generated on the charge appearance semiconductor substrate as a result of a temperature rise in the preheating by controlling the heating and cooling apparatus.

The aforementioned temperature rise control can be designed to alternately repeat a temperature rise, and a decrease in temperature by a temperature width smaller than a raise temperature width of the temperature rise.

A charge removing unit for charge appearance semiconductor substrates is provided according to a 21st aspect of the present invention. The unit comprises a controller for executing a decrease in temperature control to eliminate electric charge generated as a result of a decrease in temperature in cooling after heating the charge appearance semiconductor substrate which generates electric charge due to a temperature change; and a heating and cooling apparatus for heating the substrate in a non-contact state to the substrate and cooling the substrate in accordance with the decrease in temperature control by the controller after the cooling.

A charge appearance semiconductor substrate according to a 22nd aspect of the present invention has charge removed by the charge removal method of the 19th aspect.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Figure 1:
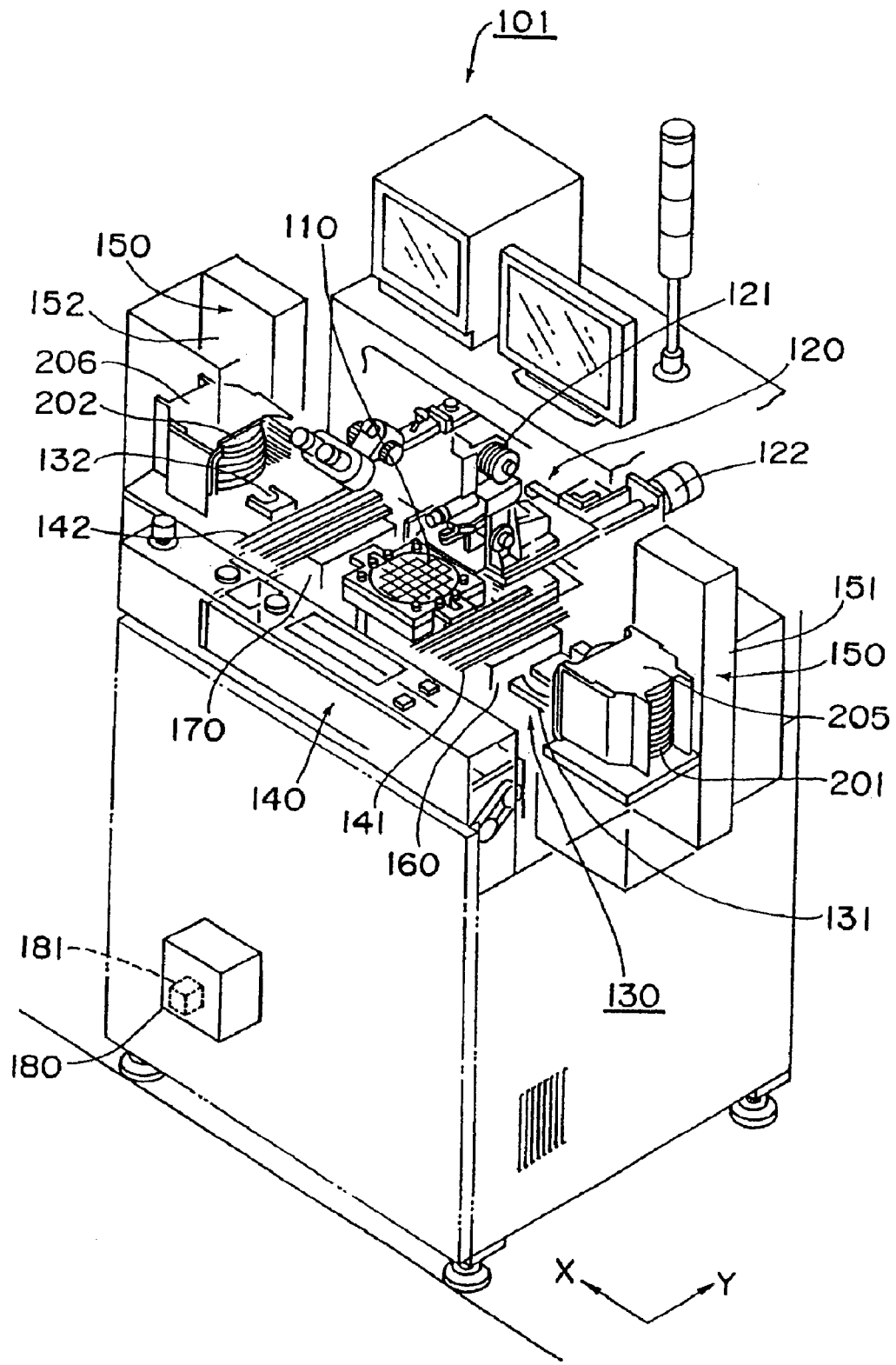
FIG. 1 is a perspective view of an entire bump forming apparatus according to a first embodiment of the present invention.

A bump forming apparatus, a method carried out by the bump forming apparatus for removing charge from a charge appearance semiconductor substrates, a charge removing unit installed on the bump forming apparatus for removing charge of the charge appearance semiconductor substrates, and a charge appearance semiconductor substrate which are embodiments of the present invention will be described with reference to the drawings. It is to be noted that like parts are designated by like reference numerals throughout the drawings.

Figure 2:
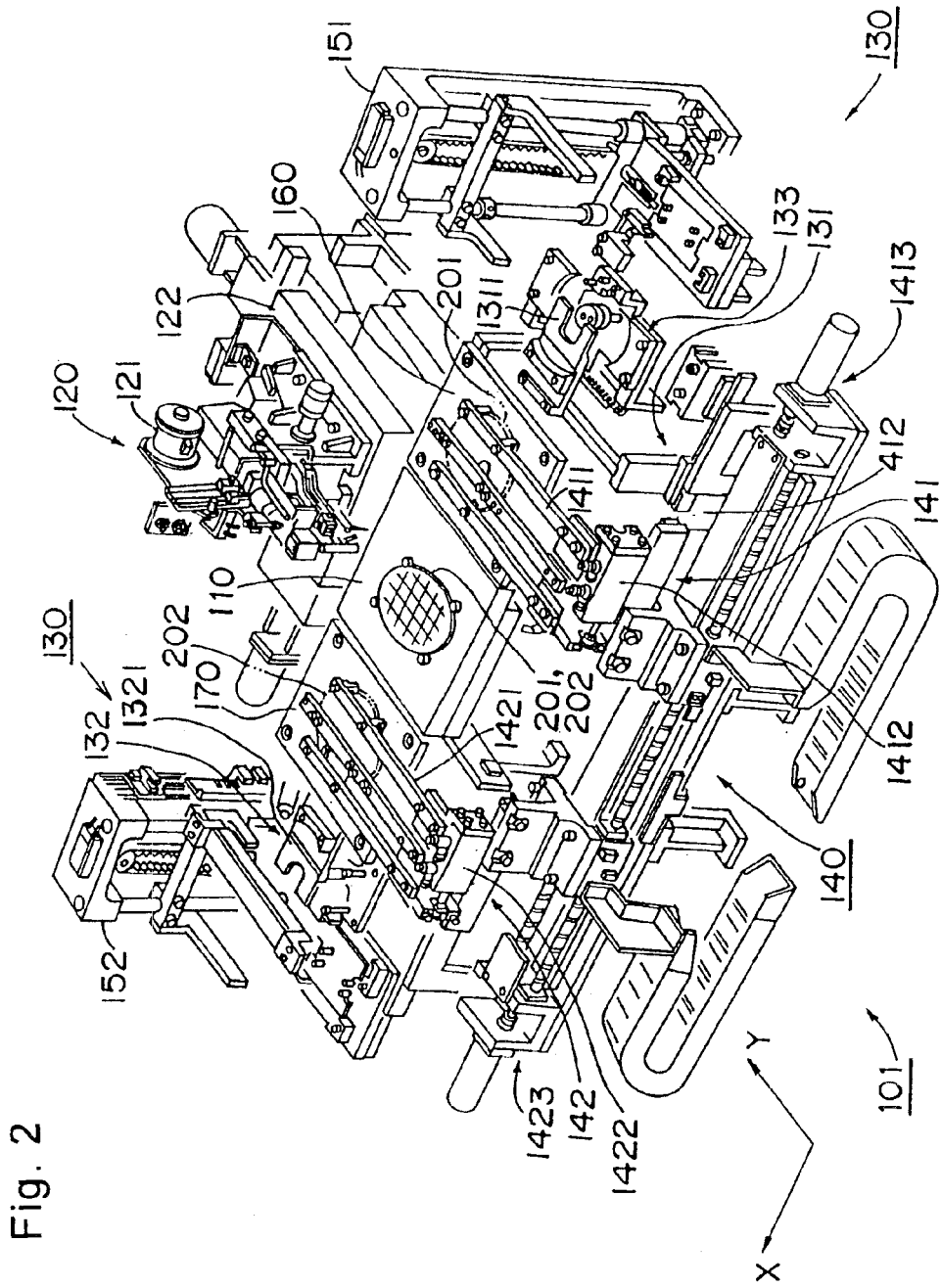
FIG. 2 is a perspective view showing in detail of essential parts of the bump forming apparatus of FIG. 1.

A bump forming apparatus 101 according to the embodiment shown in FIGS. 1 and 2 is appropriate to process a wafer-shaped piezoelectric substrate (referred to as a "piezoelectric substrate wafer" hereinafter) for forming the SAW filter mentioned before, and will be described below by way of example to form bumps to the piezoelectric substrate wafer. However, objects to be processed by the apparatus are not limited to the piezoelectric substrate wafer. In other words, the bump forming apparatus 101 of the embodiment is applicable to compound semiconductor wafers such as, e.g., $LiTaO_3$, $LiNbO_3$ and the like corresponding to charge appearance type semiconductor substrates which generate electric charge in consequence of a temperature change (referred to simply as "charge appearance semiconductor substrates" below), and quartz semiconductor wafers with a quartz substrate, etc. The apparatus is also applicable to Si semiconductor wafers with an Si substrate, in which case the wafer when bumps are formed thereto is heated to a temperature of approximately 250–270° C. as discussed earlier.

The bump forming apparatus 101 has a first storage container 205 for storing in layers piezoelectric substrate wafers 201 before bumps are formed, and a second storage container 206 for storing in layers piezoelectric substrate wafers 202 after bumps are formed. That is, the bump forming apparatus is a double magazine type. However, the apparatus is not limited to this type, and can be constructed as a single magazine type having both of the wafers 201 and 202 stored in one storage container.

A bonding stage 110, a preheat device 160, and a post-forming bumps heating device 170 which will be described below form a heating/cooling apparatus, and the post-forming bumps heating device 170 is an example functioning as a cooling device.

The heating/cooling apparatus and a controller 180 to be described later constitute the charge removing unit.

The bump forming apparatus 101 roughly comprises one bonding stage 110, one bump forming head 120, a carry unit 130, a transfer device 140 provided for each of a carry-in side and a carry-out side, a lifting device 150 provided with each of the storage containers 205, 206 for moving the storage containers 205, 206 up and down, the preheat device 160, the post-forming bumps heating device 170, and the controller 180. As will be depicted in the following description of the structure and operation of the bump forming apparatus 101, the bump forming apparatus 101 is greatly different from the conventional bump forming apparatus, specifically, in a structure and an operation designed for eliminating electric charge generated on front and rear faces of the piezoelectric substrate wafer 201 before forming bumps and the piezoelectric substrate wafer 202 after bumps are formed because of a temperature change between a bump bonding temperature necessary for forming bumps and a room temperature. They are also different and in a structure and an operation designed for preventing damage to the piezoelectric substrate wafer 201 before forming bumps and to the piezoelectric substrate wafer 202 after bumps are formed when the piezoelectric substrate wafer 201 is moved to the preheat device 160 and from the preheat device 160 to the bonding stage 110, and when the piezoelectric substrate wafer 202 is moved from the bonding stage 110 to the post-forming bumps heating device 170. Since the bump forming apparatus 101 is an apparatus for forming bumps, the most fundamental part of the apparatus is the bonding stage 110 and the bump forming head 120.

Each of the constituting parts mentioned above will be described below.

In the bonding stage 110, the piezoelectric substrate wafer 201 before bumps are formed thereon (referred to simply as a "pre-forming bumps wafer") is placed on the bonding stage 110. The bonding stage 110 heats the pre-forming bumps wafer 201 to the bump bonding temperature necessary for forming bumps onto electrodes of circuits formed on the pre-forming bumps wafer 201. The bump bonding temperature necessary for forming bumps is a temperature necessary to join the electrodes and bumps by a design strength, which is set in accordance with the design strength and a material of the wafer and substrate to which bumps are to be formed. The bump bonding temperature in the present embodiment is approximately 210° C.

Figure 11:
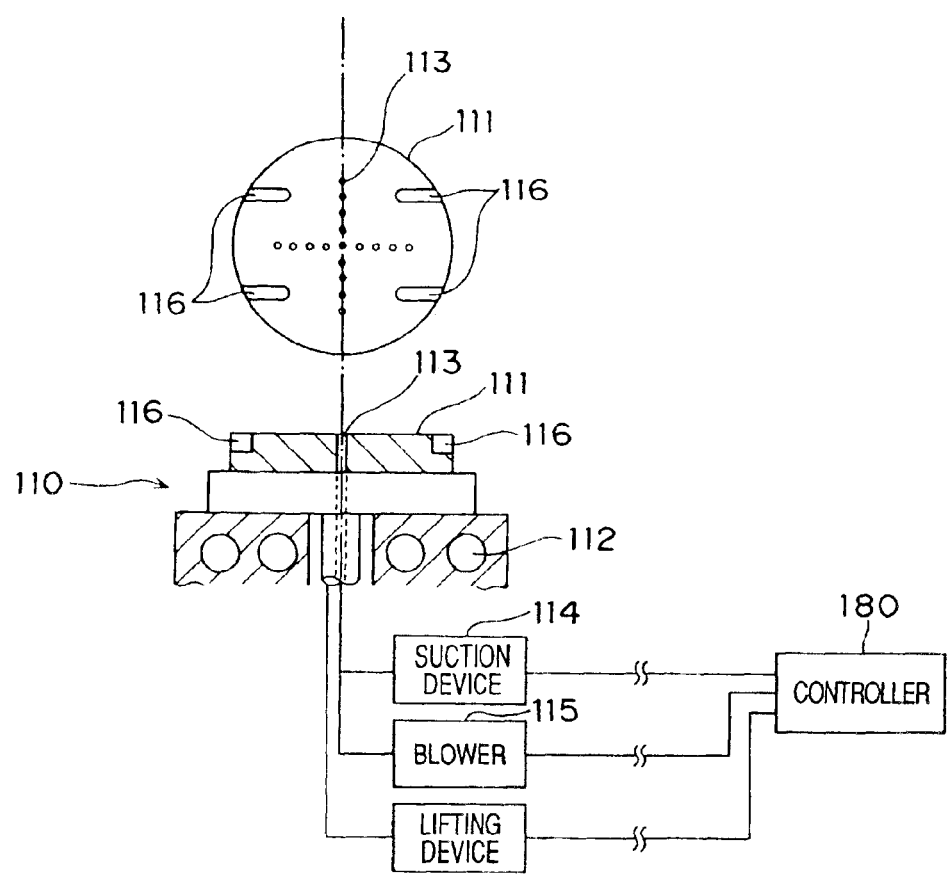
FIG. 11 is a diagram showing a structure of a bump bonding unit of FIG. 1.
Figure 68:
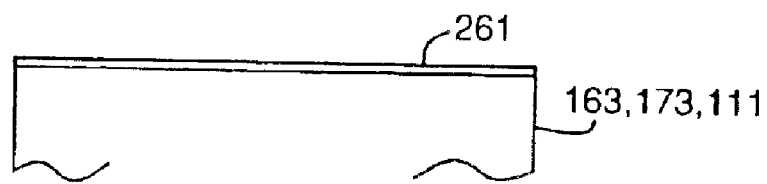
FIG. 68 is a diagram of a state where a contact face to a charge appearance semiconductor substrate in each of the preheat device, post-forming bumps heating device and bonding stage of FIGS. 1 and 2 is provided with silver plating.

A wafer laying stage 111 of the bonding stage 110 to which the pre-forming bumps wafer 201 is loaded has, as indicated in FIG. 11, openings 113 formed to suck the pre-forming bumps wafer 201 and to jet a gas. The openings 113 are connected to a suction device 114 and a blower 115 as an example functioning as a gas supply device which are controlled by the controller 180. The gas is air in this embodiment. The wafer laying stage 111 of the bonding stage 110 can be moved up and down by the lifting device between a heating position where the wafer laying stage is kept in contact with a heater 112 and a load position where the charge appearance semiconductor substrate is loaded. A contact face of the wafer laying stage 111 to the pre-forming bumps wafer 201 has a metal plating as shown in FIG. 68 (specifically, silver plating 261 in this embodiment). Because of the silver plating, a heat conductivity between the wafer laying stage 111 and the pre-forming bumps wafer 201 is improved and an effect of removing charge from the pre-forming bumps wafer 201 is enhanced.

The bump forming head 120 is a device for forming bumps to electrodes of the pre-forming bumps wafer 201 laid on the bonding stage 110 and heated to the bump bonding temperature. The bump forming head includes a wire supply part 121 for supplying a gold wire as a material for the bumps, a bump forming part for melting the gold wire to form balls and pressing the molten balls to the electrodes, an ultrasonic wave generator part for applying an ultrasonic wave to the bump when the molten balls are pressed to the electrodes, and the like. The thus-constituted bump forming head 120 is placed on an X, Y-table 122 having, for example, a ball screw structure movable in X, Y-directions orthogonal to each other on a plane, and is moved in the X, Y-directions by the X, Y-table 122 so that bumps can be formed on the electrodes of the fixed pre-forming bumps wafer 201.

Figure 3:
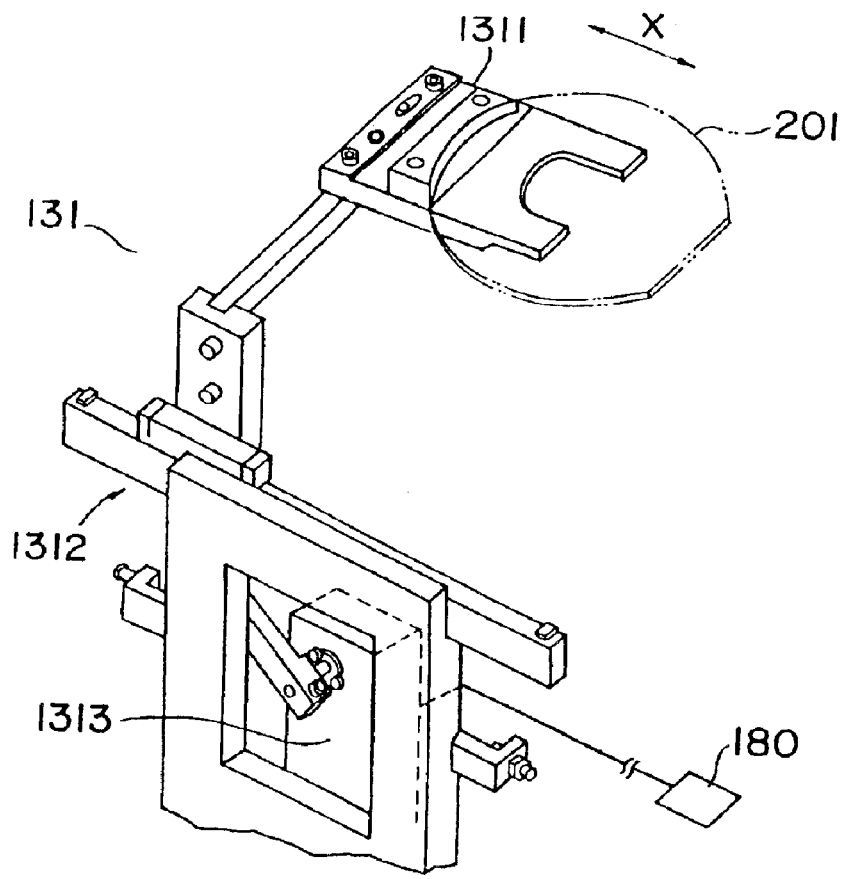
FIG. 3 is a perspective view showing in detail a carry-in device of FIGS. 1 and 2.

The bump forming apparatus 101 is provided with two types of carry unit 130. One is a carry-in device 131 for taking out the pre-forming bumps wafer (i.e., "pre-wafer") 201 from the first storage container 205. The other is a carry-out device 132 for transferring the piezoelectric substrate wafer after bumps are formed (referred to simply as a "wafer with formed bumps" or "post-wafer") 202 to the second storage container 206 and stores the substrate in the container. As shown in FIG. 3, the carry-in device 131 has a holding stage 1311 for holding the pre-forming bumps wafer (pre-wafer) 201 by suction, and a moving device 1312 for the carry-in device for moving the holding stage 1311 parallel to the X direction. A driving part 1313 included in the moving device 1312 is connected to and controlled in operation by the controller 180. The holding stage 1311 is moved along the X direction by driving the driving part 1313, whereby the pre-forming bumps wafer 201 is taken out from the first storage container 205.

Figure 56:
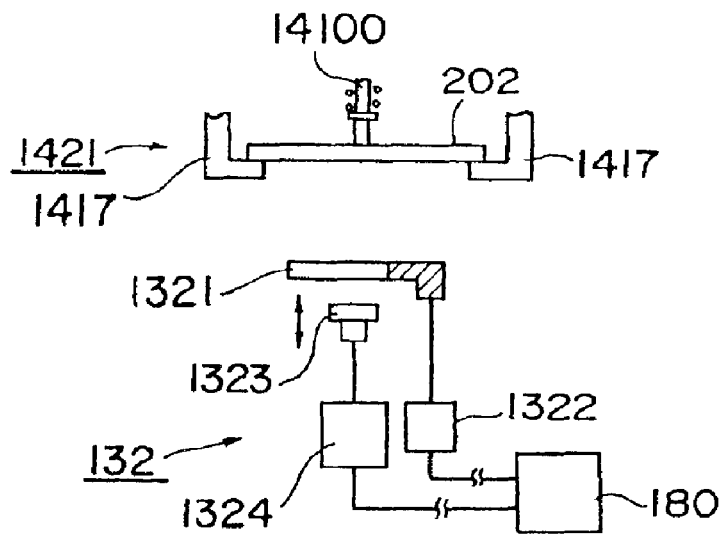
FIG. 56 is a diagram explanatory of operation in step 8 of FIG. 27 showing a state in which the wafer with formed bumps held by the carry-out side transfer device is disposed above the carry-out device.

The carry-out device 132 has the same structure as the carry-in device 131 and operates in the same manner, and therefore will be described briefly. As shown in FIG. 56, the carry-out device 132 has a holding stage 1321 for holding the wafer with formed bumps (post-wafer) 202 which is executed by suction in the embodiment, a moving device 1322 for the carry-out device for moving the holding stage 1321 along the X direction and storing the wafer with formed bumps 202 onto the second storage container 206, a holding part 1323 which sucks to a rear face 202b of the wafer with formed bumps 202 thereby holding the wafer with formed bumps 202, and a driving part 1324 arranged below the holding stage 1321 for moving the holding part 1323 in a thickness direction of the wafer with formed bumps 202 held to the holding stage 1321. The moving device 1322 and the driving part 1324 are controlled by the controller 180.

Figure 4:
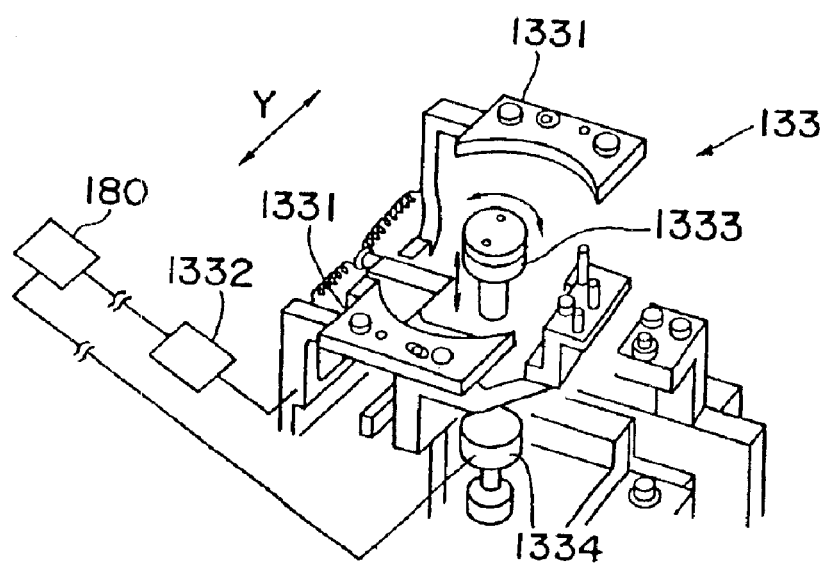
FIG. 4 is a perspective view showing in detail an orientation flat registration device of FIGS. 1 and 2.

At a setting point where the carry-in device 131 is disposed is installed an orientation flat registration device 133 for orientating into a predetermined direction an orientation flat of the pre-forming bumps wafer 201 taken out by the carry-in device 131 from the first storage container 205. As shown in FIG. 4, the orientation flat registration device 133 has catching plates 1331 which are moved in the Y direction by a driving part 1332 to hold the pre-forming bumps wafer 201 therebetween, a holding part 1333 which can move in a thickness direction of the pre-forming bumps wafer 201, can hold the pre-forming bumps wafer 201 and can rotate in a circumferential direction of the pre-forming bumps wafer 201 so as to orientate the orientation flat of the held pre-forming bumps wafer 201, and a driving part 1334 for the holding part 1333. The driving parts 1332 and 1334 are controlled by the controller 180 in operation.

The transfer device 140 of the bump forming apparatus 101 is comprised of a carry-in side transfer device 141 and a carry-out side transfer device 142. The carry-in side transfer device 141 holds the pre-forming bumps wafer 201 held to the holding stage 1311 of the carry-in device 131, transfers the pre-forming bumps wafer to the preheat device 160 and transfers the pre-forming bumps wafer from the preheat device 160 to the bonding stage 110. The carry-out side transfer device 142 holds the wafer with formed bumps 202 held on the bonding stage 110, transfers the wafer with formed bumps to the post-forming bumps heating device 170 and transfers the wafer with formed bumps from the post-forming bumps heating device 170 to the holding stage 1321 of the carry-out device 132. The carry-in side transfer device 141 includes, as indicated in FIG. 2, a wafer holding part 1411 for holding the pre-forming bumps wafer 201 and eliminating charge from front and rear faces of the pre-forming bumps wafer 201, a driving part 1412 equipped with an air cylinder in the embodiment for driving the wafer holding part 1411 to hold the pre-forming bumps wafer, and a moving device 1413 constituted of a ball screw mechanism in the embodiment for moving the whole of the wafer holding part 1411 and the driving part 1412 in the X direction. The driving part 1412 and the moving device 1413 are connected to the controller 180 and controlled in operation by the controller.

The carry-out side transfer device 142 includes, similar to the carry-in side transfer device 141, a wafer holding part 1421, a driving part 1422 and a moving device 1423. The driving part 1422 and the moving device 1423 are controlled in operation by the controller 180.

Figure 5:
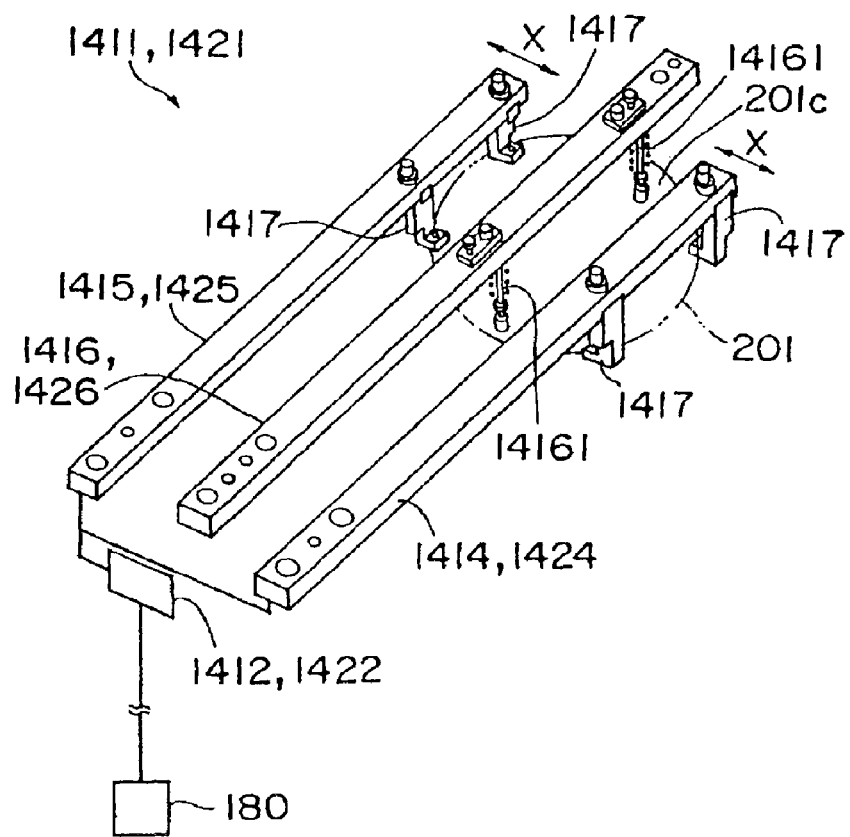
FIG. 5 is a perspective view showing in detail a transfer device of FIGS. 1 and 2.

The wafer holding parts 1411 and 1421 will be described. As shown in FIG. 5, the wafer holding part 1411 has a first holding member 1414 and a second holding member 1415 which can be moved by the driving part 1412 in the X direction, and a charge-removal member 1416 for charge removal which is arranged between the first and second holding members. These members are arranged in parallel to each other. The first holding member 1414, the second holding member 1415 and the charge-removal member 1416 are all formed of iron or another conductive material. Similar to the wafer holding part 1411, the wafer holding part 1421 has a first holding member 1424, a second holding member 1425, and a member 1426 for charge removal which is held between the first and second holding members. The first holding member 1424, the second holding member 1425 and the member 1426 for charge removal which are parallel to each other are formed of iron or another conductive material. Since the wafer holding parts 1411 and 1421 are constructed in the same structure, the wafer holding part 1411 will be described representatively.

Figure 6:
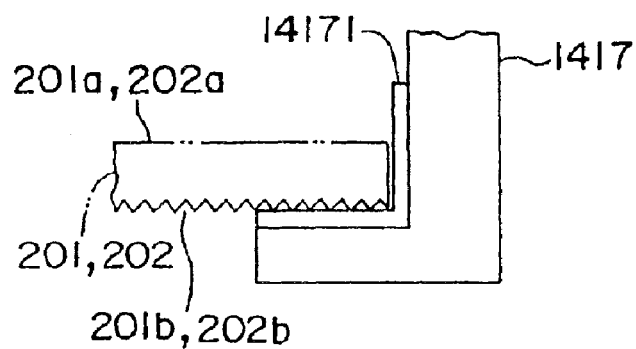
FIG. 6 is a diagram showing in detail a holding hook portion of a wafer holding part of FIG. 5.

Each of the first holding member 1414 and the second holding member 1415 has two L-shaped holding hooks 1417 for holding the pre-forming bumps wafer 201 as indicated in the drawings. The holding hooks 1417 are formed of the same material as the first holding member 1414 and the second holding member 1415 (i.e., iron) or a conductive resin. Preferably a conductive resin film 14171 as a buffering material is attached to a part of the holding hook in direct contact with the pre-forming bumps wafer 201 as shown in FIG. 6. Forming the first holding member 1414, second holding member 1415 and holding hooks 1417 of iron or the conductive material allows charge of the rear face 201b of the held pre-forming bumps wafer 201 to be (grounded).

Figure 66:
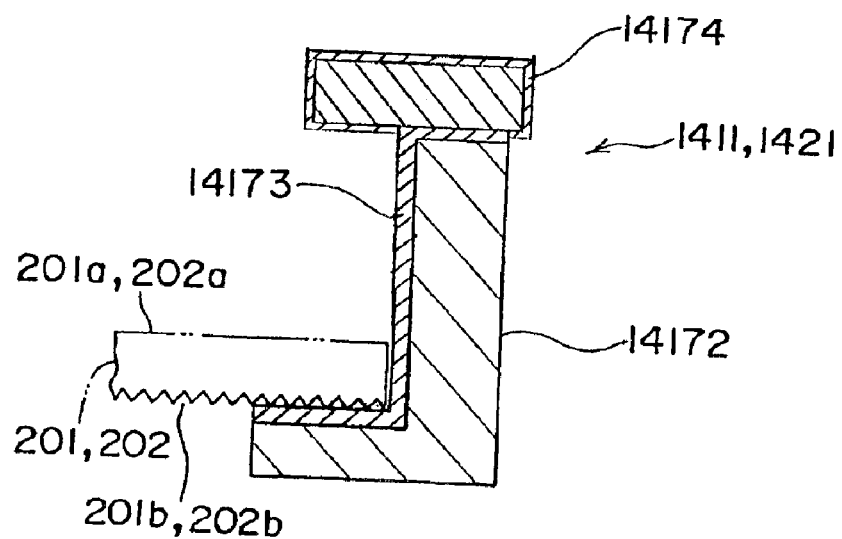
FIG. 66 is a diagram of a modified example of the carry-in side transfer device and carry-out side transfer device shown in FIGS. 1 and 2.

On the other hand, as shown in FIG. 66, a holding hook 14172 corresponding to the above holding hook 1417 can be formed of a heat insulating member, e.g., Vespel, trade name by Du Pont, so that a temperature change at the wafer holding parts 1411 and 1421 can be reduced, thereby avoiding a temperature change in the pre-forming bumps wafer 201 and the wafer with formed bumps 202 to be described later. The pre-forming bumps wafer (pre-wafer) 201 and the wafer with formed bumps (post-wafer) 202 can accordingly be kept from damage such as cracks or the like. In the structure shown in FIG. 66, a conductive material 14173 is attached to a contact part between the pre-forming bumps wafer 201, wafer with formed bumps 202, and the holding hook 14172 to earth (transmit) charge of the pre-forming bumps wafer 201 and wafer with formed bumps 202 to the first holding member 1414 and the second holding member 1415. Outer faces of the first holding member 1414, second holding member 1415, etc. of the wafer holding parts 1411 and 1421 are coated with an insulating material 14174 as will be described hereinbelow.

In order to more efficiently remove electric charge from the pre-forming bumps wafer 201 and the wafer with formed bumps 202 to be described later, an ion generator 190 is preferably provided as will be discussed later. When the ion generator 190 is provided, however, it would be feared that ions generated from the ion generator 190 could be transmitted to the first holding member 1414, second holding member 1415 and holding hooks 1417 formed of iron or conductive material, and consequently fail to effectively act the pre-forming bumps wafer 201 and wafer with formed bumps 202. Therefore, for preventing the ions from being earthed (grounded) and for letting the ions effectively act on the pre-forming bumps wafer 201 and wafer with formed bumps 202, at least parts where the ions generated from the ion generator 190 are to act, preferably entire outer faces of the first holding member 1414, the second holding member 1415 and the holding hooks 1417 are coated with the insulating material as shown in FIG. 66.

Figure 7:
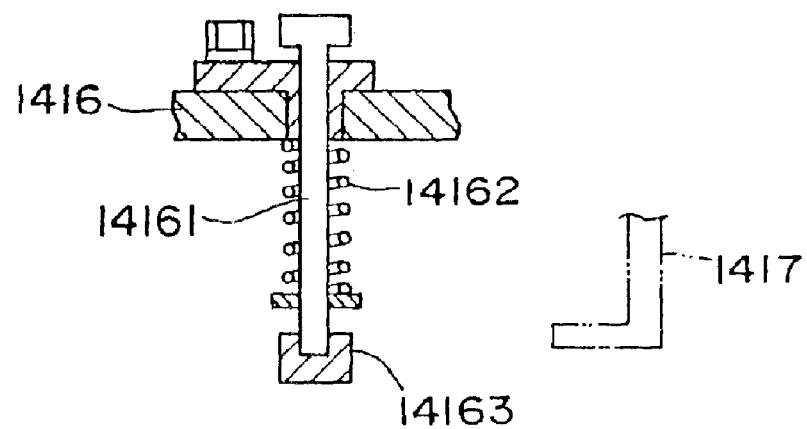
FIG. 7 is a diagram showing in detail a contact member for charge removal of the wafer holding part in FIG. 5.

The member 1416 for charge removal has contact members 14161 for charge removal arranged projecting in the thickness direction of the pre-forming bumps wafer 201 at two points in a diametrical direction of the wafer 201 according to the embodiment. The contact members for charge removal can be in contact with a circumferential part 201c of the front face 201a of the pre-forming bumps wafer 201 held by the wafer holding part 1411. As shown in FIG. 7, the contact member 14161 for charge removal slidably penetrates to the member 1416 and is urged by a spring 14162 in an axial direction thereof. A conductive resin 14163 as a buffering material is attached to a wafer contact end part of the contact member 14161.

The contact member 14161 earths (grounds) charge on the front face 201a when the conductive resin 14163 comes in contact with the front face 201a of the pre-forming bumps wafer 201. In a state before the pre-forming bumps wafer 201 is held by the holding hooks 1417, the contact members 14161 project in the thickness direction of the pre-forming bumps wafer 201 to an equal level to the holding hooks 1417 or to exceed the holding hooks 1417. Due to this arrangement, the contact members 14161 can contact the front face 201a of the pre-forming bumps wafer 201 before the holding hooks 1417 contact the pre-forming bumps wafer 201 when the wafer holding part 1411 comes to hold the pre-forming bumps wafer 201. Charge of the front face 201a can be removed first in this manner.

Figure 8:
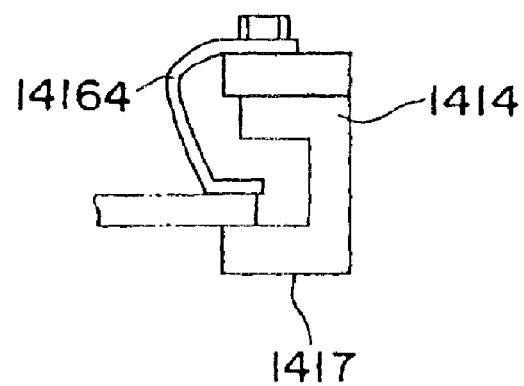
FIG. 8 is a diagram showing another example of the contact member for charge removal of the wafer holding part of FIG. 5.

The contact members 14161 may be directly connected to a ground wire. Also, the constitution is not limited to the above arrangement in which the contact members 14161 are attached to the member 1416 for charge removal. For example, as shown in FIG. 8, leaf springs 14164 which are formed of a metal or conductive material and can contact the front face 201a may be attached to the first holding member 1414 and the second holding member 1415 having the holding hooks 1417.

Figure 9:
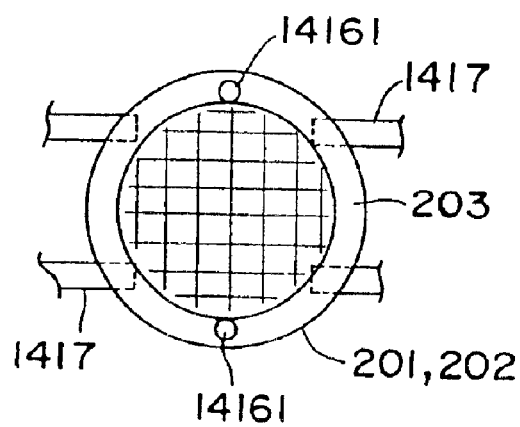
FIG. 9 is a diagram illustrating a relationship of an aluminum film formed on a wafer circumferential edge portion and a contact position of the contact member for charge removal.

On the other hand, as shown in FIG. 9, the wafer 201, 202 is provided with an aluminum film 203 all over the circumferential part 201c of the front face 201a to which the contact members 14161 come in contact, so that the charge of the front face 201a can be efficiently removed. According to this kind of the wafer, charge of the front face 201a can be effectively eliminated through contact of the contact members 14161 to the aluminum film 203. As shown in FIG.

10, the contact members 14161 may be arranged at three or more points of the circumferential part 201c. For removing charge also from a central portion of the wafer, as in FIG. 10, a dummy cell 14165 which will not malfunction even by contact with the contact member 14161 may be formed at the central portion of the wafer, with the contact member 14161 being disposed at a position corresponding to the dummy cell 14165. Charge collected on the dummy cell 14165 can thus be efficiently removed. The above-described contact members 14161 can be increased in number or in contact area to improve a charge removal efficiency.

Figure 69:
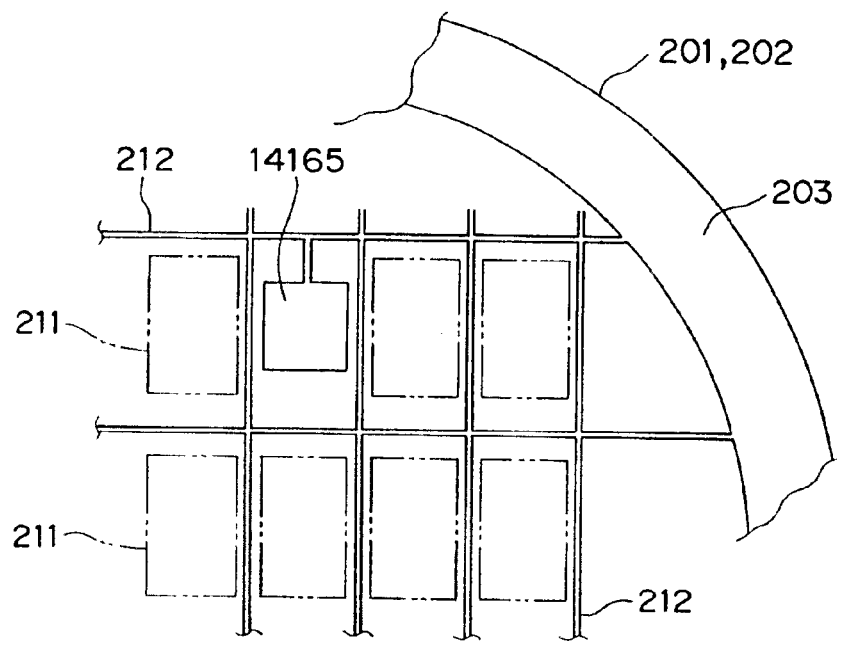
FIG. 69 is a plan view of the charge appearance semiconductor substrate having a region for charge removal.

Moreover, as shown in FIG. 69, the dummy cell 14165 of a conductor which corresponds to a region for charge removal may be connected to a dicing line 212 provided to divide circuit-formed parts 211 having, for example, SAW filters from the wafer. The dicing lines 212 extend up to the aluminum film 203. Since generated charge gather at the front face 201a of the wafer, when the contact members 14161 come in contact with the aluminum film 203 in the above constitution, charge on the dummy cell 14165 alike are removed through the dicing lines 212 and the aluminum film 203. The charge on the front face 201a can be effectively eliminated. Needless to say, the charge of the front face 201a may be removed by bringing the contact member 14161 in direct contact with the dummy cell 14165 as described before.

Figure 10:
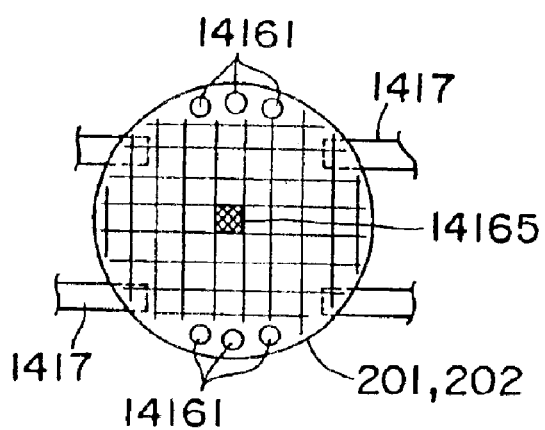
FIG. 10 is a diagram of a modified example of the contact member for charge removal.

In either structure of FIGS. 10 and 69, a position where the dummy cell 14165 is to be formed on the wafer can be determined to meet the contact member 14161 as above, and is not limited to these specific arrangements. For instance, the dummy cell 14165 can be formed at position on the wafer which is easy to damage by pyroelectric breakdown or the like. This structure is effective from view points of a charge removal effect and a yield. In this case, the contact member 14161 is arranged to meet the dummy cell 14165 formed at the position subject to the damage.

Figure 70:
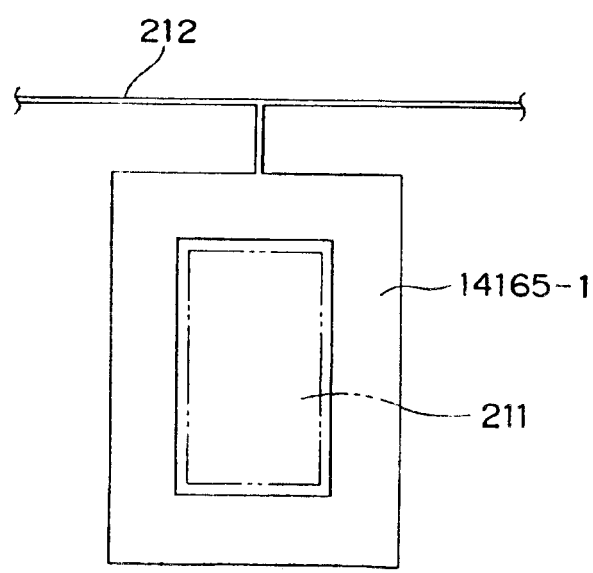
FIG. 70 is a diagram of a modified example of the region for charge removal of FIG. 69.

Although the dummy cell 14165 is formed in a square shape with a size occupying an almost one circuit-formed part 211 in the structure of FIG. 69, an area of the dummy cell 14165 is not limited to this. Furthermore, the shape of the dummy cell 14165 is not restricted to the above square and can be, for example, like a frame to surround one circuit-formed part 211 as represented by a dummy cell 14165-1 of FIG. 70.

A method for removing charge of the front face 201a is not limited to by the contact of the above-described contact members 14161. For example, the ion generator 190 can be used in place of the contact members 14161 or can be used together with the contact members 14161.

In the arrangement of FIG. 69, the dummy cell 14165 is formed and connected to the dicing line 212. However, the dummy cell 14165 may be eliminated and simply the dicing line 212 may be provided extending to the aluminum film 203. Although the efficiency and effect of removing charge decrease in comparison with the structure including the dummy cell 14165 as mentioned above, even the structure without the dummy cell can remove charge from the aluminum film 203 through the dicing line 212, so that charge of the front face 201a can be removed.

Figure 12:
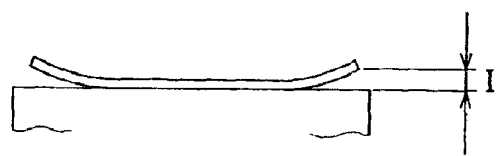
FIG. 12 is a diagram illustrating a wafer warpage.

Depending on charge appearance semiconductor substrates to be processed, for example, compound semiconductor wafers of $LiTaO_3$, $LiNbO_3$ or the like, some of the substrates warp as shown in FIG. 12 because of a temperature difference affected thereto which will be discussed later in the description of the operation. An amount of the warpage, namely, a size I in FIG. 12 is 1–1.5 mm in the $LiTaO_3$ wafer having a thickness of 0.35 mm and a diameter of 76 mm, and is 1.5–2 mm in the $LiNbO_3$ wafer of the same dimensions.

The contact members 14161 are arranged to meet the circumferential edge portions which deflect considerably in the charge appearance semiconductor substrate. As shown in FIG. 7, the contact members 14161 attached to the member 1416 in the earlier described structure can move only in the axial direction thereof, and cannot oscillate following the warpage of the charge appearance semiconductor substrate (that is, cannot tilt to be almost orthogonal to the warped face). As a result, when the contact members 14161 come in contact with the warped charge appearance semiconductor substrate, an unnecessary force possibly acts on the warped charge appearance semiconductor substrate from the contact members 14161 which extend and are movable in the thickness direction of the charge appearance semiconductor substrate of a state having no warpage, thereby possibly bringing about a crack, break or similar damage to the warped charge appearance semiconductor substrate. As such, a structure for attaching the contact members 14161 to the member 1416 and parts related to the attaching are preferably designed as shown in FIGS. 13–21 and 65 which will be described hereinbelow. The reference numeral of the member "1416" will still be used for the sake of convenience of description although, strictly speaking, the reference number should be changed because the member 1416 is also changed in structure subsequent to the change in the attaching structure and related parts.

Figure 13:
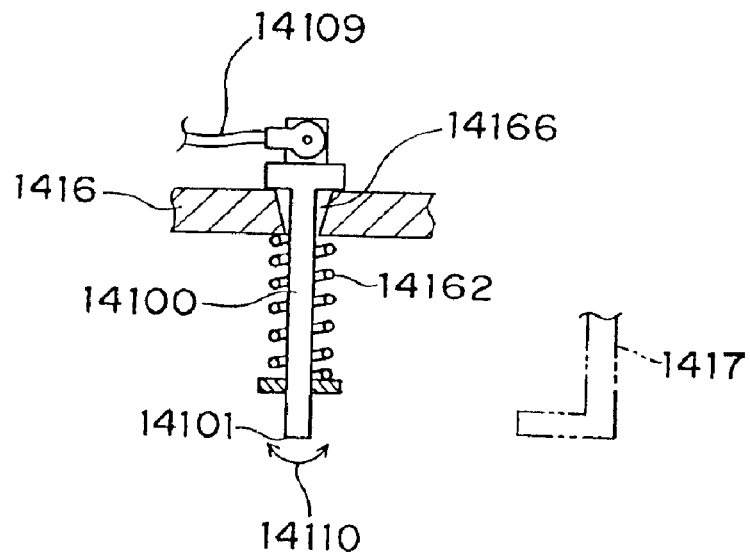
FIG. 13 is a diagram of a modified example of the contact member for charge removal.
Figure 14:
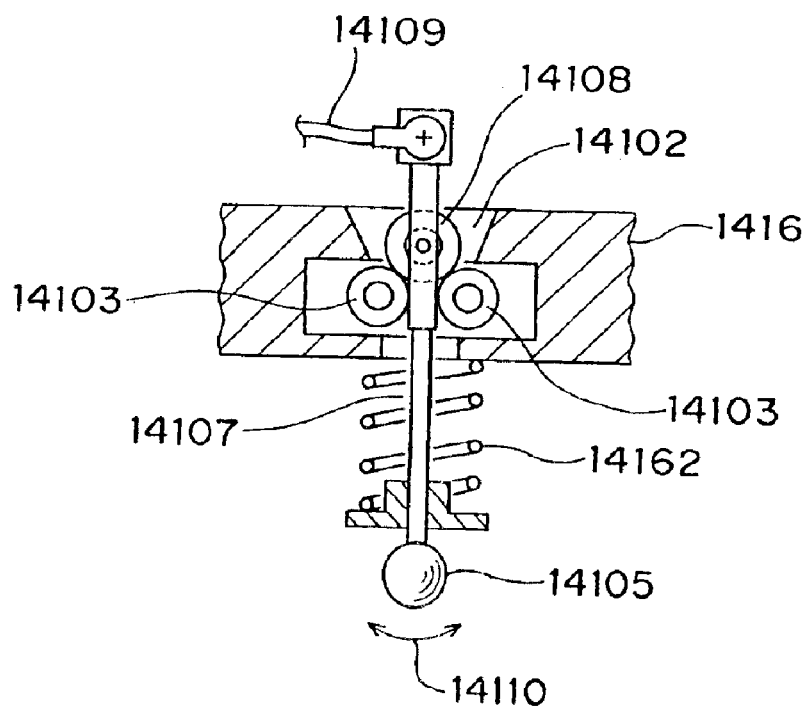
FIG. 14 is a diagram of a modified example of the contact member for charge removal.
Figure 15:
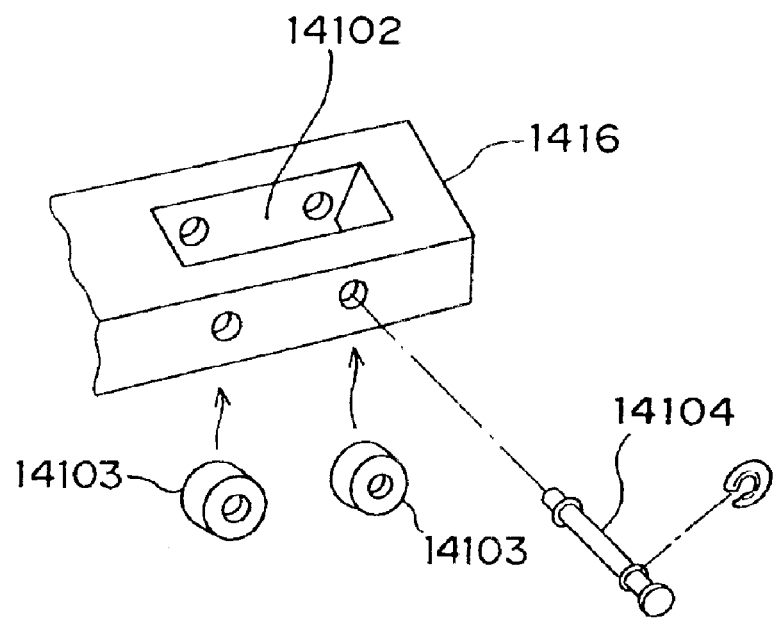
FIG. 15 is a perspective view showing the member for charge removal shown in FIG. 14.
Figure 21:
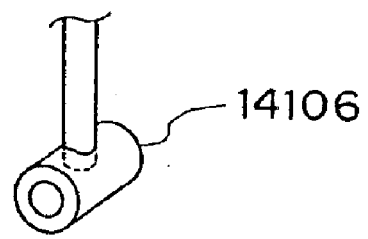
FIG. 21 is a perspective view of a modified example of a member provided at one end of the contact member for charge removal.
Figure 65:
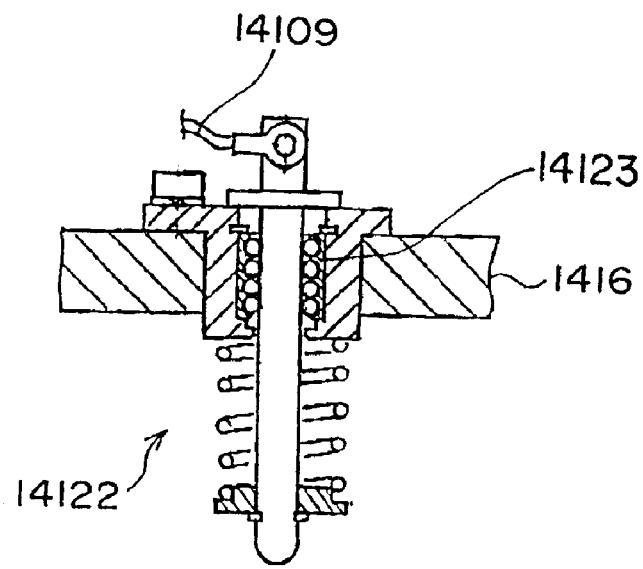
FIG. 65 is a diagram of a modified example of the contact member for charge removal.

According to a modification of the structure of the contact member for charge removal shown in FIG. 13, a conical hole 14166 is formed in the member 1416, and a contact member 14100 for charge removal which is formed of a conductive rod material of, for example, a metal having a diameter of approximately 1.5–2 mm is inserted in the hole 14166 and urged in an axial direction thereof by the spring 14162. An urging force in the embodiment is set to be approximately $49 \times 10^{-3}$–$98 \times 10^{-3}$ N per one contact member 14100. A corner portion 14101 at one end of the contact member 14100 to be in contact with the charge appearance semiconductor substrate may be, for example, chamfered or shaped as an arc so as to facilitate oscillation of the contact member 14100 in a direction of an arrow 14110 in accordance with a curvature of the warped charge appearance semiconductor substrate. Alternatively, a conductive ball 14105 having a diameter of, for example, approximately 5 mm and formed of, for example, a metal as shown in FIG. 14, or a cylinder 14106 as shown in FIG. 21 may be attached to one end of the contact member 14100, or the one end may be shaped as a hemisphere as indicated in FIG. 65. The contact member 14100 swings in the above arrow direction 14110 so that a plane including a locus of the swinging contact member 14100 becomes parallel to a diametrical direction of the charge appearance semiconductor substrate. When the cylinder 14106 is to be attached, the cylinder 14106 is disposed with an axial direction thereof kept parallel to a direction which is orthogonal to the diametrical direction and the thickness direction of the charge appearance semiconductor substrate. An earth (ground) wire 14109 is directly connected to the other end of the contact member 14100 in the embodiment.

Since the above structure enables the contact member 14100 to swing about a small diameter part of the conical hole 14166, the contact member 14100 can swing in the arrow direction 14110 in accordance with the curvature of the warped charge appearance semiconductor substrate, thereby preventing the charge appearance semiconductor substrate from bein damaged.

Figure 16:
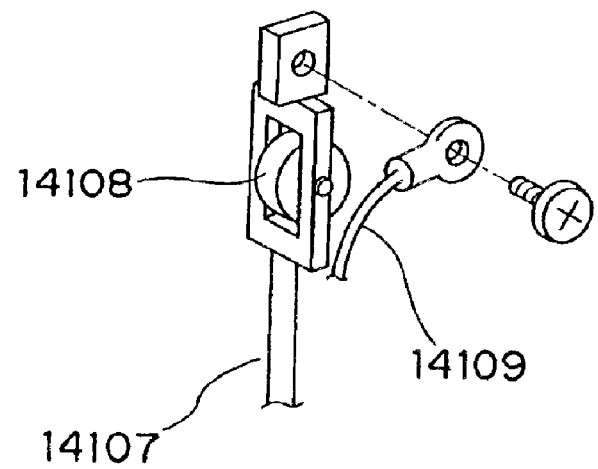
FIG. 16 is a perspective view the member for charge removal of FIG. 14.

Another modification can adopt a structure of FIG. 14, wherein two rollers 14103 arranged via an appropriate interval inside a mounting hole 14102 are rotatably attached by pins 14104 to the member 1416. A contact member 14107 for charge removal is installed to be able to swing in the arrow direction 14110 due to the two rollers 14103. The contact member 14107 has a roller 14108 supported rotatably to the other end part thereof as shown in FIG. 16, with the ball 14105 attached to one end of the contact member 14107. The contact member 14107 is urged in the axial direction thereof by the spring 14162 and attached to the member 1416. Since the roller 14108 of the contact member 14107 is supported rotatably from both sides by the two rollers 14103 of the member 1416, the contact member 14107 can swing in the arrow direction 14110, and the charge appearance semiconductor substrate can be prevented from being damaged.

Figure 17:
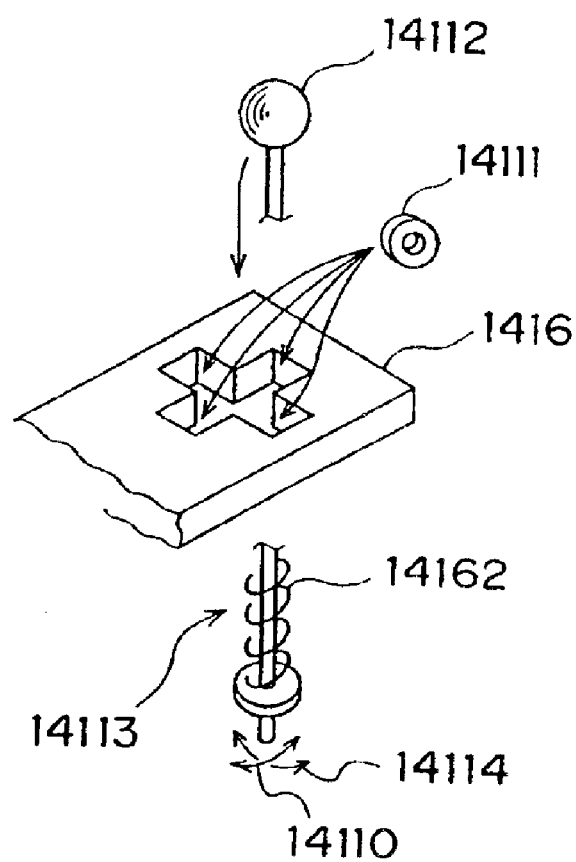
FIG. 17 is a perspective view of a modified example of the contact member for charge removal.
Figure 20:
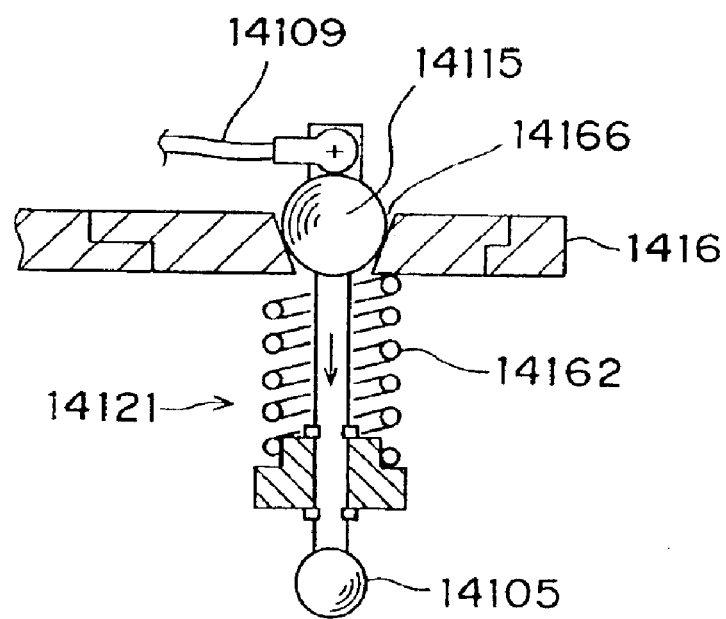
FIG. 20 is a diagram of a modified example of the contact member for charge removal.

The structure can still be modified as shown in FIG. 17. A structure of FIG. 17 is developed from the structure of FIG. 14, in which four rollers 14111 are arranged in a cross shape and rotatably connected to the member 1416, while a contact member 14113 for charge removal with a ball 14112 fitted to the other end is mounted to the member 1416 so that the ball 14112 is positioned at a center part of the four rollers 14111. The ball 14112 is urged by the spring 14162 to the four rollers 14111. The earth (ground) wire can be connected to the ball 14112 in a state as indicated in FIG. 20 or can be connected to the member 1416. By adopting this structure, the contact member 14113 can smoothly rotate not only in the above arrow direction 14110, but in a direction of an arrow 14114 orthogonal to the arrow direction 14110. Damaging the charge appearance semiconductor substrate can be prevented accordingly.

Figure 18:
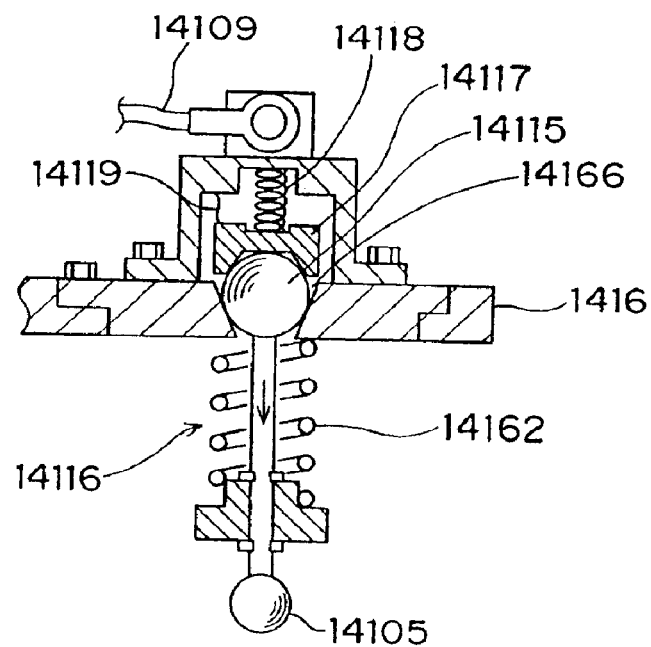
FIG. 18 is a diagram of a modified example of the contact member for charge removal.
Figure 19:
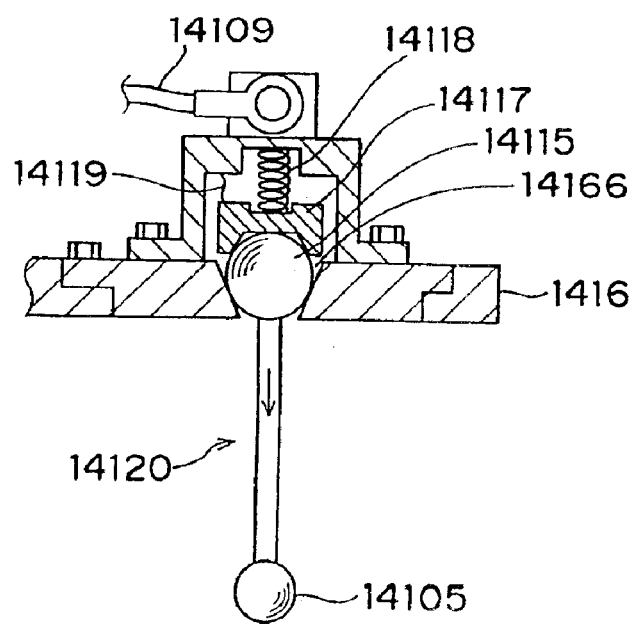
FIG. 19 is a diagram of a modification of the contact member for charge removal of FIG. 18.

Yet further modifications are shown in FIGS. 18–20. In these structures, the conical hole 14166 is formed in the member 1416, while a member 14116 for charge removal including a ball 14115 attached to the other end thereof is mounted to the member 1416 with the ball 14115 being rotatably supported in the hole 14166. The ball 14115 is urged by the spring 14162 to a wall face of the hole 14166. In addition, a receiving charge member 14117 having an earth (ground) wire 14119 connected to the member 1416 is pressed by a spring 14118 to the ball 14115. Therefore, the charge of the charge appearance semiconductor substrate runs through the contact member 14116, the receiving charge member 14117 and the earth (ground) wire 14119 to the earth (ground) wire 14109 connected to the member 1416. The structure allows the contact member 14116 to rotate in any direction in the mounting state of FIG. 18, thus being able to prevent the damage to the charge appearance semiconductor substrate.

Using a contact member 14120 for charge removal without the spring 14162 as shown in FIG. 19 may be devised as a modified example of the attachment structure of FIG. 18. In this case, the following effect is obtained in addition to a cost reduction and facilitation of the attaching as compared with the structure of FIG. 18. That is, the contact member can be brought in contact with the charge appearance semiconductor substrate by a minute force of, for instance, approximately $19.6 \times 10^{-3}$ N because of a weight of the ball 14105. Therefore, even a thin charge appearance semiconductor substrate, for example, about 0.1 mm thick charge appearance semiconductor substrate can be prevented from breaking or sustaining other damage.

A contact member 14121 for charge removal shown in FIG. 20 is also possible, wherein the receiving charge member 14117 and the spring 14118 are eliminated and the earth (ground) wire 14109 is directly connected to the ball 14115. In this case, the number of parts is reduced and the structure is simplified in comparison with the structure shown in FIG. 18, and accordingly costs can be reduced.

A structure of FIG. 65 can be employed as a further modification. Although the contact member for charge removal is swingable in the structures of FIGS. 13–20, a contact member 14122 for charge removal of FIG. 65 has a linear guide bearing 14123 mounted to a support part for the contact member 14122 of the member 1416. According to the structure shown in FIG. 65, the contact member 14122 can move more smoothly in the axial direction thereof as compared with a movement in the axial direction of the contact member 14161 in the structure of FIG. 7. Therefore, although the contact member 14122 is not adapted to swing in the structure of FIG. 65, the contact member 14122 smoothly moves in the axial direction thereof when one hemispherical end of the contact member 14122 touches the warped charge appearance semiconductor substrate, thereby being able to prevent a crack or similar damage to the warped charge appearance semiconductor substrate.

A supporting member 14124 having the linear guide bearing 14123 fitted thereto in the contact member 14122 can be formed of iron, but is preferably formed of an insulating material such as the aforementioned Vespel. For example, the supporting member 14124 formed of Vespel has approximately 1/84 of the thermal conductivity of the member formed of iron. When the supporting member 14124 of the insulating material is used, therefore, the contact member 14122 can prevent the charge appearance semiconductor substrate from being cooled suddenly when the contact member 14122 comes into contact with the charge appearance semiconductor substrate, thereby being able to prevent thermal damage to the charge appearance semiconductor substrate.

Figure 67:
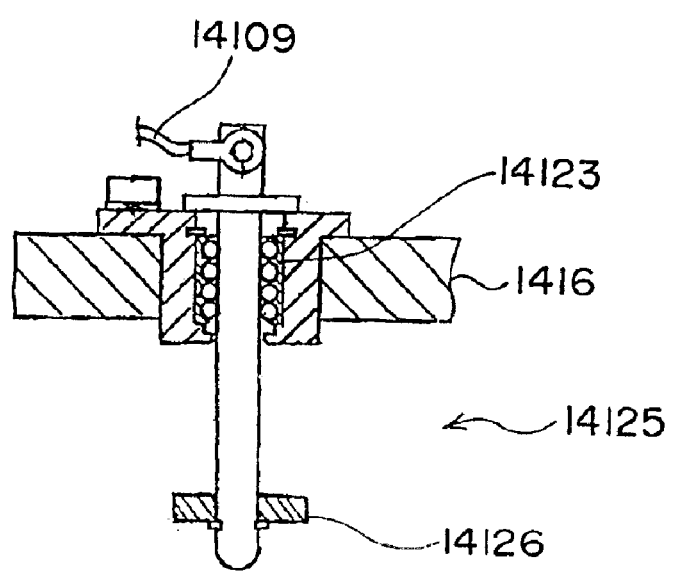
FIG. 67 is a diagram of a modified example of the contact member for charge removal.

As a modification of the above contact member 14122, a contact member 14125 for charge removal with a weight 14126 in place of the spring 14162 as shown in FIG. 67 may be adopted. In the case where the spring 14162 is used, a pressing force of the contact member to the charge appearance semiconductor substrate changes by a compression amount of the spring 14162, for example, by an amount of movement in the axial direction of the contact member. However, when the weight 14126 is used, a constant pressing force can be effectively applied to the charge appearance semiconductor substrate irrespective of the amount of movement of the contact member.

Each of the contact members shown in FIGS. 13, 14, 17, 18 and 20 may also be equipped with the weight 14126 in place of the spring 14162. The contact member 14120 of FIG. 19 can be equipped with the weight 14126 as well.

Figure 22:
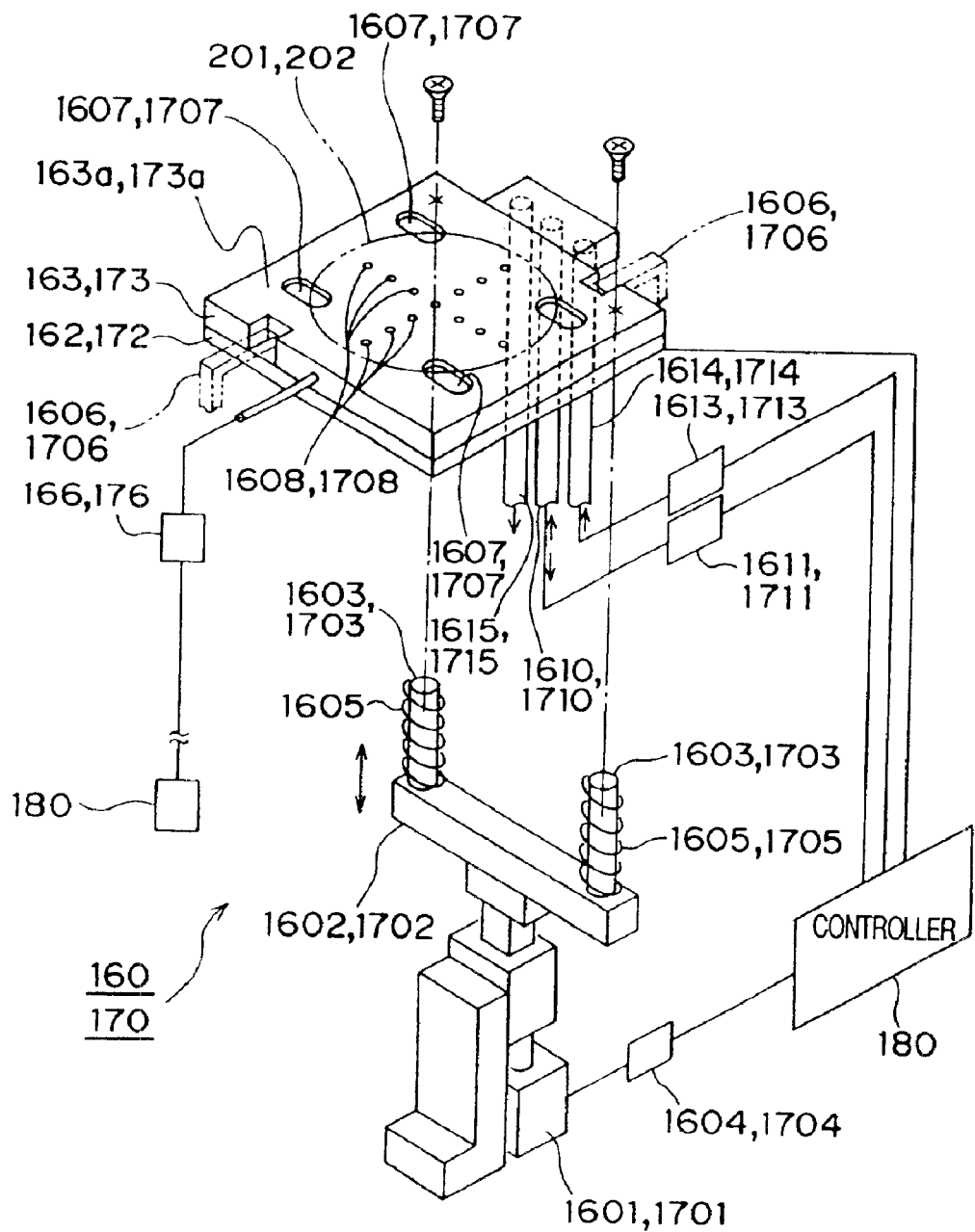
FIG. 22 is a perspective view of a preheat device and a post-forming bumps heating device.
Figure 23:
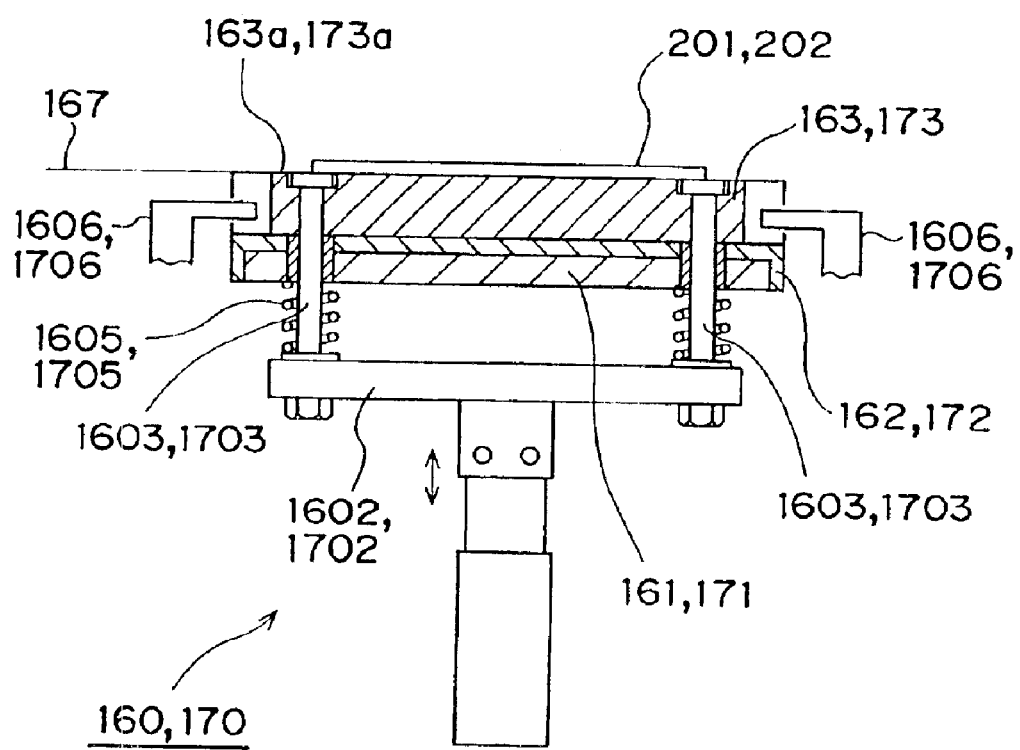
FIG. 23 is a diagram for explaining operations of the preheat device and post-forming bumps heating device of FIG. 22.
Figure 24:
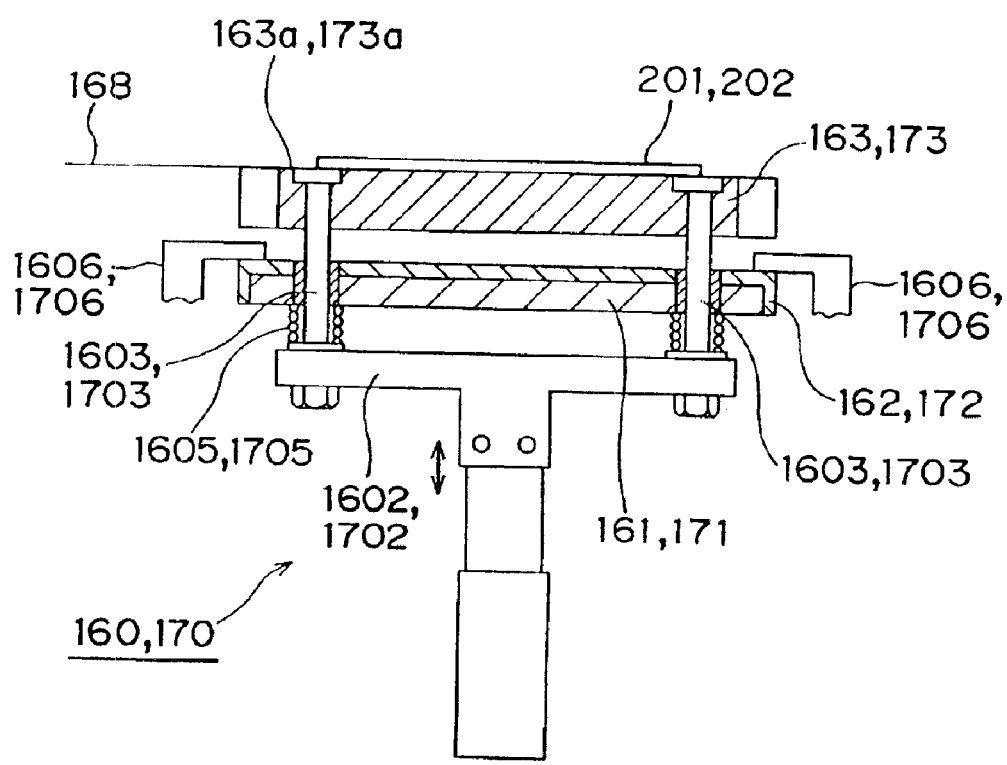
FIG. 24 is a diagram for explaining operations of the preheat device and post-forming bumps heating device of FIG. 22.

The preheat device 160 is a device, as shown in FIGS. 22–24, on which the pre-forming bumps wafer 201 caught by the wafer holding part 1411 from the carry-in device 131 is placed, and which heats the pre-forming bumps wafer 201 from a room temperature to the vicinity of approximately 210° C. as the bump bonding temperature to form bumps by the bonding stage 110. The preheat device has an aluminum plate 163 of a thickness of 6 mm in the embodiment which acts as a heat diffuser member placed on a plate heater frame 162 including a plate heater 161 as a heating part. A wafer load face 163a of the aluminum plate 163 is metal plated as shown in FIG. 68, specifically silver plated 261 in the embodiment. Because of the silver plating, a heat conductivity between the aluminum plate 163 and the pre-forming bumps wafer 201 is improved and a charge removal effect for the pre-forming bumps wafer 201 is enhanced. An operation of raising the temperature by the plate heater 161 is controlled by the controller 180 with reference to temperature information from a temperature sensor 166 such as, for example, a thermocouple or the like which measures a temperature of the aluminum plate 163. A material of the heat diffuser member 163 is not limited to the above aluminum and can be such that it has a good heat conductivity and is free from a chemical reaction to the pre-forming bumps wafer 201, for instance, duralumin or the like.

According to the present embodiment, neither the carry-in side transfer device 141 nor the carry-out side transfer device 142 includes a mechanism for moving the wafer holding part 1411 and the wafer holding part 1421 in the thickness direction of the pre-forming bumps wafer 201 and the wafer with formed bumps 202 held by the holding parts respectively. Therefore, the preheat device 160 is provided with an elevator mechanism for moving both the plate heater frame 162 with the plate heater 161 and the aluminum plate 163 in the thickness direction between a down position 167 of FIG. 23 and an up position 168 of FIG. 24 to place the pre-forming bumps wafer 201 onto the aluminum plate 163. The elevator mechanism includes an air cylinder 1601 as a driving source for the up-down movement in the thickness direction, a T-shaped supporting member 1602 moved up and down by the air cylinder 1601, and two supporting rods 1603 extending from the supporting member 1602 for supporting the plate heater frame 162 and aluminum plate 163. The air cylinder 1601 is driven by a cylinder driving device 1604 controlled by the controller 180. In the embodiment, the plate heater frame 162 and the aluminum plate 163 are separated through the up-down movement by the air cylinder 1601 as will be described later, thereby promoting cooling the aluminum plate 163. Therefore, the cylinder driving device 1604 and the air cylinder 1601 eventually function as a separator.

The supporting rods 1603 penetrate the plate heater frame 162, with leading end parts of the rods being inserted into the aluminum plate 163 according to the embodiment as indicated in the drawings. The plate heater frame 162 can slide in an axial direction of the supporting rods 1603 while the supporting rods penetrate the plate heater frame. The aluminum plate 163 is fixed to the supporting rods 1603 at the leading end parts of the supporting rods 1603. Moreover, the plate heater frame 162 is pressed by springs 1605 (an example of an urging means) to the aluminum plate 163. The plate heater frame 162 and the aluminum plate 163 move up and down together from the down position 167 as shown in FIG. 23 when the air cylinder 1601 drives. After the plate heater frame 162 comes into contact with stoppers 1606 disposed at a contact position during the upward motion, the upward movement of the plate heater frame 162 is stopped by the stoppers 1606 as shown in FIG. 24, and then only the aluminum plate 163 moves upward. As a result, the plate heater frame 162 and the aluminum plate 163 separate from each other. The aluminum plate 163 rises to the up position 168. In the present embodiment, a gap between the plate heater frame 162 and the aluminum plate 163 when the separation is complete is approximately 2–4 mm. In the downward motion after the separation, the aluminum plate 162 alone moves down from the up position 168 to the contact position where the stoppers 1606 are disposed. Then both the plate heater frame 162 and the aluminum plate 163 move down together to the down position 167 from the contact position.

Although it is necessary to lower the temperature of the aluminum plate 163 to approximately 40° C. after preheating before a next fresh pre-forming bumps wafer 201 is placed thereon, a cooling speed for the aluminum plate 163 can be improved as compared with the conventional art and a cycle time can be shortened because the plate heater frame 162 and the aluminum plate 163 are rendered separable in the above-described structure. The separation structure which improves the cooling speed is particularly effective in terms of the cycle time at a trial stage before mass production or in a case where bumps are to be formed to only a few wafers of the same type.

Further the plate heater frame 162 and the aluminum plate 163 can be united after the aluminum plate 163 has its temperature decreased, without need for waiting until the plate heater frame 162 is lowered to the above temperature of approximately 40° C. A temperature difference at the plate heater frame 162 becomes smaller than in the conventional art. Since a load to the plate heater 161 is thus reduced, a life of the plate heater 161 can be extended in comparison with the conventional art.

Although the plate heater frame 162 and aluminum plate 163 are made separable in the embodiment as described above, the plate heater frame 162 and the aluminum plate 163 can be constructed in a simple model to move up and down always in one body without being separated from each other.

The plate heater frame 162 and the aluminum plate 163 are supported by the two supporting rods 1603. Consequently, the heat from the plate heater frame 162 is hard to conduct to the supporting member 1602, air cylinder 1601, etc. The heat from the plate heater frame 162 can be conducted almost all to the aluminum plate 163. Therefore, a nearly uniform temperature distribution at the aluminum plate 163, and uniform heating of the whole pre-forming bumps wafer 201 can be achieved. Moreover, the heat will not act on the supporting member 1602, etc. even when the preheat device drives continuously.

Figure 25:
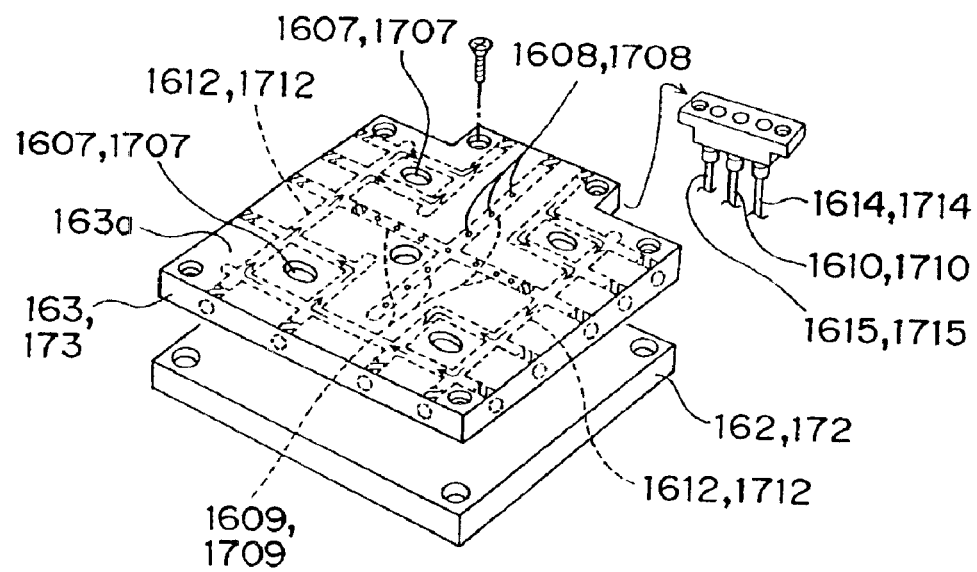
FIG. 25 is a perspective view of an aluminum plate and a heater plate frame of the preheat device and post-forming bumps heating device of FIG. 22.

The wafer load face 163a of the aluminum plate 163 has air holes 1608 and grooves 1607 to which holding hooks 1417 of the wafer holding part 1411 enter when the pre-forming bumps wafer 201 is carried to the aluminum plate. The air holes 1608 communicate, as shown in FIG. 25, with a blow suction path 1609 formed in the aluminum plate 163. As will be discussed in the later description of the operation, the air holes are used to jet the air to separate the pre-forming bumps wafer 201 from the wafer load face 163a to transfer the pre-forming bumps wafer 201, or to remove charge from the rear face of the pre-forming bumps wafer 201. Or the air holes are air suction holes to suck and hold the pre-forming bumps wafer 201 to the wafer load face 163a although the air suction is fundamentally not carried out in the embodiment. As shown in FIG. 22, the blow suction path 1609 is connected via a coupling pipe 1610 to a blow suction device 1611 controlled by the controller 180. While the gas to be jetted is the air in the embodiment as mentioned above, other gas may be used. The blow suction device 1611 corresponds to an example functioning as the gas supply device for supplying a gas in a warpage correction operation and a charge removal operation to be described later.

A cooling medium path 1612 is formed in the aluminum plate 163 for cooling the aluminum plate 163. The cooling medium is the air of an ordinary temperature in the embodiment, but other gas, water or the like can be used. The cooling medium path 1612 is connected via a coupling pipe 1614 to a cooling air supply device 1613 controlled in operation by the controller 180 as shown in FIG. 22. The air for cooling supplied to the path 1612 runs in the path 1612 following illustrated arrows and is discharged out through a coupling pipe 1615.

Figure 26:
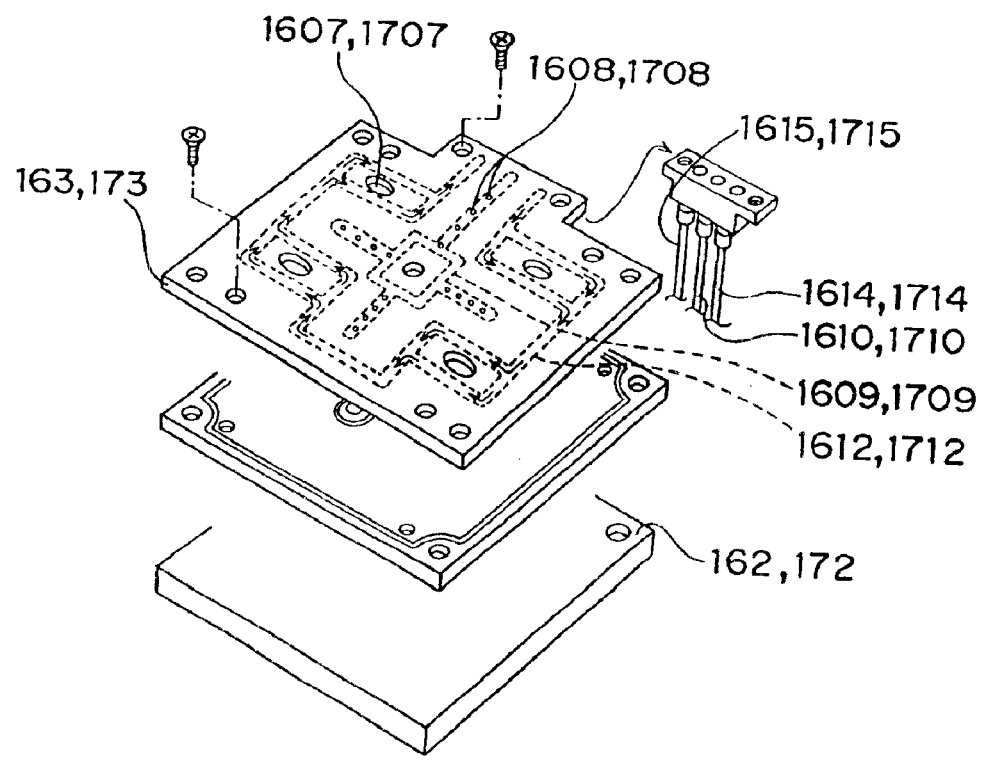
FIG. 26 is a perspective view of the aluminum plate and the plate heater frame of the preheat device and post-forming bumps heating device of FIG. 22.

As shown in FIG. 25 according to the embodiment, the blow suction path 1609 and the cooling medium path 1612 are obtained by forming holes in the aluminum plate 163 by a drill or the like and fitting stop plugs as indicated by slant lines. However, a known method can be employed to form the paths 1609 and 1612. For example, the paths can be obtained by forming grooves on a rear face of the aluminum plate 163 as shown in FIG. 26. In this case, a seal plate is required between the aluminum plate 163 and the plate heater frame 162 for preventing the cooling medium from leaking.

The post-forming bumps heating device 170 is a device on which the wafer with formed bumps 202 held by the wafer holding part 1421 from the bonding stage 110 is loaded, and which gradually lowers the loaded wafer with formed bumps 202 from approximately 210° C. of the bump bonding temperature to near the room temperature. The post-forming bumps heating device has a structure similar to the above-discussed preheat device 160 with a plate heater frame and an aluminum plate made separable in the embodiment. Specifically, the post-forming bumps heating device 170 includes, corresponding to each part constituting the above preheat device 160, a plate heater 171, a plate heater frame 172, an aluminum plate 173, a temperature sensor 176, an air cylinder 1701, a supporting member 1702, supporting rods 1703, a cylinder driving device 1704, springs 1705, stoppers 1706, grooves 1707, air holes 1708, a blow suction path 1709, a coupling pipe 1710, a blow suction device 1711, a cooling medium path 1712, a cooling air supply device 1713, and coupling pipes 1714, 1715. Thus FIGS. 22–26 show reference numerals of parts of both the preheat device 160 and the post-forming bumps heating device 170. The plate heater 171 is controlled by the controller 180 to control a decrease in temperature of the wafer with formed bumps 202. Similar to the aluminum plate 163, the aluminum plate 173 has a wafer load face 173*a* metal plated as shown in FIG. 68, specifically silver plated 261 in the embodiment. The silver plating improves a heat conductivity between the aluminum plate 173 and wafer with formed bumps 202 and enhances a charge removal effect for the wafer with formed bumps 202.

Operation of the post-forming bumps heating device is similar to the operation of the foregoing preheat device 160 and can be understood by applying the description of the operation related to the preheating in the preheat device 160. Thus a detailed description will be omitted here.

The lifting device 150 comprises a first lift 151 for loading the first storage container 205 thereon and a second lift 152 for loading the second storage container 206. The first lift 151 moves the first storage container 205 up and down so that the pre-forming bumps wafer 201 is arranged at a position where the pre-forming bumps wafer 201 can be taken out by the carry-in device 131. The second lift 152 moves the second storage container 206 up and down so that the wafer with formed bumps 202 held by the carry-out device 132 can be stored at a predetermined position in the second storage container 206.

Operation of the bump forming apparatus 101 of the embodiment constituted as described above will be described hereinbelow. Each of the above-depicted arts constituting the apparatus is controlled in operation by the controller 180, whereby a sequence of operations from forming bumps to on the pre-forming bumps wafers 201 and storing the wafer with formed bumps 202 in the second storage container 206 is carried out. The controller, 180 can control a post-forming bumps heating in a state in which the wafer with formed bumps 202 is kept in contact with the aluminum plate 173 of the post-forming bumps heating device 170, and can further control a blowing operation for charge removal and a blowing operation for warpage correction upon the wafer with formed bumps 202 which can be executed by the post-forming bumps heating device 170. Moreover, the controller is capable of controlling the preheating in a state while the pre-forming bumps wafer 201 is held in contact with the aluminum plate 163 of the preheat device 160 as well as a blowing operation for charge removal and a blowing operation for warpage correction to the pre-forming bumps wafer 201 which can be executed by the preheat device 160.

The blowing operation for warpage correction to the pre-forming bumps wafer 201 which is carried out by the bonding stage 110 is also controlled by the controller.

Each of these operations will be discussed in detail below. In the description below, the contact member 14100 for charge removal shown in FIG. 13 which is applicable to any wafers and substrates such as the above-described charge appearance semiconductor substrate accompanied with the warpage, etc. is exemplified as the contact member attached to the wafer holding parts 1411 and 1421. Contact members 14107, 14113, 14116, 14120 or 14121 can be a substitution for the contact member 14100.

Figure 27:
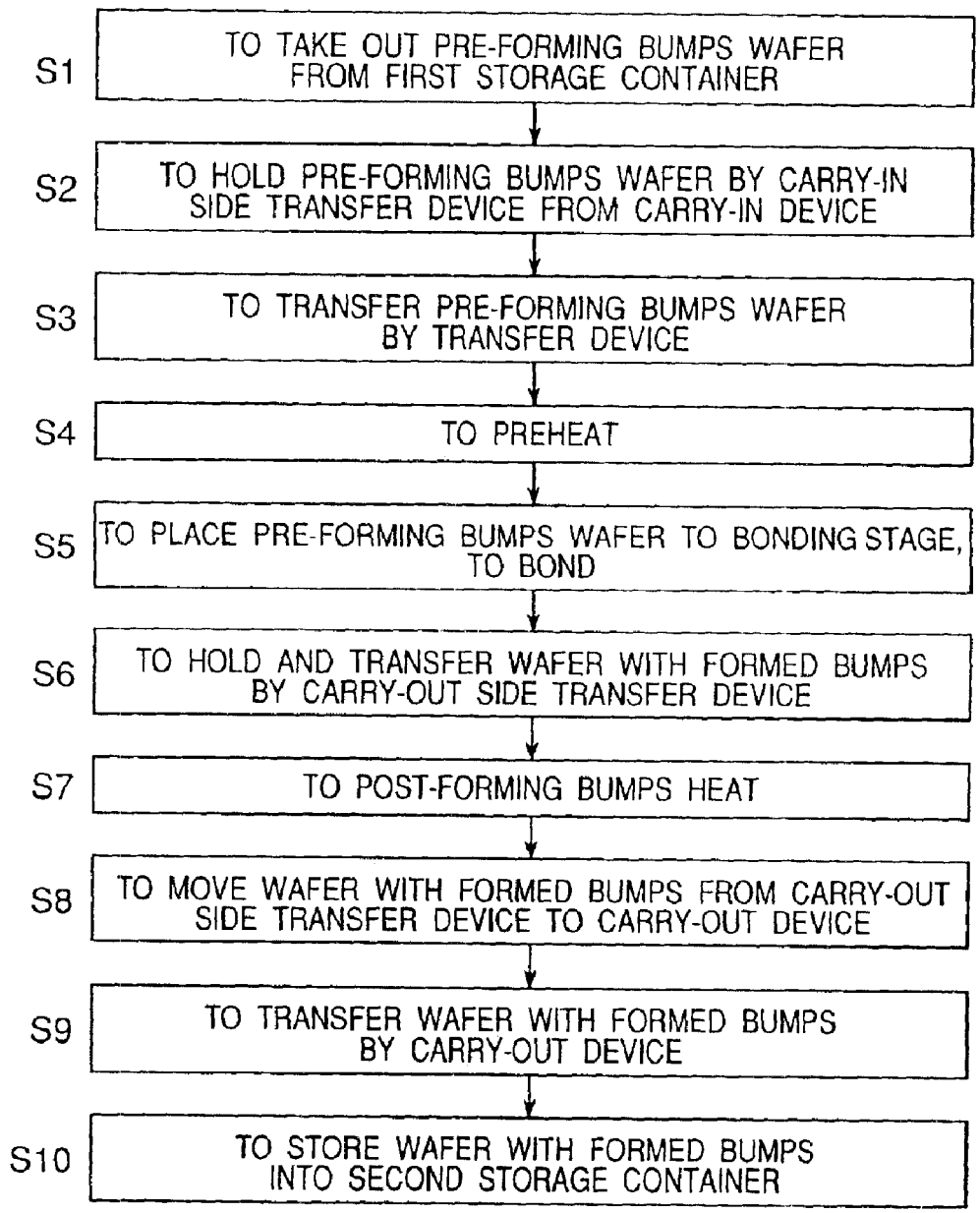
FIG. 27 is a flow chart of operations of the bump forming apparatus in FIG. 1.

According to the bump forming apparatus 101 of the embodiment, bumps are formed on the pre-forming bumps (pre-wafer) wafer 201, and the wafer with formed bumps (post-wafer) 202 is stored in the second storage container 206 by each process of steps 1–10 in FIG. 27 (the step is denoted by "S" in the drawing) More specifically, in step 1, the first storage container 205 is moved up and down by the first lift 151 so that the pre-forming bumps wafer 201 is disposed at a position where the wafer can be taken out by the carry-in device 131 from the first storage container 205, and then the pre-forming bumps wafer 201 is taken out by the carry-in device 131 from the first storage container 205. The pre-forming bumps wafer 201 held by the carry-in device 131 is orientated by the orientation flat registration device 133.

After the orientation flat registration, in step 2, the pre-forming bumps wafer 201 held on the holding stage 1311 of the carry-in device 131 is caught by the carry-in side transfer device 141. This operation will be detailed with reference to FIGS. 28–31.

Figure 28:
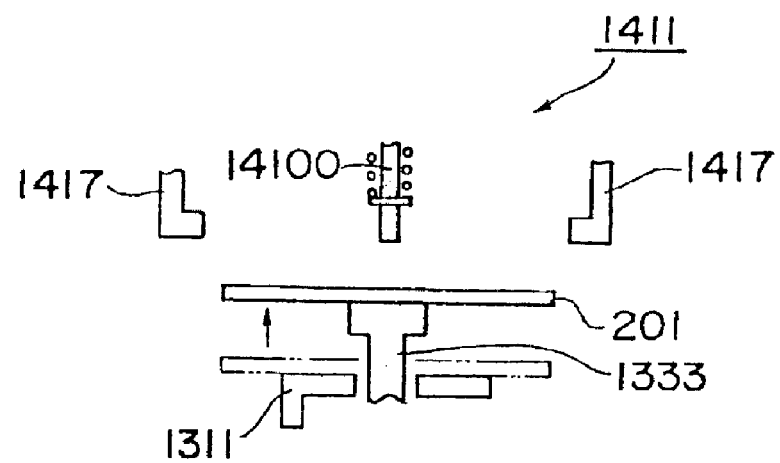
FIG. 28 is a diagram explanatory of operation of step 2 in FIG. 27 showing a state in which the wafer is being moved up by the carry-in device.
Figure 29:
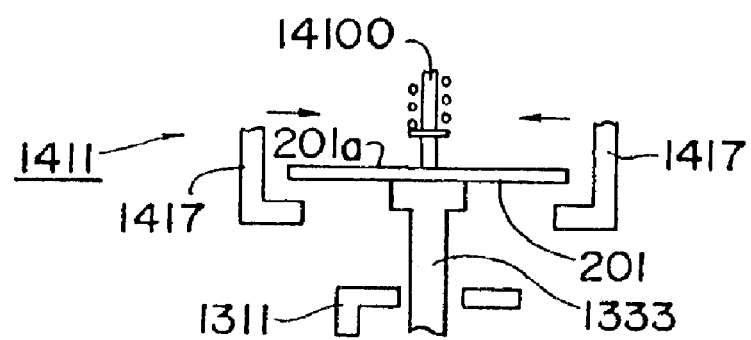
FIG. 29 is a diagram explanatory of the operation of step 2 in FIG. 27 showing a state immediately before the wafer is held by a carry-in side transfer device.

As shown in FIG. 28, after the above orientation registration, the holding part 1333 of the orientation flat registration device 133 moves up to suck and hold the pre-forming bumps wafer 201 from the holding stage 1311, and moves up further. In the meantime, the wafer holding part 1411 is positioned to above the pre-forming bumps wafer 201 and, the first holding member 1414 and the second holding member 1415 are moved by the driving part 1412 in a direction to open in the X direction. Next, in FIG. 29, the holding part 1333 moves up, whereby a leading end of the contact member 14100 for charge removal of the wafer holding part 1411 first comes in contact with the front face 201*a* of the pre-forming bumps wafer 201. Consequently, charge of the front face 201*a* (even if it has been charged immediately before the contact by the contact member 14100) is eliminated through this contact by the contact member 14100.

Although the pre-forming bumps wafer 201 and the wafer with formed bumps 202 used in the embodiment have a characteristic that they are hard to charge but they are hard to eliminate electric charge when they are once charged, as mentioned before. Therefore, the front face 201a cannot be perfectly eliminated from electric charge even by the contact by the contact member 14100. The front face 201a has an initial charge of approximately +10 to +25V. The symbol + stands for positively charged.

Figure 30:
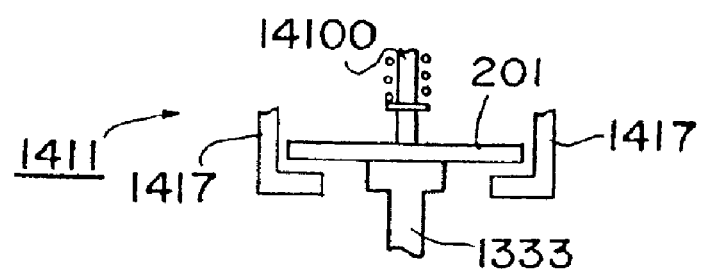
FIG. 30 is a diagram explanatory of the operation of step 2 in FIG. 27 showing a state immediately after the wafer is held by the carry-in side transfer device.

Referring to FIG. 30, the first holding member 1414 and the second holding member 1415 are moved by the driving part 1412 in a direction to close in the X direction.

Figure 31:
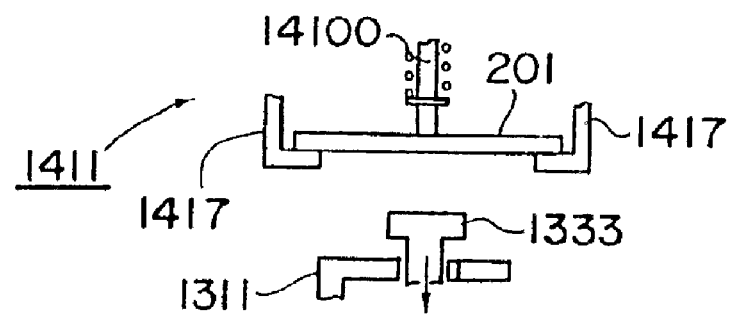
FIG. 31 is a diagram explanatory of the operation of step 2 in FIG. 27 showing a state in which the wafer is held by the carry-in side transfer device.

As shown in FIG. 31, the holding stage 1311 moves down, whereby the pre-forming bumps wafer 201 is held by the holding hooks 1417 of the wafer holding part 1411. At this time, the pre-forming bumps wafer 201 is pressed against the holding hooks 1417 by the urging force of the spring 14162 fitted to the contact member part 14100. The pressing force is of a level whereat problems such as a drop of the pre-forming bumps wafer 201 from the wafer holding part 1411 during the transfer, etc. are avoided. The pressing force never deforms the pre-forming bumps wafer 201.

When the rear face 201b of the pre-forming bumps wafer 201 and the holding hooks 1417 come in contact with each other, part of charge at the rear face 201b is earthed (grounded). However, it is difficult to remove charge inside the grooves 14 formed at the rear face 201b in the structure of this bump forming apparatus 101. Similar to the front face 201a, an initial charge of approximately −20 to −30V is present at the rear face 201b as well. The symbol stands for negatively charged. Electric charge can be more efficiently removed if the ion generator is employed as will be discussed in a modified example to be described later.

As shown in FIG. 2, in step 3, the wafer holding part 1411 while holding the pre-forming bumps wafer 201 is transferred and positioned to above the preheat device 601 by the moving device 1413.

Figure 32:
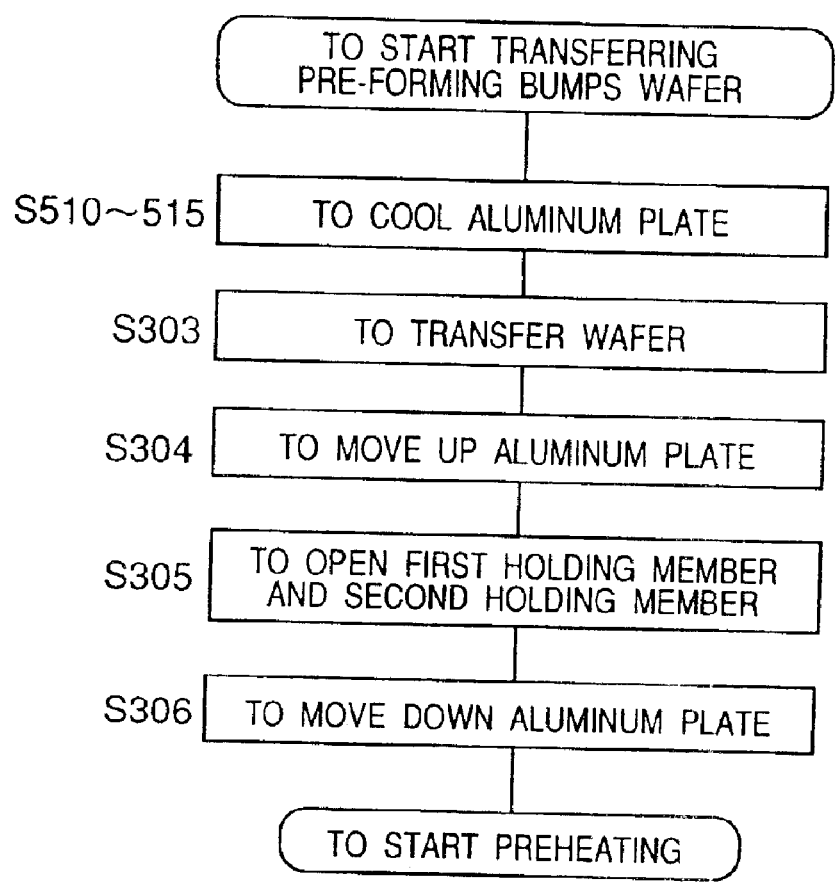
FIG. 32 is a flow chart explanatory of operation of step 3 of FIG. 27 in a case where a plate heater frame and the aluminum plate are separated from each other.

According to the embodiment as indicated in FIG. 22, the plate heater frame 162 and the aluminum plate 163 of the preheat device 160 are constructed to be separable from each other. Therefore, when the aluminum plate 163 has a temperature not lower than the ordinary temperature, steps 510–515 of FIG. 32 are carried out before the pre-forming bumps wafer 201 is transferred to above the preheat device 160, thereby cooling the aluminum plate 163. These steps 510–515 will be depicted later with reference to FIG. 40.

Figure 33:
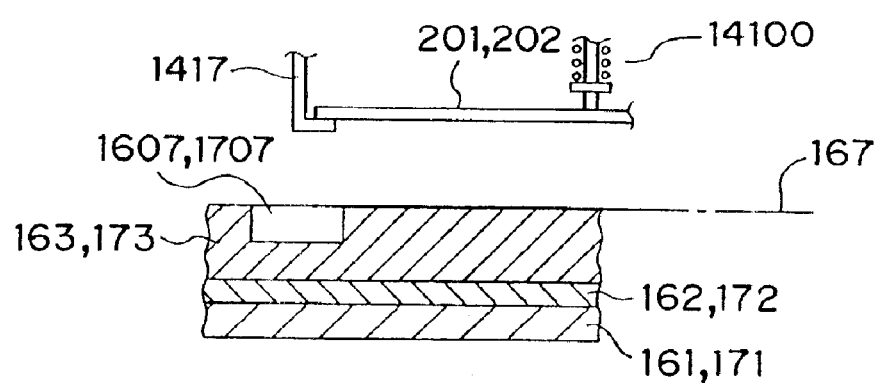
FIG. 33 is a diagram explanatory of the operation of step 3 of FIG. 27 showing a state in which a wafer before forming bumps is transferred to a location above the preheat device.

The aluminum plate 163 moves down to the down position 167 at a time point when the aluminum plate 163 is cooled to a predetermined temperature, i.e., approximately 40° C. in the embodiment. In step 303, the wafer holding part 1411 in a state while holding the pre-forming bumps wafer 201 is transferred and arranged to above the preheat device 160 by the moving device 1413 as indicated in FIG. 33.

Figure 34:
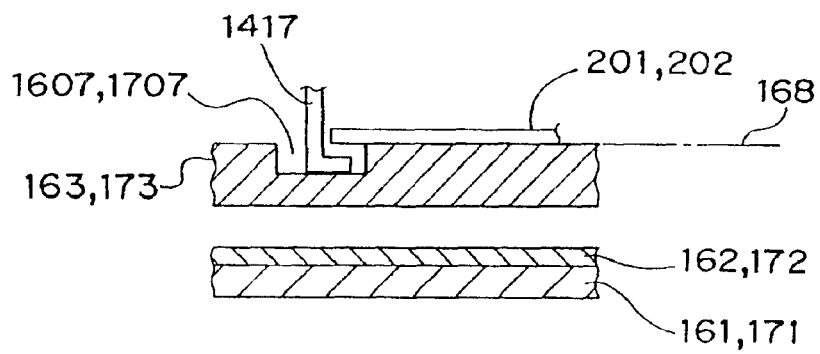
FIG. 34 is a diagram explanatory of the operation of step 3 of FIG. 27 showing a in which that the wafer before forming bumps is placed on the aluminum plate.

In step 304, again the aluminum plate 163 is raised to the up position 168. At this time, the holding hooks 1417 of the wafer holding part 1411 enter the grooves 1607 formed in the aluminum plate 163 as shown in FIG. 34. The pre-forming bumps wafer 201 held by the wafer holding part 1411 is placed on the aluminum plate 163. Since no elevator mechanism is installed in the carry-in side transfer device 141 and carry-out side transfer device 142 in the embodiment as described before, it is necessary to move the aluminum plate 163 up and down so as to carry the pre-forming bumps wafer 201 to the preheat device 160 and load the pre-forming bumps wafer on the aluminum plate 163.

Figure 35:
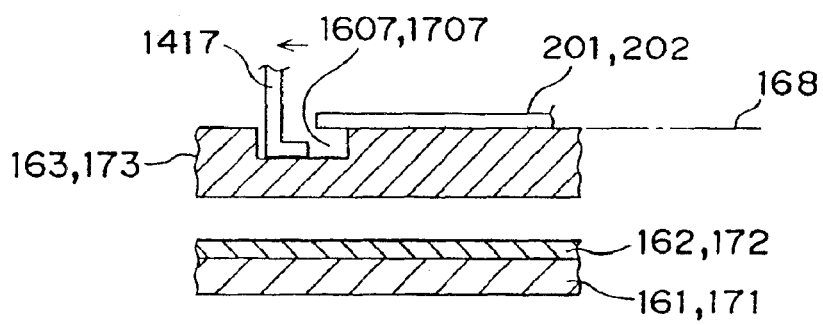
FIG. 35 is a diagram explanatory of the operation of step 3 of FIG. 27 showing a state in which holding of the wafer before forming bumps by the wafer holding part is released.
Figure 36:
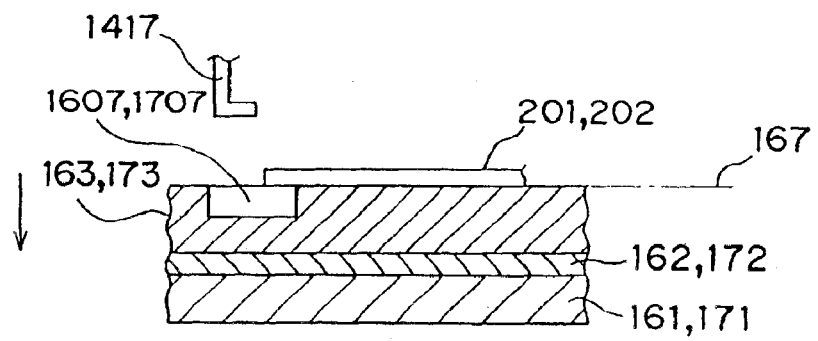
FIG. 36 is a diagram explanatory of the operation of step 3 of FIG. 27 showing a state in which the aluminum plate having the wafer before forming bumps loaded is moved down.

In step 305, the first holding member 1414 and second holding member 1415 of the carry-in side transfer device 141 are opened as shown in FIG. 35. In the next step 306, the aluminum plate 163 is lowered to the down position 167 as in FIG. 36. The operation moves to step 4, then the preheating is started.

Figure 37:
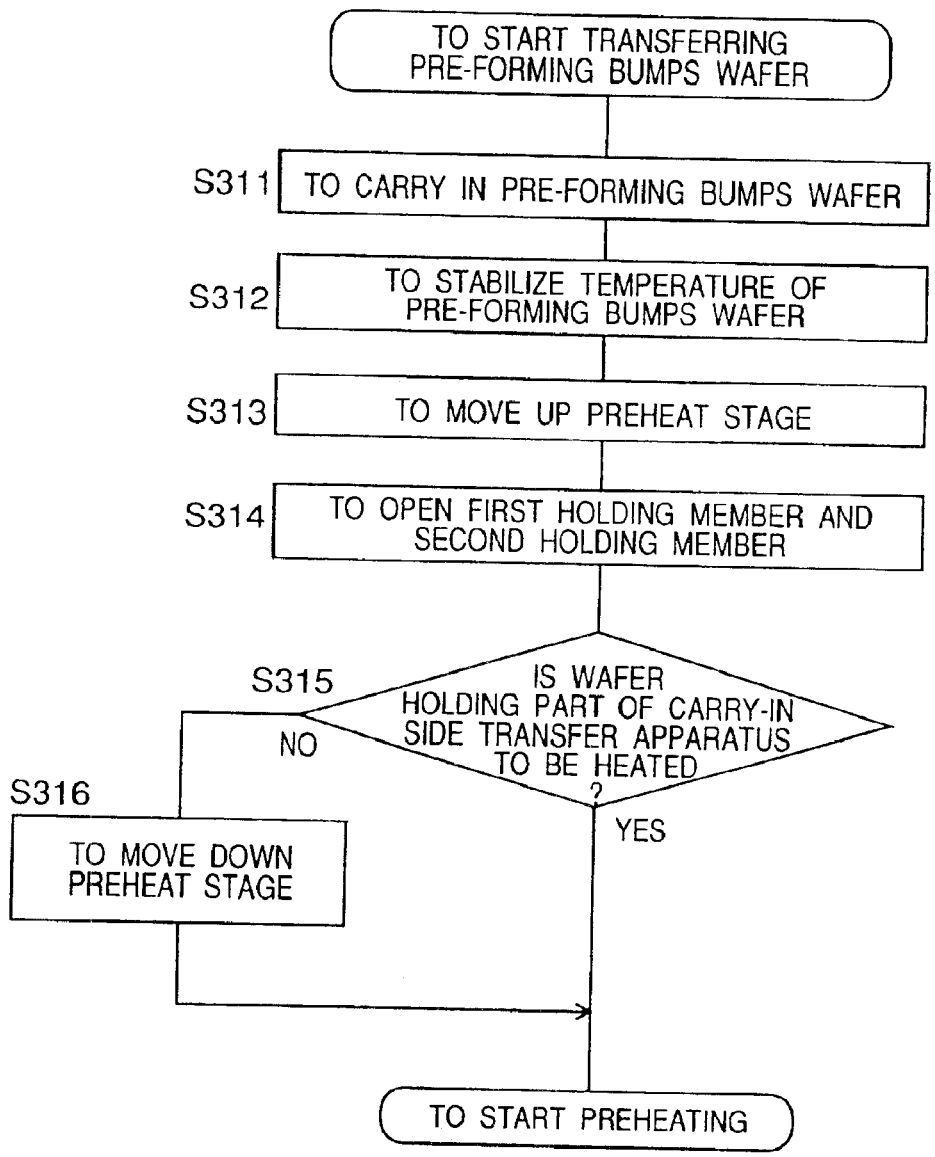
FIG. 37 is a flow chart explanatory of the operation of step 3 of FIG. 27 in a case where the plate heater frame and aluminum plate are not separated from each other.

In a modified example of the preheat device 160 in which the plate heater frame 162 and the aluminum plate 163 are made inseparable and moved up and down together at all times, the pre-forming bumps wafer 201 is carried to the preheat device 160 by operations of steps 311–316 of FIG. 37. The operations will now be described here. The inseparable plate heater frame 162 and aluminum plate 163 are generally identified as a preheat stage in the description below.

In step 311, the pre-forming bumps wafer 201 held by the wafer holding part 1411 is carried to above the preheat stage. For stabilizing a temperature of the pre-forming bumps wafer 201, in step 312, the pre-forming bumps wafer 201 is maintained above the preheat stage, for example, for 30 seconds to two minutes in a state in which the wafer is carried in. The preheat stage is raised to the up position 168 in step 313. The first holding member 1414 and second holding member 1415 of the carry-in side transfer device 141 are opened in step 314. In the next step 315, an operation specific to the modified example of the structure in which the plate heater frame 162 and the aluminum plate 163 are inseparable is executed. When the pre-forming bumps wafer 201 is moved by the carry-in side transfer device 141 from the preheat stage onto the bonding stage 110 after the preheating to be described later is completed, the pre-forming bumps wafer 201 may be partially cooled if there is a large temperature difference present between the holding hooks 1417 and the preheated pre-forming bumps wafer 201, which may lead to troubles. Therefore, it is determined in step 315 whether to heat the holding hooks 1417. When the holding hooks 1417 are to be heated, the preheating is started with the preheat stage raised to the up position 168. Because of this operation, the holding hooks 1417 already are entered in the grooves 1607 and can be heated as well by the heating of the preheat stage, and the troubles can be prevented. On the other hand, when the holding hooks are not to be heated, the preheat stage is lowered to the down position 167 in step 316 and the preheating is started.

Figure 38:
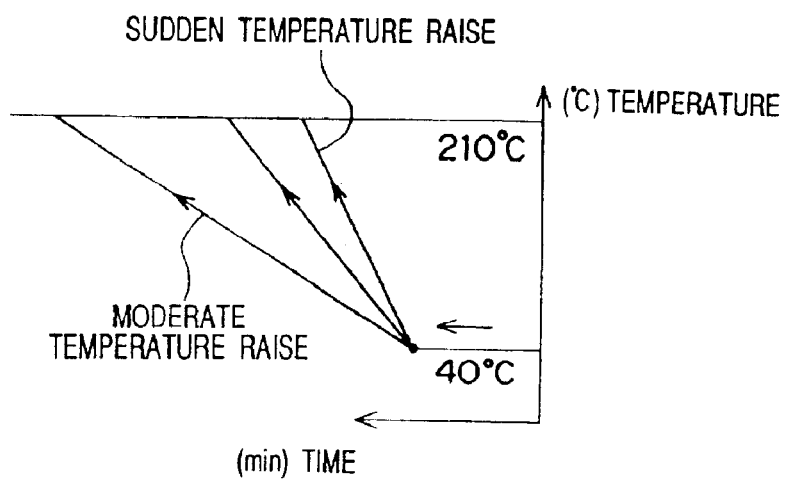
FIG. 38 is a diagram explanatory of the operation of step 4 of FIG. 27, specifically, a diagram of a temperature rise control in preheating.

In step 4, the pre-forming bumps wafer 201 is preheated from the room temperature to nearly 210° C. by the preheat device 160. Although electric charge is generated to the pre-forming bumps wafer 201 by a temperature change of the pre-forming bumps wafer 201 consequent to the preheating, since the pre-forming bumps wafer 201 is placed on the aluminum plate 163, the charge of the rear face 201b where charge is easy to accumulate is grounded via the aluminum plate 163 and hence can be efficiently removed. A temperature rise rate for preheating the pre-forming bumps wafer 201 can be adopted within a range of temperature rise rate which is not to break the pre-forming bumps wafer 201 by a sudden temperature change, namely, within approximately 50° C./min. Within this range, as shown in FIG. 38, for instance, a moderate temperature rise rate of approximately 5–10° C./min or a sudden temperature rise rate of approximately 20–40° C./min or the like, various temperature rise rates can be adopted even for the charge appearance semiconductor substrates which generate charge by the temperature change. The cycle time of the same level as the conventional art can be maintained even when the preheating is performed.

Figure 39:
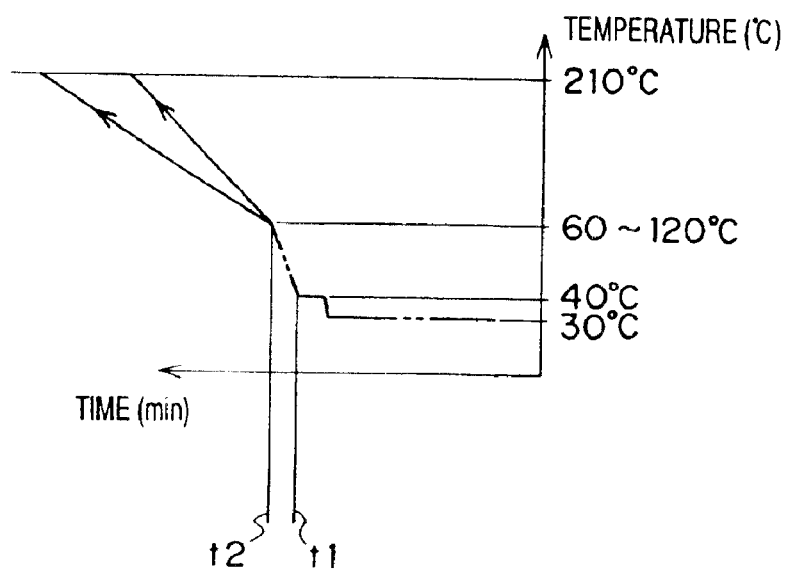
FIG. 39 is a diagram of a modified example of the temperature rise control in preheating.

In the constitution in which the plate heater frame 162 and aluminum plate 163 are moved up and down integrally at all times without being separated, a temperature rise can be controlled as in FIG. 39. That is, the operation in step 312 is carried out from a time t1 to a time t2, whereby a temperature of the pre-forming bumps wafer 201 is raised from about 40° C. to about 60–12° C. Thereafter, the temperature rise to about 210° C. is controlled by the moderate or sudden temperature rise rate as above.

Figure 40:
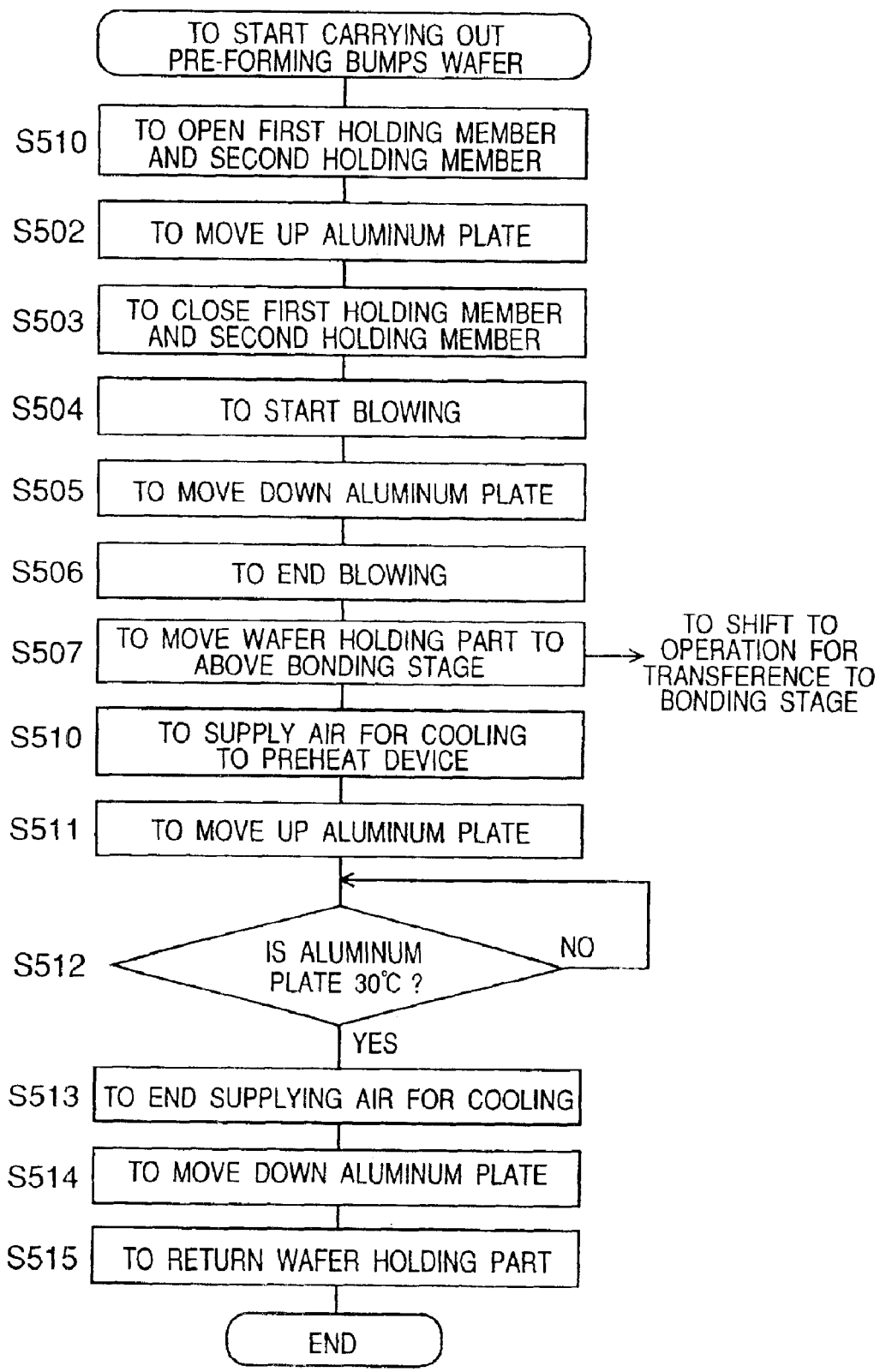
FIG. 40 is a flow chart explanatory of a transfer operation from the preheat device to the bump bonding unit in step 5 in FIG. 27 in a case where the plate heater frame and the aluminum plate are separated from each other.

When the temperature of the pre-forming bumps wafer 201 is raised to about 210° C., the operation moves to a next step 5. In step 5, as indicated in FIG. 40, the pre-forming bumps wafer 201 is carried from the preheat device 160 to the bonding stage 110. An amount of charge of the pre-forming bumps wafer 201 is smaller at around 210° C. in comparison with, for example, at 100° C. or so. Therefore, there is little probability that sparking is brought about to the pre-forming bumps wafer 201 when the pre-forming bumps wafer is moved from the preheat device 160 to the bonding stage 110. FIG. 40 shows the operation if the plate heater frame 162 and the aluminum plate 163 of the preheat device 160 are made separable.

In step 501 of FIG. 40, the first holding member 1414 and the second holding member 1415 are opened by driving the driving part 1412 of the carry-in side transfer device 141. In step 502, the aluminum plate 163 of the preheat device 160 is moved from the down position 167 to the up position 168. Each holding hook 1417 of the first holding member 1414 and the second holding member 1415 at this time enters the groove 1607 of the aluminum plate 163. The first holding member 1414 and second holding member 1415 are closed in step 503. The blow suction device 1611 is worked in step 504, whereby the air is jetted from the air holes 1608 of the aluminum plate 163 to separate the aluminum plate 163 and the pre-forming bumps wafer 201 from each other. The jetted air is set to a temperature of a level so that a decrease in temperature of the preheated pre-forming bumps wafer 201 can be prevented as much as possible (for example, set to approximately 160° C. 160° C.). During the blowing, the aluminum plate 163 is moved down in step 505 and the pre-forming bumps wafer 201 is held to the wafer holding part 1411 having the first holding member 1414 and the second holding member 1415. The operation of the blow suction device 1611 is stopped so as to stop the blowing in step 506. The wafer holding part 1411 holding the temperature-raised pre-forming bumps wafer 201 is moved to above the bonding stage 201 in step 507. The step shifts to an operation of loading the pre-forming bumps wafer to the bonding stage 110 to be described later.

Meanwhile, the aluminum plate 163 of the preheat device 160 heated to approximately 210° C. should be lowered again to nearly the room temperature before the next pre-forming bumps wafer 201 at the room temperature is loaded thereto. In step 510 of FIG. 40, the cooling air supply device 1613 is operated to supply the air for cooling to the cooling medium path 1612 in the aluminum plate 163. Further in steps 511 and 512, the air cylinder 1601 of the preheat device 160 is operated to raise the aluminum plate 163 from the down position 167 to the up position 168, thereby separating the plate heater frame 162 and the aluminum plate 163. The temperature of the aluminum plate 163 is then cooled to about 30° C. Although a cooling temperature of the aluminum plate 163 is set to be about 30° C. as described above, the temperature is not limited to this. That is, the cooling temperature of the aluminum plate 163 can be set so that the amount of charge of the pre-forming bumps wafer 201 does not exceed an allowable value and the pre-forming bumps wafer is prevented from being warped by the temperature difference between the pre-forming bumps wafer 201 of the ordinary temperature and the aluminum plate 163. The aluminum plate 163 can be efficiently cooled by separating the plate heater frame 162 and the aluminum plate 163 as described above. After the aluminum plate 163 is cooled to about 30° C., in step 513, the operation of the cooling air supply device 1613 is stopped to terminate the supply of the air for cooling. The aluminum plate 163 is moved down in step 514. The wafer holding part 1411 of the carry-in side transfer device 141 is returned to above the carry unit 130 in step 515.

Figure 41:
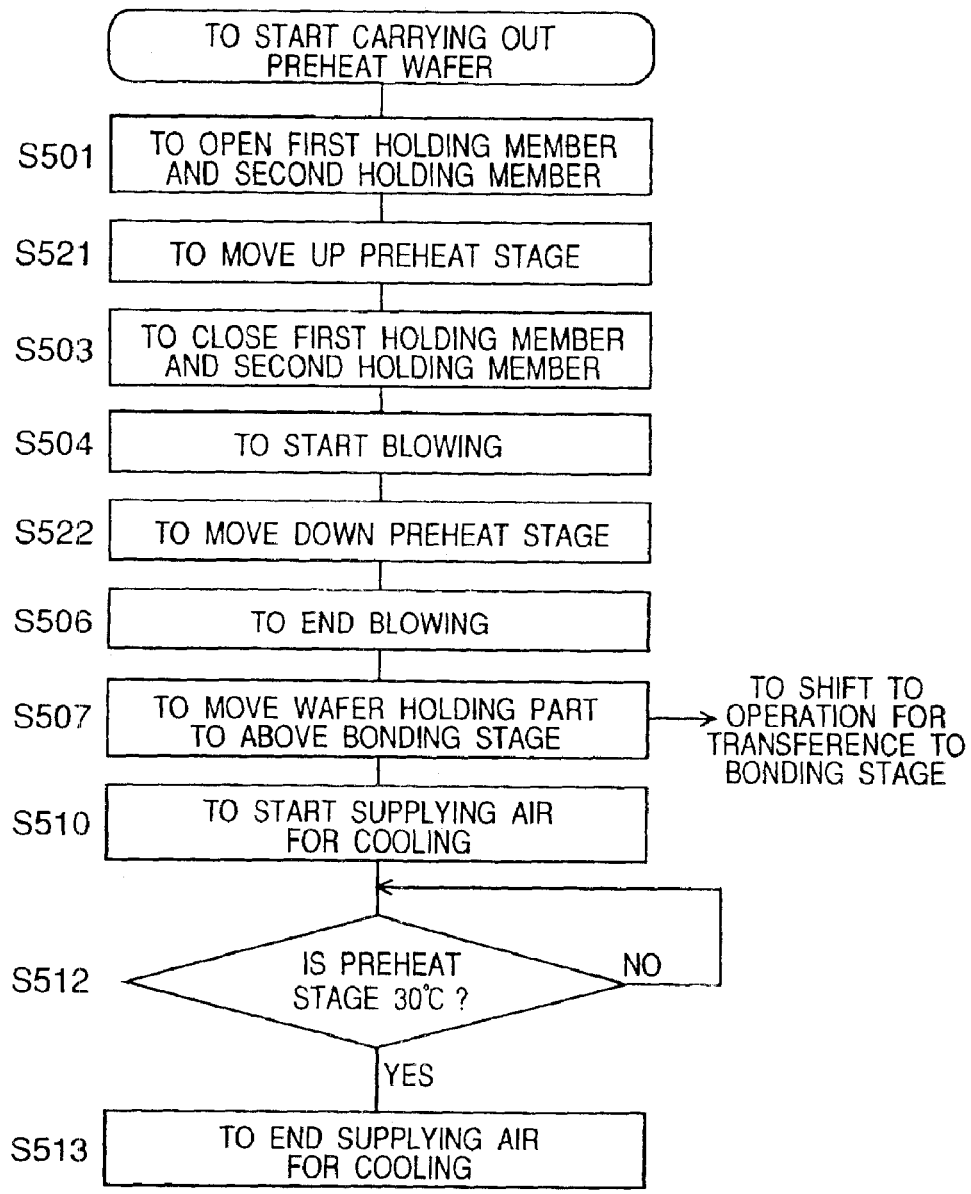
FIG. 41 is a flow chart explanatory of a transfer operation from the preheat device to the bump bonding unit in step 5 in FIG. 27 in a case where the plate heater frame and the aluminum plate are not separated from each other.

On the other hand, when the plate heater frame 162 and the aluminum plate 163 are adapted to move up and down in one unit at all times without being separated from each other, operations of FIG. 41 are carried out. Similar operations in FIG. 41 to those described with reference to FIG. 40 are designated by the same reference numerals as in FIG. 40 and the description thereof will be omitted. Steps 521 and 522 in FIG. 41 correspond respectively to steps 502 and 505 in FIG. 40, in which the preheat stage comprised of the plate heater frame 162 and the aluminum plate 163 in one body is moved up and down.

Hereinafter will be described the operation of transferring and loading the pre-forming bumps wafer 201 from the preheat device 160 to the bonding stage 110.

As described above, the pre-forming bumps wafer 201 is raised to approximately 210° C. by the preheating, and this temperature slightly decreases after preheating before the pre-forming bumps wafer is loaded on the bonding stage 110. If the pre-forming bumps wafer 201 thus slightly reduced in temperature is loaded onto the bonding stage 110 heated to approximately 210° C., in some cases, the temperature difference between the pre-forming bumps wafer 201 and the bonding stage 110 causes the pre-forming bumps wafer 201 to warp as shown in FIG. 12 depending on the material of the pre-forming bumps wafer 201. The pre-forming bumps wafer 201 accompanied with the warpage is, for example, LiTaO$_3$ wafer, LiNbO$_3$ wafer or the like. As such, the embodiment executes an operation of correcting the warpage of the pre-forming bumps wafer 201 on the bonding stage 101. In a case of the LiNbO$_3$ wafer, hot air is blown to the wafer to correct the warpage after the wafer is placed on the bonding stage 110. In a case of the LiTaO$_3$ wafer, the blowing of the hot air after the wafer is placed on the bonding stage is not carried out because it takes a longer time to correct the warpage than in the case of the LiNbO$_3$ wafer. Such difference is considered to result from a lower heat conductivity of the LiTaO$_3$ wafer than that of the LiNbO$_3$ wafer. Therefore, blowing the hot air is effective in reverse to the LiTaO$_3$ wafer and the temperature of the LiTaO$_3$ wafer can be readily made rather uniform simply by heating the wafer after placing the wafer on the bonding stage. The warpage correction by blowing the hot air will be discussed with reference to FIG. 42, and the correction that without blowing the hot air will be described with reference to FIG. 43.

Figure 42:
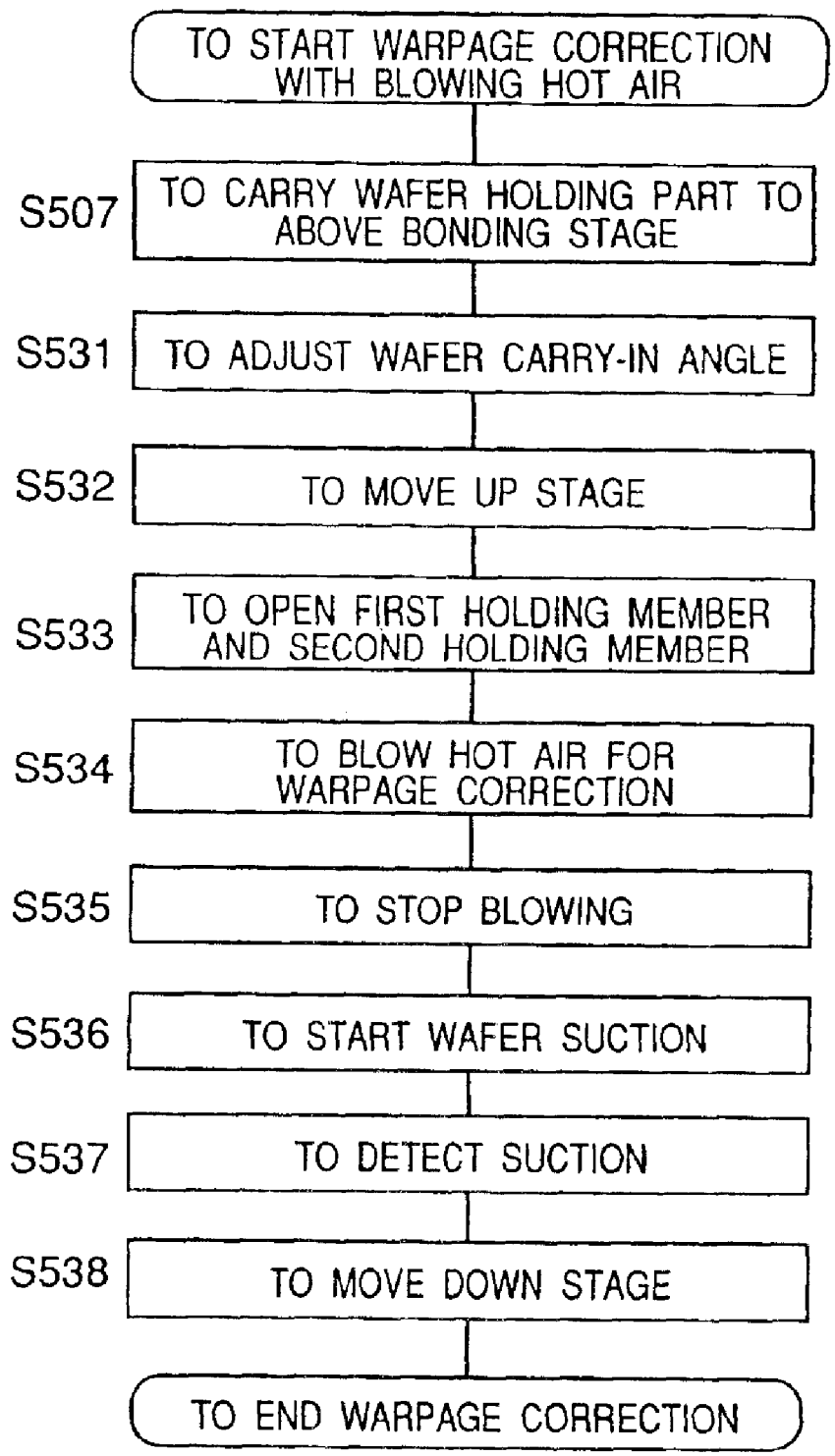
FIG. 42 is a flow chart explanatory of a warpage correction carried out by blowing a hot air when the wafer before forming bumps is transferred to the bump bonding stage in step 5 of FIG. 27.
Figure 45:
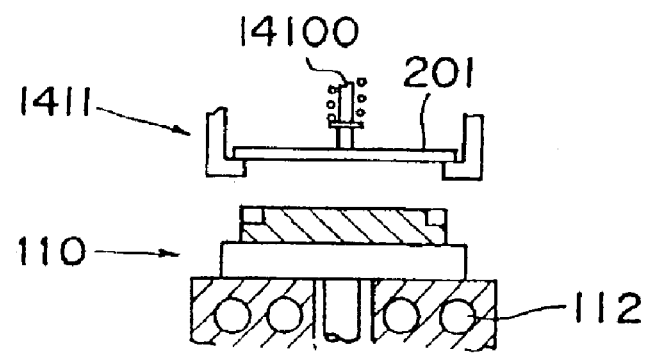
FIG. 45 is a diagram explanatory of operation in step 5 of FIG. 27 showing a state in which the wafer before forming bumps is arranged above the bonding stage.
Figure 46:
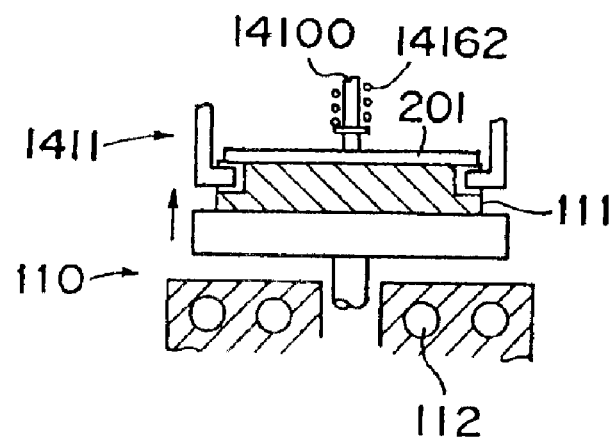
FIG. 46 is a diagram explanatory of operation in step 5 of FIG. 27 showing a state immediately before the wafer is held by the bonding stage.

In step 507 in FIG. 42, the pre-forming bumps wafer 201 held by the wafer holding part 1411 of the carry-in side transfer device 141 is carried to above the bonding stage 110 as shown in FIG. 45. In the next step 531, the bonding stage 110 is rotated in order to adjust a carry-in angle of the pre-forming bumps wafer 201 to the bonding stage 110. In step 532, the wafer laying stage 111 is raised in the thickness direction of the pre-forming bumps wafer 201 as shown in FIG. 46 and comes into contact with the rear face 201b of the pre-forming bumps wafer 201, thereby further pressing up the pre-forming bumps wafer 201. When the wafer laying stage 111 is raised, each holding hook 1417 of the wafer holding part 1411 enters the groove 116 formed on the wafer laying stage 111.

When the pre-forming bumps wafer is pressed upward, the contact member 14100 for charge removal which is in contact with the front face 201a of the pre-forming bumps wafer 201 is pressed up while maintaining contact with the front face 201a against the urging force of the spring 14162. Generation of sparks at the front face 201a is prevented because the pre-forming bumps wafer 201 has its amount of charge decreased in the vicinity of 210° C. Moreover, the contact member 14100 for charge removal is held in contact with the front face 201a as described above.

Figure 47:
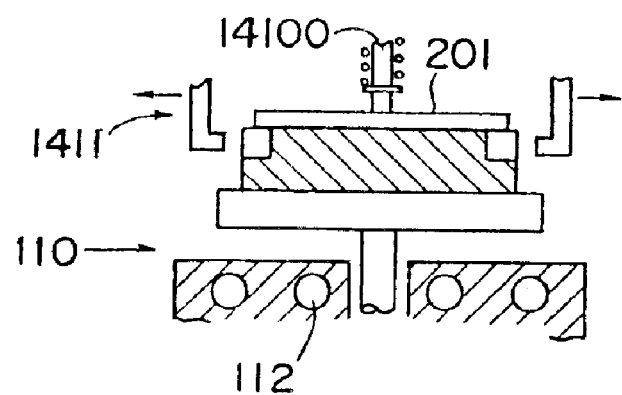
FIG. 47 is a diagram explanatory of operation in step 5 of FIG. 27 showing a state in which the wafer is held on the bonding stage and then the carry-in side transfer device releases the holding of the wafer.

In step 533, as shown in FIG. 47, the first holding member 1414 and second holding member 1415 are moved in the opening direction by the operation of the driving part 1412 of the carry-in side transfer device 141. The holding of the pre-forming bumps wafer 201 by the wafer holding part 1411 is released.

In the above state, the blower 115 is worked in step 534 to blow out the hot air for warpage correction of approximately 160° C. from the air holes 113 opened in the wafer laying stage 111. Although the pre-forming bumps wafer 201 floats by approximately 0.5 mm up from the wafer laying stage 111 due to the blowing, the holding hooks 1417 of the first holding member 1414 and the second holding member 1415 present in the periphery of the pre-forming bumps wafer 201 prevent the floating pre-forming bumps wafer 201 from dropping from on the wafer laying stage 111. The hot air for warpage correction is blown for about 2–4 minutes in which the warpage of the LiNbO$_3$ wafer can be corrected. However, the blowing time and the temperature of the hot air are not limited to these values and are set depending on the material of the charge appearance semiconductor substrate to be corrected.

Figure 48:
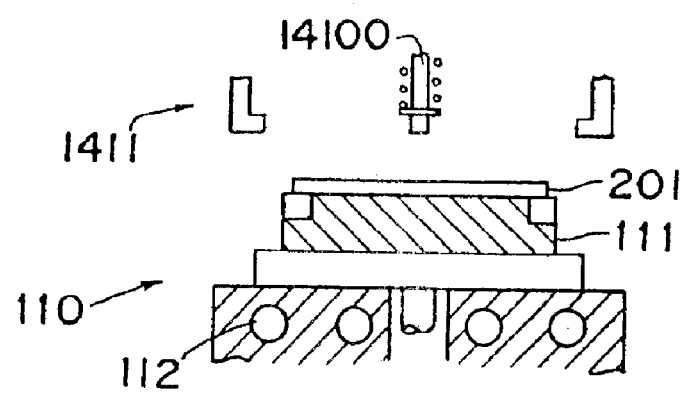
FIG. 48 is a diagram explanatory of operation in step 5 of FIG. 27 showing a state in which the wafer is held at the bonding stage.

After the blowing time is passed, the operation of the blower 115 is stopped in step 535 to turn off the blowing. In step 536, the suction device 114 is worked to start sucking the pre-forming bumps wafer 201 through the air holes 113 onto the wafer laying stage 111. The operation for sucking the pre-forming bumps wafer is detected in step 537, and the wafer laying stage 111 moves down to the original position while holding the pre-forming bumps wafer 201 as shown in FIG. 48 in step 538.

The warpage correction is completed in the above procedures. The wafer holding part 1411 of the carry-in side transfer device 141 is then moved to above the carry unit 130.

Figure 43:
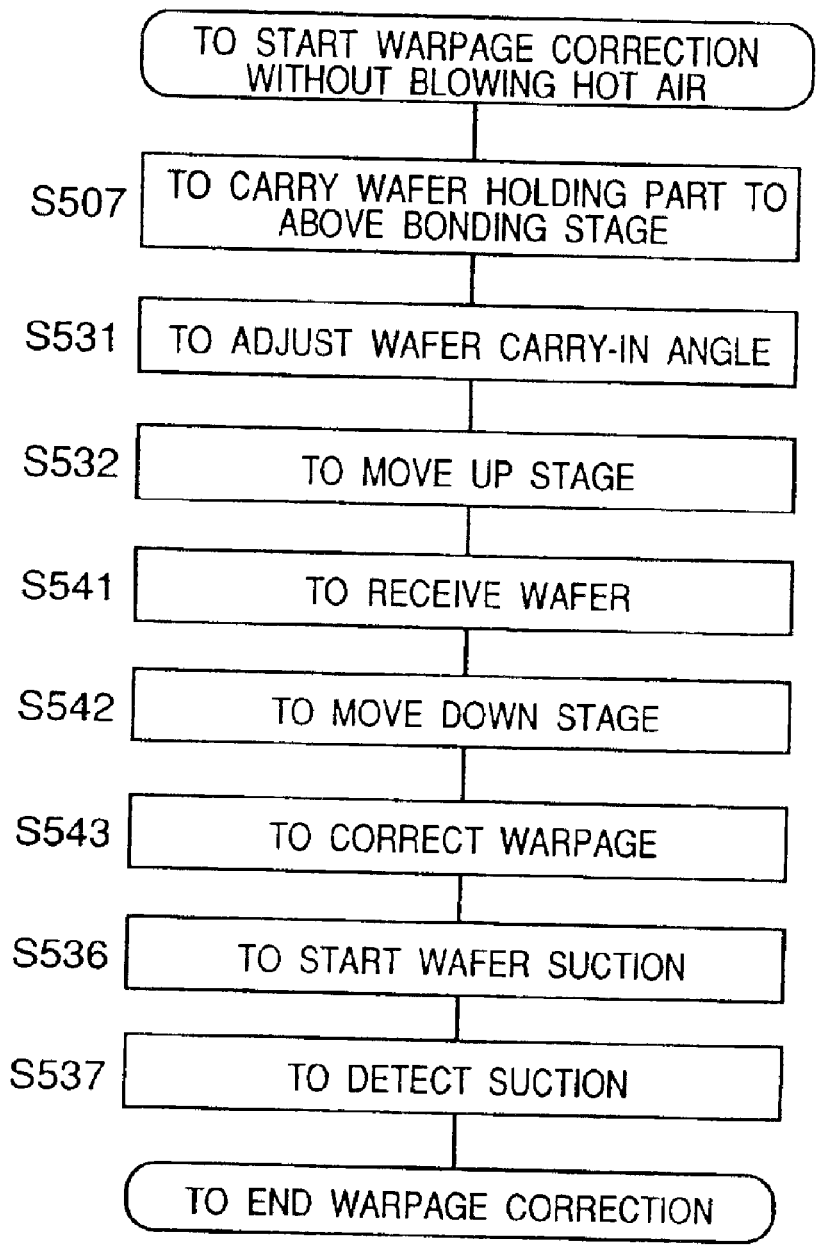
FIG. 43 is a flow chart explanatory of a warpage correction carried out without blowing the hot air when the wafer before forming bumps is transferred to the bump bonding stage in step 5 of FIG. 27.

The warpage correction without blowing the hot air will now be described. Each operation in steps 507, 531, 532, 536 and 537 among operations in FIG. 43 is identical to the operation described hereinabove with reference to FIG. 42 and will be omitted from the following description. The wafer laying stage 111 is moved up in step 532 and the pre-forming bumps wafer 201 is loaded on the wafer laying stage 111 in step 541. The pre-forming bumps wafer 201 is not sucked by the wafer laying stage 111 at this time because if the pre-forming bumps wafer 201 were sucked to the wafer laying stage with the pre-forming bumps wafer 201 warped, the pre-forming bumps wafer. 201 would be limited in deformation, probably resulting in a crack or similar damage. The wafer laying stage 111 is moved down to the original position in step 542.

As a result of the movement down to the original position, the wafer laying stage 111 is heated again by the heater 112 to approximately 210° C. In step 543, according to the present embodiment, the pre-forming bumps wafer 201 is loaded on the wafer laying stage 111 without blowing the hot air for warpage correction for approximately 2 minutes during which the warpage correction to the LiTaO$_3$ wafer can be accomplished. During this time, the LiTaO$_3$ wafer is heated by the wafer laying stage 111 and the warpage is corrected. The time during which the pre-forming bumps wafer is left as above and the temperature for warpage correction are set depending on the material of the charge appearance semiconductor substrate to be corrected and are not limited to the above values.

The warpage of the pre-forming bumps wafer 201 can be corrected by the warpage correction either with blowing the hot air or without blowing the hot air, so that cracks or similar damage to the pre-forming bumps wafer 201 is prevented.

After the above-discussed warpage correction operation, bumps are formed by the bump forming head 120 to electrode parts of the circuits on the pre-forming bumps wafer 201. The pre-forming bumps wafer 201 is maintained at the bump bonding temperature during the bump formation while hardly being subjected to a temperature change. Therefore, charge is rarely generated on the pre-forming bumps wafer 201.

In step 6, after the bumps are formed, the pre-forming bumps wafer 202 is caught by the first holding member 1424 and the second holding member 1425 of the wafer holding part 1421 of the carry-out side transfer device 142, the wafer holding part 1421 is moved in the X direction by working the moving device 1423 of the carry-out side transfer device 142, the wafer with formed bumps 202 is moved above the post-forming bumps heating device 170 as shown in FIG. 2, and then the wafer with formed bumps is placed on to the post-forming bumps heating device 170. These operations will be detailed hereinbelow with reference to FIGS. 50 and 51.

Figure 50:
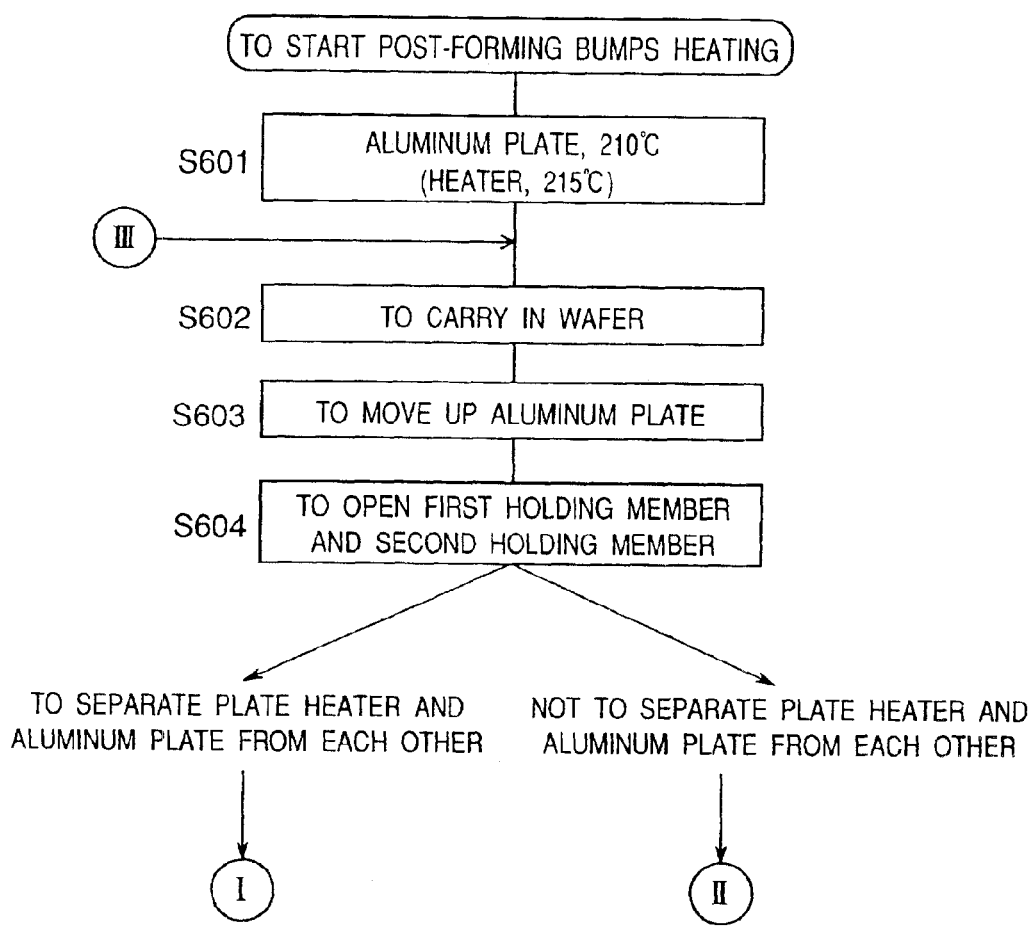
FIG. 50 is a flow chart explanatory of the post-forming bumps heating.

In step 601 of FIG. 50, the aluminum plate 173 of the post-forming bumps heating device 170 is heated to approximately 210° C. In step 602, the wafer with formed bumps 202 held by the wafer holding part 1421 is carried to above the post-forming bumps heating device 170. In step 603, the heated aluminum plate 173 is raised from the down position 167 to the up position 168. The wafer with formed bumps 202 comes into contact with the aluminum plate 173 and is loaded on the aluminum plate 173. The holding hooks 1417 of the first holding member 1424 and the second holding member 1425 of the wafer holding part 1421 of the carry-out side transfer device 142 enter the grooves 1707 formed in the aluminum plate 173. In step 604, the first holding member 1424 and the second holding member 1425 of the wafer holding part 1421 of the carry-out side transfer device 142 are opened. The holding of the wafer with formed bumps 202 is relieved. Post-forming bumps heating operation in step 7 is slightly different between when the post-forming bumps heating device 170 has the separable plate heater frame 172 and aluminum plate 173 as in the present embodiment, and when the post-forming bumps heating device 170 is constructed as the first body type as in the foregoing modified example.

In the case of the first body type, the following steps 641–647 can be executed between the steps 601 and 602.

Figure 51:
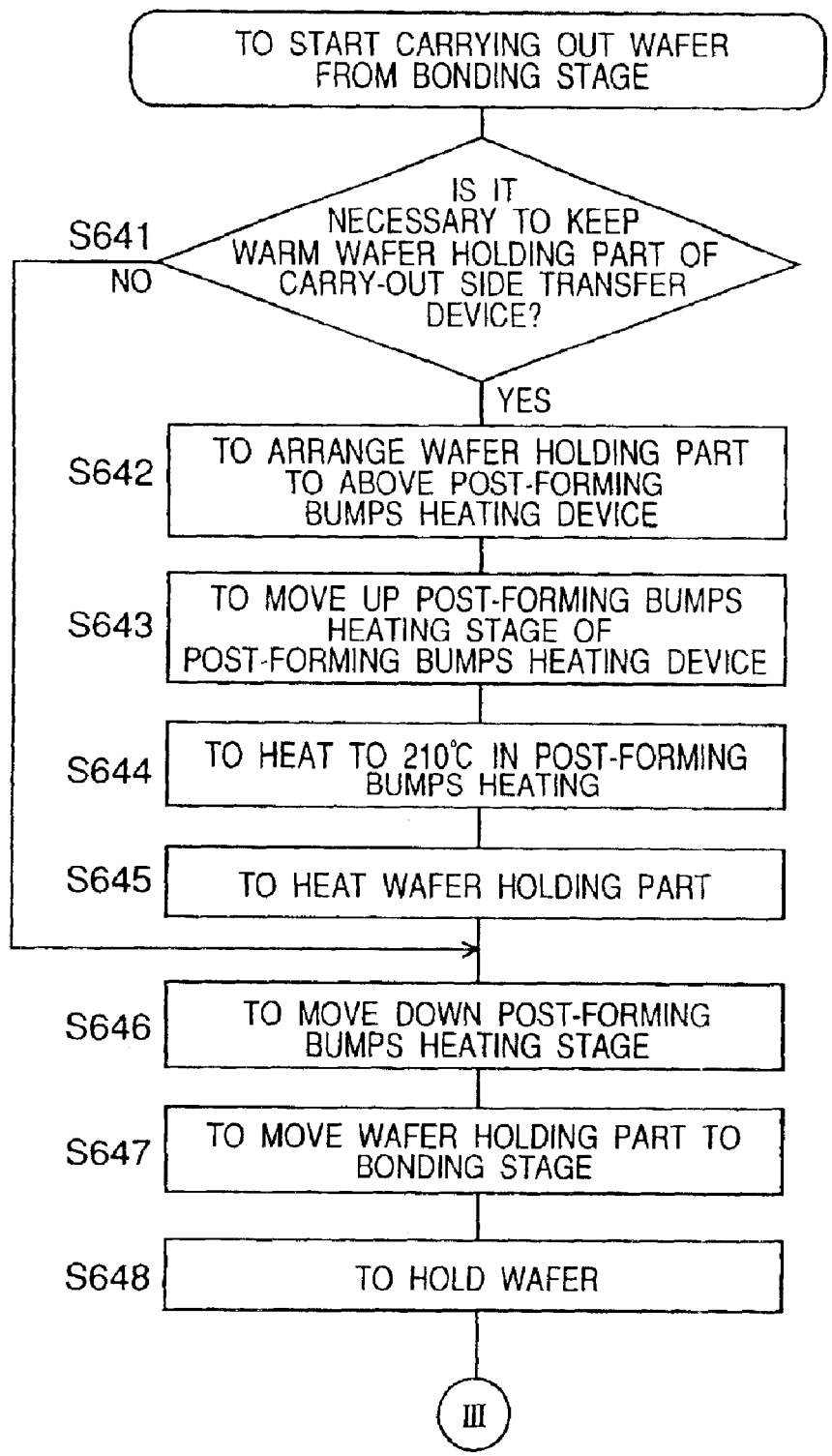
FIG. 51 is a flow chart of heating of the wafer holding part when the post-forming bumps heating starts.

Specifically, in step 641 of FIG. 51, it is determined whether or not it is necessary to particularly heat the holding hooks 1417 of the wafer holding part 1421 of the carry-out side transfer device 142. That is, when the wafer with formed bumps 202 heated to approximately 210° C. by the bonding stage 110 is held and transferred by the wafer holding part 1421 of the carry-out side transfer device 142 to the post-forming bumps heating device 170, if such temperature difference that damages the wafer with formed bumps 202 (e.g., approximately 40° C.) is present between the wafer holding part 1421, particularly the holding hooks 1417 and the wafer with formed bumps 202, there is a risk of damage to the wafer with formed bumps 202 when the wafer is held. It depends on the material or the like of the handled charge appearance semiconductor substrate whether or not the temperature difference or damage is brought about. Because of this reason, whether to heat the wafer holding part 1421 is determined in step 641. When the heating is to be conducted, the step moves to step 642. When the heating is not necessary, the step moves to step 646.

When the heating is to be carried out, in step 642, the moving device 1423 of the carry-out side transfer device 142 is operated to move the wafer holding part 1421 of the carry-out side transfer device 142 to above the post-forming bumps heating device 170. In step 643, a post-forming bumps heating stage constituted integrally of the plate heater frame 172 and aluminum plate 173 of the post-forming bumps heating device 170 is moved up from the down position 167 to the up position 168. Each of the holding hooks 1417 of the first holding member 1424 and the second holding member 1425 at the wafer holding part 1421 of the carry-out side transfer device 142 enters the groove 1707 formed in the aluminum plate 173. In step 644, the temperature of the post-forming bumps heating stage is raised to about 210° C. Then the holding hooks 1417 present in the grooves 1707 and also the wafer holding part 1421 are heated in step 645. After the heating, the post-forming bumps heating stage is lowered to the down position 167 in step 646.

In step 647, the heated wafer holding part 1421 is moved to above the bonding stage 110. The wafer laying stage 111 of the bonding stage 110 is moved up and up, and the wafer with formed bumps 202 on the wafer laying stage 111 is held to the wafer holding part 1421 in step 648. The step moves to step 602 and then to step 607 through steps 603 and 604.

In step 7, while a decrease in temperature of the wafer 202 is controlled by heating the wafer with formed bumps 202 by the post-forming bumps heating device 170, the wafer with formed bumps 202 is heated for post-forming bumps to a temperature exceeding the room temperature by approximately 10° C. from the bump bonding temperature (i.e., approximately 210° C.).

Figure 52:
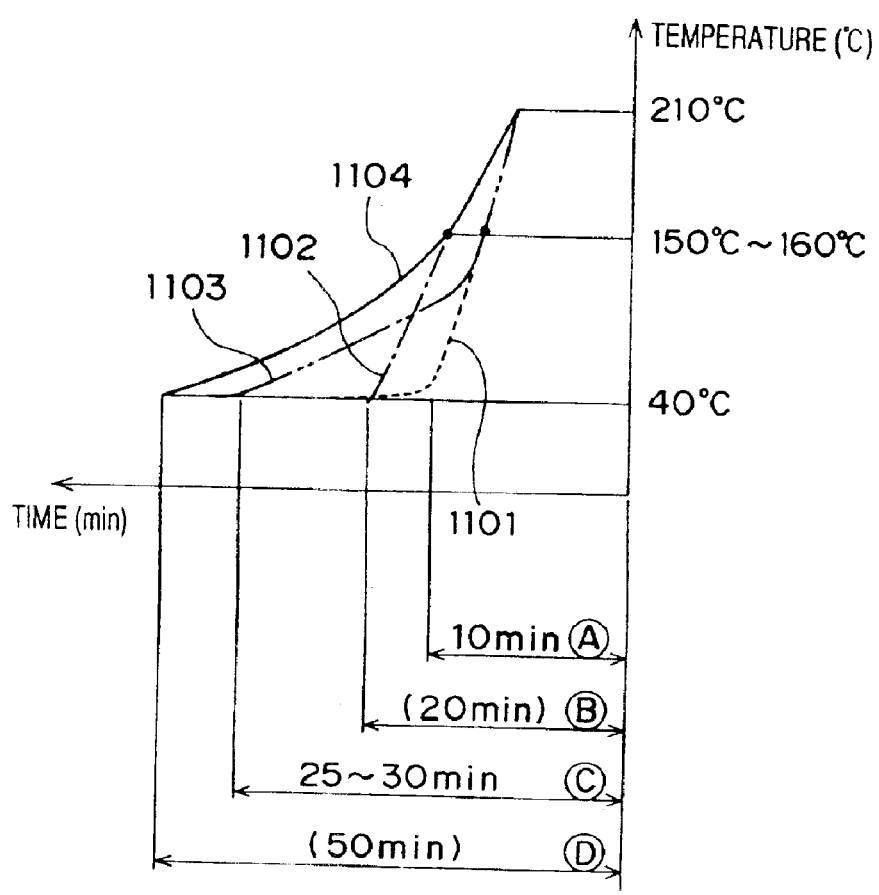
FIG. 52 is a graph of a decrease in temperature pattern in the post-forming bumps heating.

The wafer with formed bumps 202 which is the charge appearance semiconductor substrate is charged due to the temperature change in the decreasing temperature. However, since the wafer with formed bumps 202 is loaded in direct contact with the aluminum plate 173 of the post-forming bumps heating device 170 as described above, electric charge of the rear face which is particularly easy to charge can be efficiently grounded via the aluminum plate 173. Similar to the preheating operation discussed earlier, various kinds of decrease in temperature control as indicated in FIG. 52 are accordingly made possible although the charge appearance semiconductor substrate is handled. That is, the decrease in temperature can be controlled not only by controlling the temperature of the plate heater 171, but also by a variety of controls in operation, specifically, by separating the plate heater frame 172 and the aluminum plate 173, by not separating the plate heater frame and the aluminum plate, by supplying the air for cooling, and by not supplying the air for cooling, in a case of the structure as in the embodiment where the plate heater frame 172 and the aluminum plate 173 are rendered separable.

A decrease in temperature curve designated by a reference numeral 1101 in FIG. 52 is obtained when the plate heater frame 172 and the aluminum plate 173 are separated and also the air for cooling is supplied to the aluminum plate 173. A decrease in temperature curve of a reference numeral 1102 is obtained when only the air for cooling is supplied without separating the plate heater frame and the aluminum plate. A decrease in temperature curve of a reference numeral 1103 is obtained when the plate heater frame and the aluminum plate are separated without the air for cooling supplied, while a decrease in temperature curve of a reference numeral 1104 is a curve when the separation and the supply of the air for cooling are not carried out. The decrease in temperature control in each above case will be depicted below.

Figure 53:
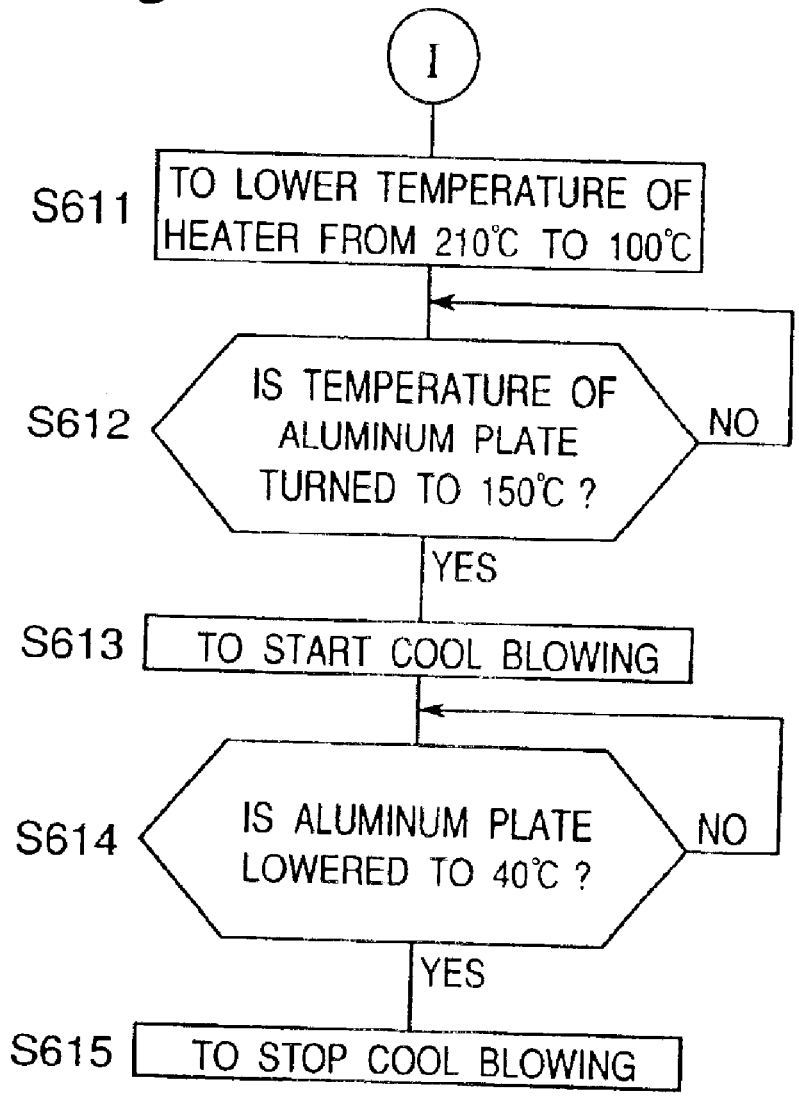
FIG. 53 is a flow chart explanatory of the post-forming bumps heating.

FIG. 53 shows an operation in which the decrease in temperature of the aluminum plate 173 (i.e., wafer with formed bumps 202 placed on the aluminum plate 173) is controlled while the plate heater frame 172 and aluminum plate 173 are separated. In step 611 of FIG. 53, the temperature of the plate heater 171 is lowered by the temperature control or naturally cooled to approximately 100° C. from approximately 210° C. At the same time, the aluminum plate 173 is moved to the up position 168 to be separated from the plate heater frame 172. It is determined in step 612 whether or not the temperature of the aluminum plate 173 of the post-forming bumps heating device 170 has reached approximately 150° C. through the decrease in temperature in the embodiment. The temperature at which 150° C. is a temperature where a decrease in temperature rate changes. That is, a decrease in temperature rate at lower than 150° C. becomes lower than a decrease in temperature rate from approximately 210° C. to approximately 150° C. when the cooling is started from approximately 210° C. The value 150° C. is obtained from experiments by the applicant. The temperature value is set on a basis of the material of the charge appearance semiconductor substrate, the bonding temperature and the like, and not restricted to the above 150° C. The cooling air supply device 1713 is operated in step 613 to supply the air for cooling to the aluminum plate 173 after the aluminum plate 173 becomes approximately 150° C. It is determined in step 614 whether or not the temperature of the aluminum plate 173 is decreased to approximately 40° C. The operation of the cooling air supply device 1713 is stopped when the aluminum plate is decreased to approximately 40° C., thereby shutting the supply of the air for cooling to the aluminum plate 173. The temperature of 40° C. is a value to be set on the basis of the material of the charge appearance substrate, and is not limited to this value.

The above steps 611–615 realize the decrease in temperature control indicated by the reference numeral 1101 in FIG. 52. In this case, the aluminum plate 173 can be cooled from approximately 210° C. to approximately 40° C. in about 10 minutes.

Without the steps 613–615 executed, a decrease in temperature control designated by a reference numeral 1103 in FIG. 52 is executed. The aluminum plate 173 is decreased in temperature from approximately 210° C. to approximately 40° C. in about 25–30 minutes.

Figure 54:
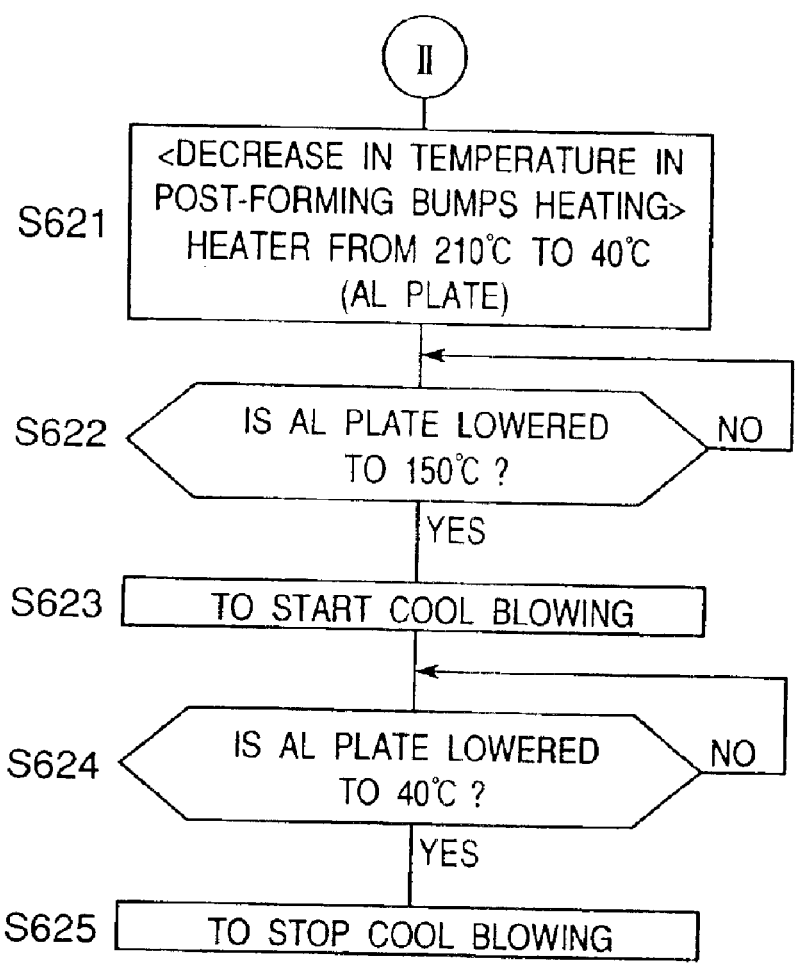
FIG. 54 is a flow chart explanatory of the post-forming bumps heating.

According to the operation in FIG. 54, the decrease in temperature of the aluminum plate 173 (namely, the wafer with formed bumps 202 loaded on the aluminum plate 173) is controlled without separating the plate heater frame 172 from the aluminum plate 173. A difference between the decrease in temperature control in FIG. 53 and that in FIG. 54 is only whether or not the plate heater frame 172 and the aluminum plate 173 are separated, and therefore a detailed description will be omitted. Operations in steps 621–625 in FIG. 54 correspond to operations in steps 611–615 of FIG. 53 respectively.

Through the operations in steps 621–625, the decrease in temperature control indicated by the reference numeral 1102 in FIG. 52 is achieved. In this case, the aluminum plate 173 can be lowered from approximately 210° C. to approximately 40° C. in about 20 minutes.

The decrease in temperature control of the reference numeral 1104 in FIG. 52 is executed in the absence of steps 623–625. The aluminum plate 173 is lowered from approximately 210° C. to approximately 40° C. in 50 minutes.

Figure 55:
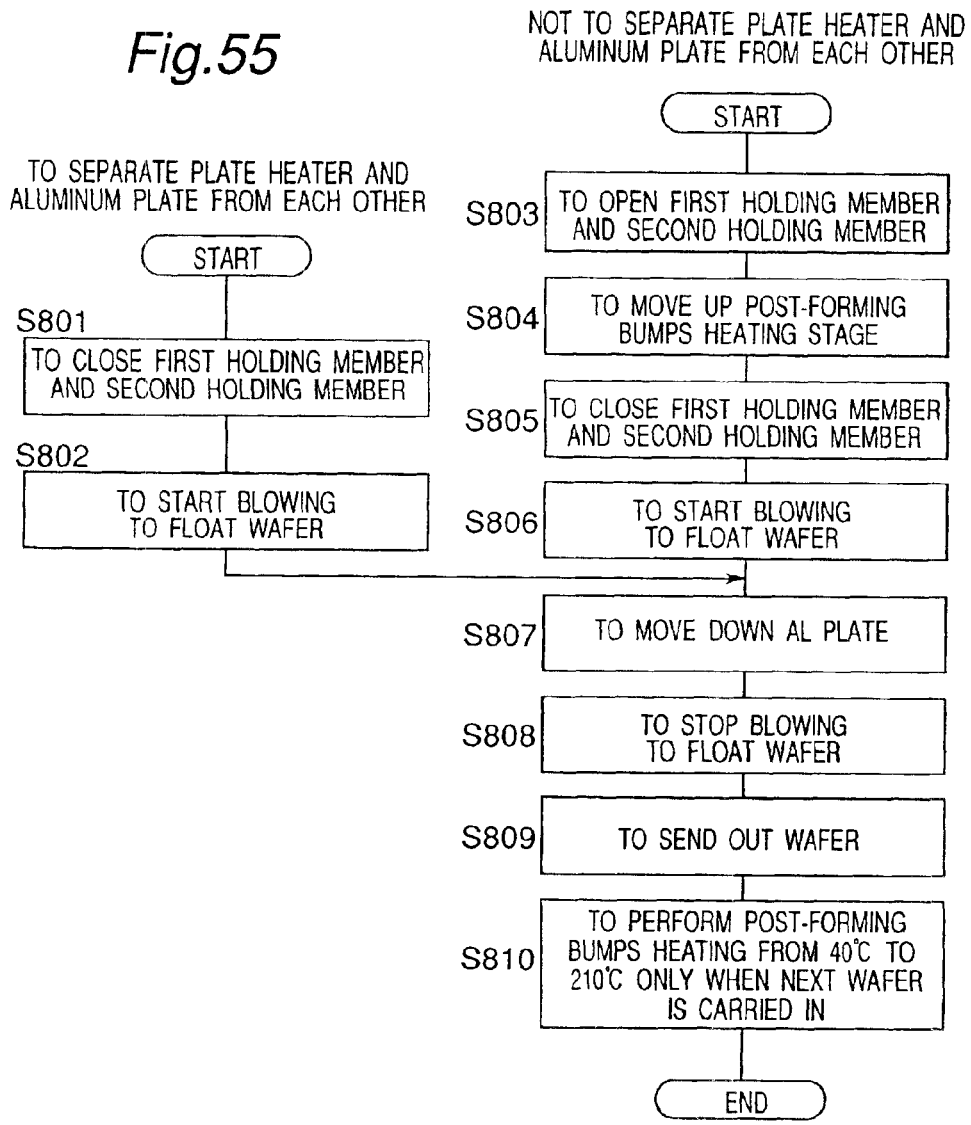
FIG. 55 is a flow chart of carrying out of a wafer with formed bumps from the post-forming bumps heating device after the post-forming bumps heating.

The step moves to step 8 after the above-discussed post-forming bumps heating, and then the following operation is carried out. The wafer with formed bumps 202 is held by the wafer holding part 1421 of the carry-out side transfer device 142 and moved to above the carry-out device 132 in the X direction by driving the moving device 1423. FIG. 56 illustrates a state after the wafer with formed bumps is moved. An operation of carrying out the wafer with formed bumps 202 to the carry-out device 132 from the post-forming bumps heating device 170 will be described below with reference to FIG. 55. The carry-out operation is also made slightly different depending on whether or not the plate heater frame 172 and the aluminum plate 173 of the post-forming bumps heating device 170 are separated. Steps 801 and 802 in FIG. 55 are carried out when the plate heater frame 172 and the aluminum plate 173 are separated, whereas steps 803–806 are carried out in the absence of the separation. Steps 807–810 are common to both cases.

In the presence of the separation, the plate heater frame 172 and the aluminum plate 173 are already separated for the cooling operation in the post-forming bumps heating as described before and the aluminum plate 173 is positioned at the up position 168. Therefore, in step 801, the first holding member 1424 and the second holding member 1425 of the wafer holding part 1421 of the carry-out side transfer device 142 are closed, so as to hold holding the cooled wafer with formed bumps 202 on the aluminum plate 173. In step 802, the blow suction device 1711 is worked to jet the air for blowing from the air holes 1707 of the aluminum plate 173, thus making the wafer with formed bumps 202 float from the aluminum plate 173. Then the step moves to step 807 to be described later.

On the other hand, when the separation is not carried out, the first holding member 1424 and the second holding member 1425 of the wafer holding part 1421 of the carry-out side transfer device 142 arranged above the post-forming bumps heating device 170 are opened in step 803. In the next step 804, the post-forming bumps heating stage of the plate heater frame 172 and the aluminum plate 173 constituted as one body is moved to the up position 168. The first holding member 1424 and the second holding member 1425 are closed in step 805 thereby holding the cooled water with formed bumps 202. In step 806, the blow suction device 1711 is activated to jet out the air for blowing from the air holes 1708 of the aluminum plate 173, whereby the wafer with formed bumps 202 floats up from the aluminum plate 173.

In step 807, only the aluminum plate 173 is lowered to the down position 167 when the separation is executed, or the post-forming bumps heating stage is lowered to the down position 167 in the absence of the separation. As a result, the wafer with formed bumps 202 held by the wafer holding part 1421 is positioned above the post-forming bumps heating device 170. In step 808, the operation of the blow suction device 1711 is stopped to stop jetting out the air for blowing. In step 809, the wafer with formed bumps is moved to above the carry-out device 132 in the X direction by driving the moving device 1423 of the carry-out side transfer device 142.

In step 810, the post-forming bumps heating device 170 raises the temperature of the aluminum plate 173 again from approximately 40° C. to approximately 210° C. when the next wafer with formed bumps 202 is to be accepted.

Figure 57:
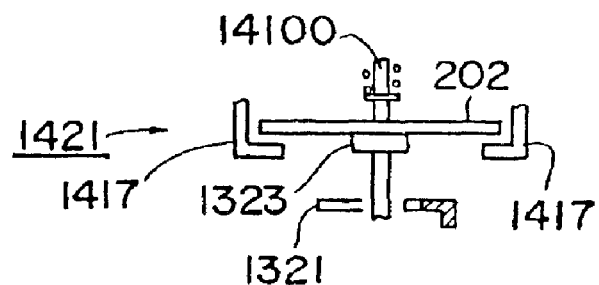
FIG. 57 is a diagram explanatory of operation in step 8 of FIG. 27 showing a state in which a holding part of the carry-out device is brought in contact with the wafer with formed bumps.

After the wafer with formed bumps is moved as described above, the driving part 1324 of the carry-out device 132 works, the holding part 1323 comes in contact with the rear face 202b of the wafer with formed bumps 202 as shown in FIG. 57, and moves up so that the wafer with formed bumps 202 is positioned approximately 1 mm up from the holding hooks 1417 of the wafer holding part 1421. When the holding part 1323 contacts the rear face 202b, the charge of the rear face 202b is grounded through the holding part 1323 and the amount of charge of the rear face 202b is reduced. The contact member 14100 for charge removal maintains contact with the front face 202a of the wafer with formed bumps 202 also when the above upward movement is performed. Therefore, similar to when the wafers 201 and 202 are transported at the carry-in device 131 and bonding stage 110, even when charge on the front face 202a is changed due to a change in the amount of charge on the rear face 202b because of the holding part 1323 coming in contact with the rear face 202b of the wafer with formed bumps 202, an amount of charge resulting from the change can be eliminated.

After the upward movement, the holding part 1323 holds the wafer with formed bumps 202 by suction.

Figure 58:
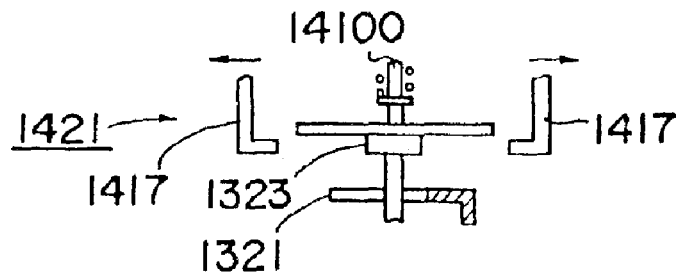
FIG. 58 is a diagram explanatory of step 8 of FIG. 27 showing a state immediately after the holding of the wafer by the carry-out side transfer device is released.

The first holding member 1424 and the second holding member 1425 of the wafer holding part 1421 are opened by the driving part 1422 as shown in FIG. 58 after the holding part 1323 holds the wafer with formed bumps 202, thereby freeing the holding of the wafer with formed bumps 202.

Figure 59:
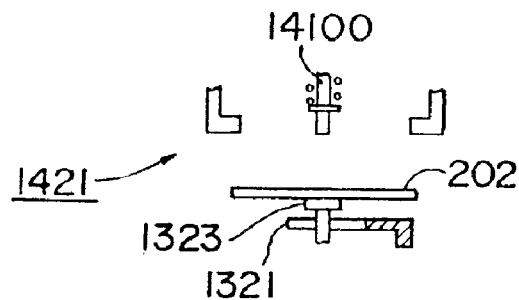
FIG. 59 is a diagram explanatory of step 8 of FIG. 27 showing a state immediately before the wafer with formed bumps held by the holding part of the carry-out device is placed on a holding stage.
Figure 60:
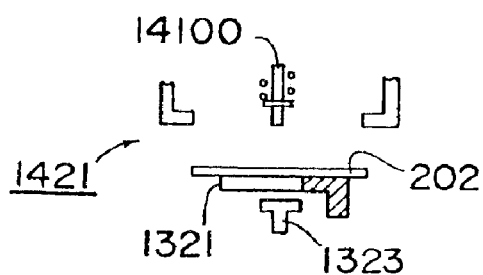
FIG. 60 is a diagram explanatory of step 8 of FIG. 27 showing a state that the wafer with formed bumps is placed on the holding stage.

After relieving the holding, the holding part 1323 descends to place the wafer with formed bumps 202 onto the holding stage 1321 as shown in FIGS. 59 and 60. The holding stage 1321 having the wafer with formed bumps loaded holds the wafer with formed bumps 202 by suction in the embodiment.

In step 9, the holding stage 1321 with the wafer with formed bumps 202 is moved in the X direction by the operation of the carry-out side transfer device 1322 to transfer the wafer with formed bumps 202 towards the second storage container 206.

In step 10, the holding stage 1321 stores the wafer with formed bumps 202 in the second storage container 206.

As described hereinabove, according to the bump forming apparatus 101 in the embodiment, the charge appearance semiconductor substrate (e.g., piezoelectric substrate wafer or the like which generates electric charge subsequent to the temperature change) is directly brought in contact with on the aluminum plates 163 and 173 constituting the preheat device 160 and post-forming bumps heating device 170 when the temperature change is brought about to the wafer in the preheating and post-forming bumps heating. Therefore, the wafer is grounded in this manner. Thus, electric charge resulting from the temperature change can be reduced to a degree where no damage is added to the circuit formed on the wafer and no crack or similar damage occurs to the wafer itself due to, for example, a decrease in uniting force to the stage, for example, without forming an aluminum film along the dicing lines of the wafer or without forming an aluminum film on the entire rear face of the wafer.

Particularly, in the case where the wafer has a thickness of 0.2 mm or smaller or when a distance between lines of the circuit formed on the wafer is smaller than 1 $\mu$m and particularly a difference in width of adjacent lines is large, a large charge removal effect can be obtained by controlling the temperature rise and the decrease in temperature in the above preheating and post-forming bumps heating.

The temperature rise rate in the preheating and the decrease in temperature rate in the post-forming bumps heating can be set for every type of wafers to which bumps are to be formed (i.e., for every material, for every size or the like of the wafers). The rates may be stored in the memory 181 of the controller 180, so that the control can be changed in accordance with the type of wafers to be processed.

According to the embodiment as described hereinabove, the temperature control is executed both for the temperature rise of the pre-forming bumps wafer 201 and for the decrease in temperature of the wafer with formed bumps 202. However, it is enough to execute at least the decrease in temperature control when the bump bonding temperature is lowered to the room temperature. There is a reason for this as follows. That is, the wafers 201 and 202 have the characteristic that it is hard to eliminate electric charge once these wafers are charged. Further the wafer 202 is stored in the second storage container 206 after being lowered from the bump bonding temperature to the room temperature. Therefore, if the wafer 202 is kept charged when stored in the second storage container, there would be a possibility that problems are caused. Accordingly electric charge of the wafer 202 should be sufficiently eliminated.

Figure 61:
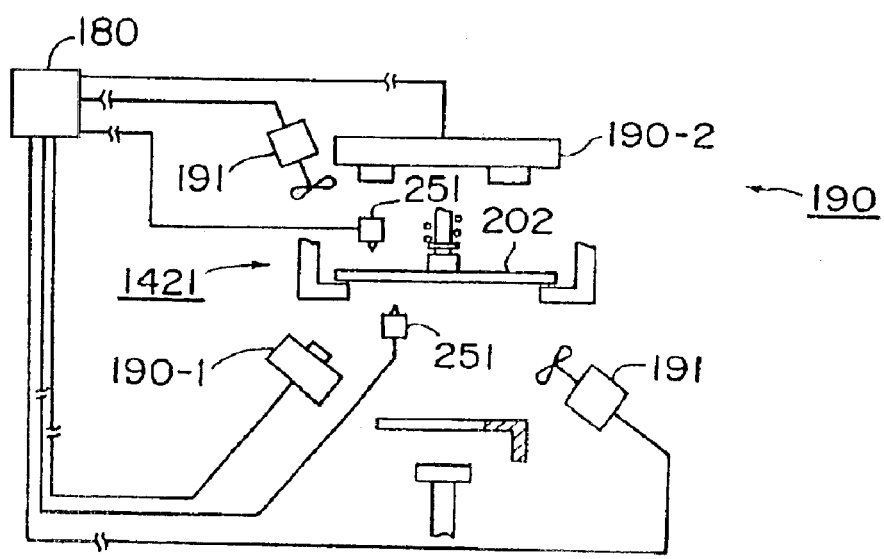
FIG. 61 is a diagram showing a state in which an ion generator applies ions to the wafer with formed bumps when the wafer is moved from the carry-out side transfer device to the carry-out device in FIG. 1.

Since the amount of charge of the wafer with formed bumps 202 should be reduced before the wafer is stored in the second storage container 206, as indicated in FIG. 61, the ion generator 190 is at least preferably at located at the side of the rear face 202b of the wafer with formed bumps 202, and more preferably at both sides of the front and rear faces of the wafer with formed bumps during a time while the wafer with formed bumps 202 is delivered from the wafer holding part 1421 of the carry-out side transfer device 142 to the carry-out device 132. Since the rear face 202b of the wafer with formed bumps 202 is negatively charged and the front face 202a is positively charged at the time of the delivery, and for neutralizing the charge, an ion generator 190-1 disposed at the side of the rear face 202b generates positive ions and an ion generator 190-2 disposed at the side of the front face 202a generates negative ions. Each of the ion generators 190-1 and 190-2 is connected to and controlled by the controller 180. In a state shown in FIG. 61, the ion generators 190-1 and 190-2 apply ions to the wafer with formed bumps 202 when the wafer holding part 1421 holding the wafer with formed bumps 202 is disposed above the carry-out device 132. More specifically, the generators apply ions to the wafer with formed bumps 202 during the above delivery (i.e., during each operation from FIG. 57 to FIG. 60).

In comparison to a case without the ion generator, the presence of the ion generator 190 can further decrease the amount of charge as will be described below, although values of the amount of charge below are examples. In the absence of the above temperature rise control and the decrease in temperature control of the embodiment, the amount of charge of the front face 202a of the wafer with formed bumps 202 is approximately +18V and the amount of charge of the rear face 202b is approximately −1000V as mentioned before when the wafer holding part 1421 is arranged above the carry-out device 132. The amount of charge of the front face 202a can be changed to approximately +22V and the amount of charge of the rear face 202b can be changed to approximately +22V by applying the ions by the ion generator 190 to both the front and the rear faces of the wafer with formed bumps 202 for four minutes. The charge of the rear face 202b can thus be reduced more by applying ions to at least the rear face 202b by the ion generator 190 in addition to the temperature rise control or the decrease in temperature control.

Furthermore, for more efficiently applying the ions generated from the ion generators 190-1 and 190-2 to at least the rear face 202b, a blower 191 may be installed as shown in FIG. 61 least at the side of the rear face 202b to more efficiently move the generated ions to the rear face 202b. The blower 191 is controlled by the controller 180.

As shown in FIG. 61, an electrostatic sensor 251 can be installed to measure the amount of charge of at least the rear face 202b, preferably both faces including the front face 202a. An amount of ions to be generated by the ion generator 190 or a volume of air of the blower 191 can be controlled by the controller 180 based on the measured amount of charge.

Ions generated by the ion generator 190 may be applied in order to more efficiently eliminate electric charge also in the post-forming bumps heating before the wafer with formed bumps 202 is delivered from the wafer holding part 1421 to the carry-out device 132.

Ions by the ion generator 190 can be applied in the preheating as well.

Although the warpage is corrected when the pre-forming bumps wafer 201 is loaded to the bonding stage 110 in the above-described embodiment, the warpage correction may be additionally carried out by working the blow suction devices 1611 and 1711 to also jet the gas when the pre-forming bumps wafer 201 is placed at the preheat device 160 and also when the wafer with formed bumps 202 is placed at the post-forming bumps heating device 170.

Figure 44:
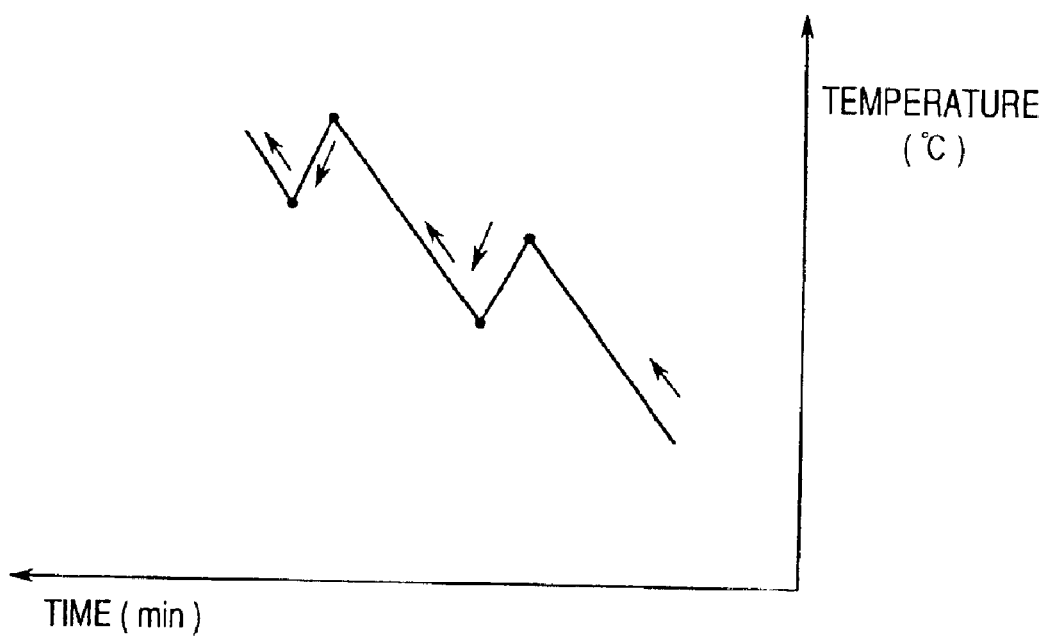
FIG. 44 is a graph of a temperature rise by the temperature rise control in preheating.
Figure 49:
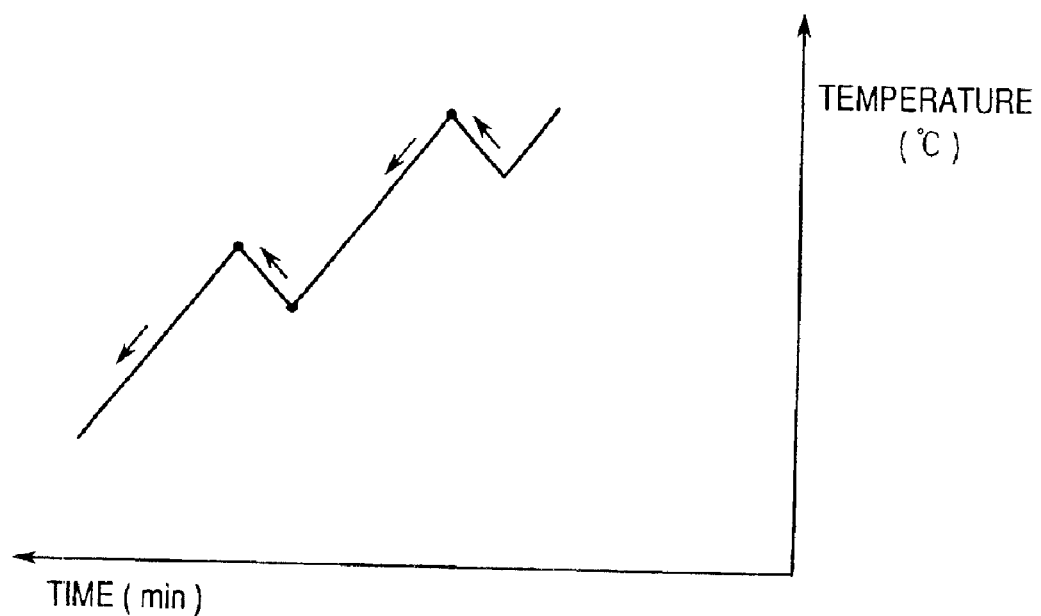
FIG. 49 is a graph of a decrease in temperature by a decrease in temperature control in post-forming bumps heating.

The pre-forming bumps wafer 201 and the wafer with formed bumps 202 are positively charged due to the temperature rise and are negatively charged due to the decrease in temperature. With utilization of this phenomenon, the temperature rise control is executed so that the pre-forming bumps wafer 201 is raised from the room temperature to the bump bonding temperature not in one stroke, but gradually by alternately repeating the temperature rise and the decrease in temperature, as shown in FIG. 44. The preheating in this manner enables neutralization of the positive charge generated by the temperature rise with the negative charge generated by the decrease in temperature. In other words, an increased amount of charge is eliminated by electric charge which is generated and an opposite polarity every time when the amount of charge is increased, and the amount of charge of the pre-forming bumps wafer 201 is maintained at the initial amount even after the pre-forming bumps wafer is raised to the bump bonding temperature. Similarly, as shown in FIG. 49, such a decrease in temperature control is enabled in the post-forming bumps heating that the wafer with formed bumps 202 is not lowered all at once from the bump bonding temperature to the room temperature, but is gradually lowered by alternately repeating the temperature rise and decrease in temperature.

The temperature rise control and the decrease in temperature control in the above zigzag fashion can be used in the preheating and post-forming bumps heating in the preheat device 160 and post-forming bumps heating device 170.

In the preheat device 160 and the post-forming bumps heating device 170 according to the embodiment, the rear faces of the pre-forming bumps wafer 201 and wafer with formed bumps 202 are nearly entirely held in contact with the aluminum plates 163 and 173. Considered only from a view point of the charge removal, it is not always necessary to keep the whole face in contact with the aluminum plate, and it is enough to hold the pre-forming bumps wafer 201 and the wafer with formed bumps 202 in looped contact with a conductive member by approximately ⅓ a radius from the outer circumference to the center.

The decrease in temperature control is carried out with the use of the post-forming bumps heating device 170, while the temperature rise control is carried out with the use of the preheat device 160 in the embodiment. Since the operations are independently carried out as described above, processes from supplying the wafer to carrying out the wafer can be more efficiently executed, while shortening the cycle time. However, if there is a time allowance in the processes or in the like case, the preheat device 160 and the post-forming bumps heating device 170 may be eliminated as in a bump forming apparatus 102 of FIG. 62, in which operations of keeping the wafer 201 at the bump bonding temperature, the decrease in temperature control in the post-forming bumps heating and the temperature rise control in the preheating can be executed by the bonding stage 110 under the control of the controller 180.

In such arrangement as described above, either one of the carry-in side transfer device 141 and the carry-out side transfer device 142 is enough. Consequently, the bump forming apparatus is made compact in synergy with the elimination of the preheat device 160 and the post-forming bumps heating device 170.

Figure 63:
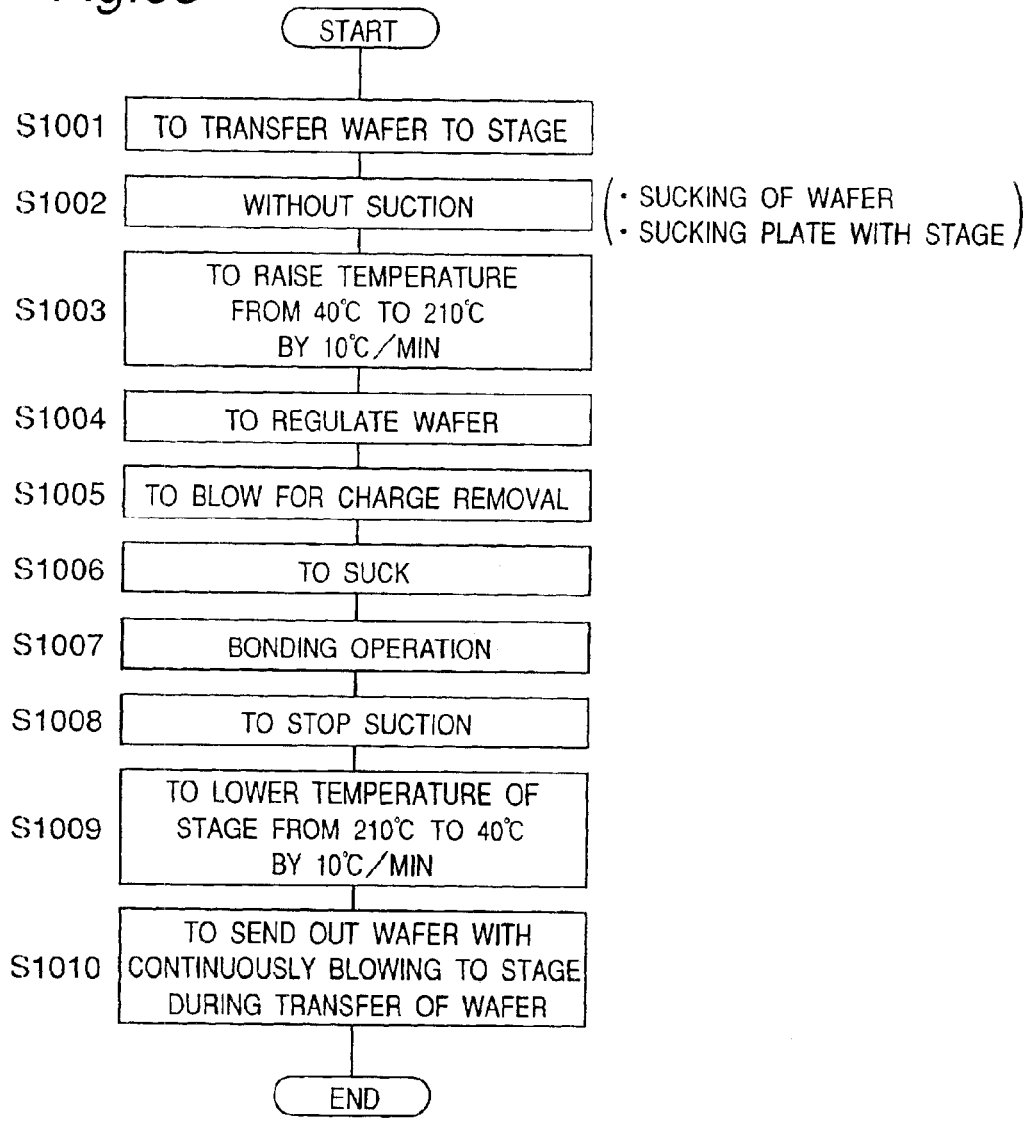
FIG. 63 is a flow chart explanatory of a blowing operation for charge removal which is carried out by the bump forming apparatus of FIG. 62.

FIG. 63 shows operations of the preheating, the bump-bonding and the post-forming bumps heating in the structure of the bump forming apparatus 102, that is, with the preheat device 160 and the post-forming bumps heating device 170 being eliminated while the charge appearance semiconductor substrate such as the pre-forming bumps wafer 201 or the like is placed on the wafer laying stage 111 of the bonding stage 110. In step 1001 in FIG. 63, for example, a transfer device 143 such as the above carry-in side transfer device 141 is used to load the pre-forming bumps wafer 201 as the charge appearance semiconductor substrate from the carry unit 130 onto the wafer laying stage 111 of the bonding stage 110. The wafer laying stage 111 at this time is approximately 40° C. In step 1002, the suction device 114 of the bonding stage 110 is worked to suck a loaded sub plate 195 to be described later onto the wafer laying stage 111 in the case where the sub plate is employed. On the other hand, when the pre-forming bumps wafer 201 is to be directly placed onto the wafer laying stage 111, the suction is not carried out. The reason for this is as follows. In the next step 1003, the pre-forming bumps wafer 201 is raised from approximately 40° C. to approximately 210° C., and the deformation such as warpage or the like is caused by the above temperature change. Therefore, if the suction operation limits the deformation of the wafer, there is a possibility that the pre-forming bumps wafer 201 is damaged. Thus, the suction operation is not performed for avoiding the damage.

In step 1003, the temperature of the pre-forming bumps wafer 201 is raised at the temperature rise rate of, e.g., 10° C./min. Since the pre-forming bumps wafer 201 is in direct contact with the wafer laying stage 111, electric charge generated on to the pre-forming bumps wafer 201 by the temperature change at the temperature rise time can be efficiently removed through the wafer laying stage 111. Therefore, the temperature rise rate can be set variously as discussed before.

In step 1004, movement of the pre-forming bumps wafer 201 on the wafer laying stage 111 is limited, for example, by the holding hooks 1417 of the wafer holding part 1411 of the carry-in side transfer device 141. In next step 1005, the blower 115 is operated to blow the hot air from the air holes 113 of the wafer laying stage 111 to the pre-forming bumps wafer 201, thereby carrying out the charge removal by discharging electric charge of the pre-forming bumps wafer 201 into the air. Then, in step 1006, the suction device 114 is operated to suck the pre-forming bumps wafer 201 onto the wafer laying stage 111. After steps 1005 and 1006 are carried out, these steps are carried out again in the embodiment. In other words, the blowing operation for charge removal is conducted twice. The number of times the blowing operation for charge removal is performed, and the time period of the blowing can be set in accordance with the amount of charge of the pre-forming bumps wafer 201. For example, the blowing may be carried out once for only a set time when the amount of charge is approximately −50V or smaller, or carried out once under conditions of continuous blowing when the amount of charge is approximately −800V. When the amount of charge is approximately −1000V, the blowing can be carried out for a plurality of times under conditions of continuous blowing as above.

In step 1007, bump bonding is executed upon the pre-forming bumps wafer 201. In step 1008, the suction device 114 is stopped to stop the suction. The reason for stopping the suction at this time point is the same as when the suction is not conducted in step 1002 (i.e., to avoid damage by not limiting the deformation of the wafer with formed bumps 202 because of the temperature change).

In the next step 1009, the temperature of the wafer laying stage 111 is lowered from approximately 210° C. to approximately 40° C., for example, at the decrease in temperature rate of 10° C./min. The wafer with formed bumps 202 is held in direct contact with the wafer laying stage 111, so that charge generated on the wafer with formed bumps 202 as a result of the temperature change at the decrease in temperature can be efficiently removed by the wafer laying stage 111. Therefore, the decrease in temperature rate can be set variously as described earlier. In step 1010, the wafer with formed bumps 202 is subjected to blowing to float from the wafer laying stage 111. The wafer with formed bumps 202 is moved from the wafer laying stage 111 to the carry-out device 132 by the transfer device.

The above-described blowing operation for charge removal may be performed in the preheating operation and the post-forming bumps heating operation in the bump forming apparatus 101 equipped with the preheat device 160 and post-forming bumps heating device 170 by operating the blow suction devices 1611 and 1711 and jetting the gas.

Figure 64:
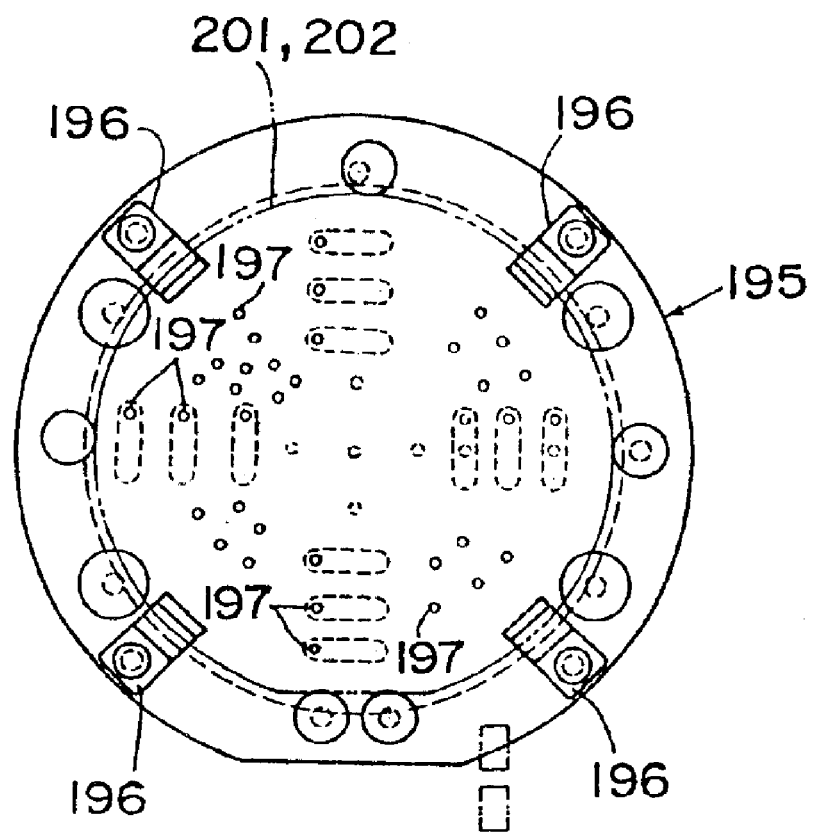
FIG. 64 is a plan view of a sub plate attached to the wafer before forming bumps.

Although a protecting member (sub plate) for protecting a wafer from breaking is not attached to the rear face 201b of the pre-forming bumps wafer 201 in the above description, the sub plate 195, such as that shown in FIG. 64, may be attached to the rear face 201b. The sub plate 195 is formed of, for instance, a metallic material such as aluminum or the like. The rear face 201b of the pre-forming bumps wafer 201 is brought into contact with the sub plate 195, and the pre-forming bumps wafer is held to the sub plate 195 by leaf springs 196 fitted to the sub plate 195.

The wafers 201 and 202 are prevented from breaking due to the presence of the sub plate 195. Moreover, since the rear face 201b is always kept in contact with the sub plate 195 and made conductive to the front face 201a via the leaf springs 196, a difference in the amount of charge between the front and rear faces can be lessened and an occurrence of damage to the circuit formed on the pre-forming bumps wafer 201 caused by charge can be reduced.

The sub plate 195 has a plurality of through holes 197 penetrating therethrough in a thickness direction, so that heat from plate heaters 161 and 171 effectively act on the wafers 201 and 202 during the preheating operation and the post-forming bumps heating operation. Moreover, ions generated by the ion generator 190 effectively act on the rear faces 201b and 202b of the wafers 201 and 202.

The charge removal operation executed upon the charge appearance semiconductor substrate by the bump forming apparatus 101 and the bump forming apparatus 102 described above can form the charge appearance semiconductor substrate with the charge being reduced to about ±200V on an average. When the ion generator 190 is used in addition, the charge appearance semiconductor substrate having the charge reduced to approximately ±20–30V as mentioned above can be obtained. The pyroelectric breakdown of the circuit formed on the charge appearance semiconductor substrate, damage such as breakage of the charge appearance semiconductor substrate itself, etc. caused by the electric charge can be prevented accordingly.

Charges of the charge appearance semiconductor substrate are removed or reduced in the bump forming apparatus 101 of the embodiment by arranging the substrate so as to be in contact with the preheat device 160 and the post-forming bumps heating device 170. However, an arrangement such as a modified example to be described below is also available, in which charge is removed or reduced without bringing the charge appearance semiconductor substrate into contact with the preheat device and the post-forming bumps heating device.

Figure 71:
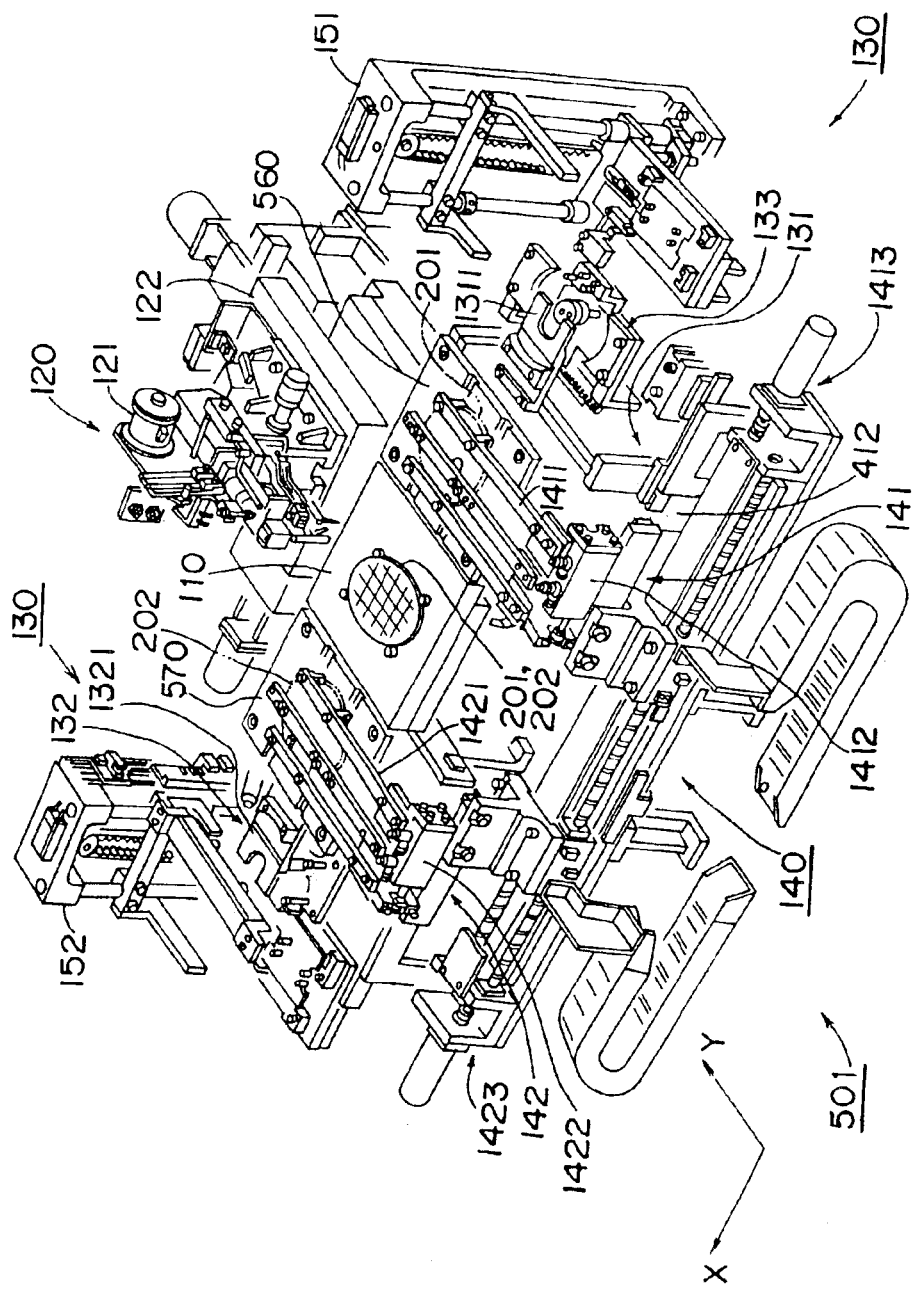
FIG. 71 is a perspective view showing in detail a structure of essential parts of a bump forming apparatus as a modified example of the bump forming apparatus of FIG. 1.

FIG. 71 is a diagram corresponding to FIG. 2, indicating a bump forming apparatus 501 as the aforementioned modified example. A primary difference between the bump forming apparatus 501 and the earlier-described bump forming apparatus 101 is found in a preheat device 560, a post-forming bumps heating device 570, and the operation for removing or reducing electric charge. The preheat device 560 corresponds to the earlier preheat device 160, and the post-forming bumps heating device 570 corresponds to the post-forming bumps heating device 170. The same parts are designated by the same reference numerals in the bump forming apparatus 501 as in the bump forming apparatus 101, the description of which will be omitted. Only different points in the structure of the preheat device 560 and post-forming bumps heating device 570 from the preheat device 160 and post-forming bumps heating device 170 and the charge removal and reduction operation will be discussed in the following description.

Figure 72:
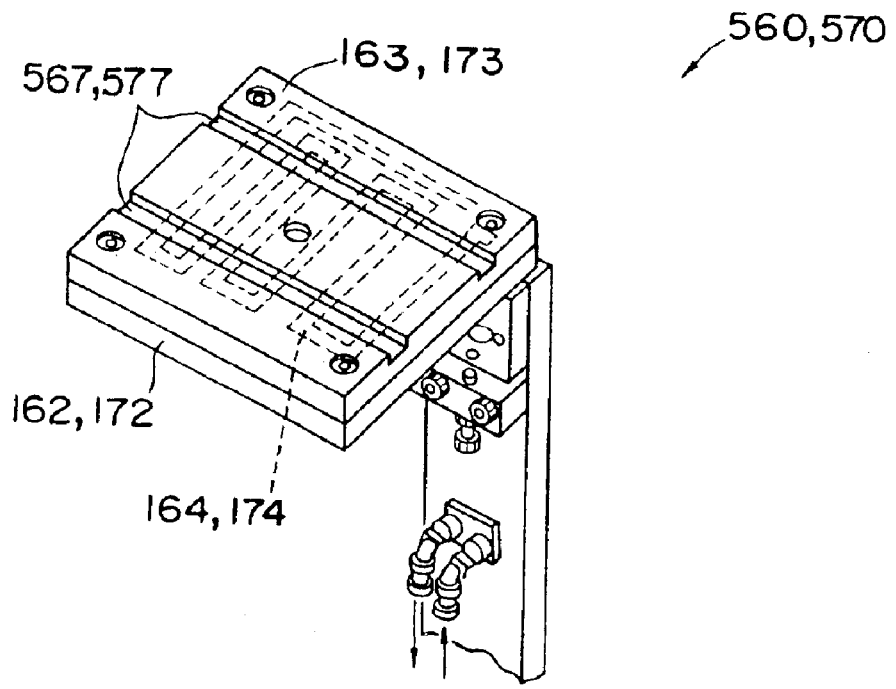
FIG. 72 is a perspective view showing in detail the constitution of a preheat device and a post-forming bumps heating device in FIG. 71.
Figure 73:
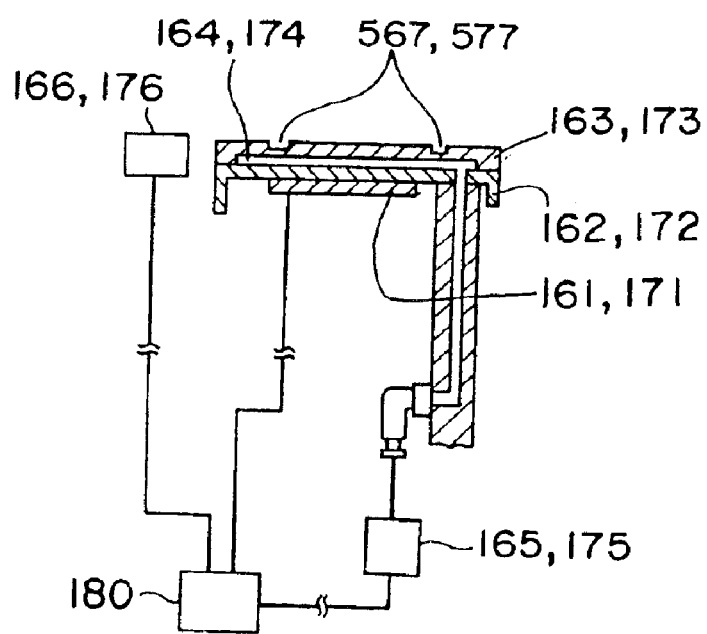
FIG. 73 is a sectional view showing the constitution of the preheat device and post-forming bumps heating device of FIG. 71.

Referring to FIGS. 72 and 73, the preheat device 560 is an apparatus for raising the pre-forming bumps wafer 201 caught by the wafer holding part 1411 from the carry-in device 131 from the room temperature to the vicinity of approximately 210° C. which is the bump bonding temperature when bumps are formed at the bonding stage 110 in a state with the pre-forming bumps wafer 201 kept out of contact with the preheat device 560 and held by the wafer holding part. The preheat device has a structure in which the aluminum plate 163 as the heat diffuser member is mounted on the plate heater frame 162 having the plate heater 161 as a heat source. The bump bonding temperature (namely, approximately 210° C) can be changed in a range from approximately 150° C. to approximately 210° C. in accordance with the material or the like of the pre-forming bumps wafer 201.

The plate heater 161 is controlled by the controller 180 to raise the temperature with reference to temperature information from the temperature sensor 166, such as a thermocouple or the like, which measures a temperature of the aluminum plate 163. This operation of raising the temperature is one of the characteristic operations of the bump forming apparatus 501 and will be detailed later. In order to be able to execute the characteristic raising temperature operation, a path 164 for cooling material is formed in a serpentine to the aluminum plate 163. In the embodiment, air at the room temperature is used as the cooling material and supplied to the path 164 by the air supply device 165 controlled by the controller 180. Although water may be used as the cooling material, the temperature rise or decrease in temperature becomes hard to control because the water has a low response for the temperature rise or decrease. The air is more preferable to the water.

The pre-forming bumps wafer 201 is arranged above the aluminum plate 163 while held by the wafer holding part 1411 via a gap of approximately 1mm from the aluminum plate 163 of the preheat device 560. Grooves 567 are formed on a face of the aluminum plate 163 opposite to the wafer along an advance direction of the wafer holding part 1411 so as to avoid interference with the holding hooks 1417 of the wafer holding part 1411.

The post-forming bumps heating device 570 is an apparatus for decreasing the temperature of the wafer with formed bumps 202 held by the wafer holding part 1421 from the bonding stage 110 after bumps are formed to a temperature near the room temperature from the vicinity of approximately 210° C. as the bump bonding temperature while the wafer with formed bumps is kept in a noncontact state with respect to the post-forming bumps heating device 570 while held by the wafer holding part. The post-forming bumps heating device is similar to the above preheat device 560 in terms of structure. That is, the post-forming bumps heating device 570 includes the plate heater 171, the plate heater frame 172, the aluminum plate 173, the path 174 for cooling material, the air supply device 175, the temperature sensor 176 and grooves 577. FIGS. 72 and 73 show reference numerals in both the preheat device 560 and the post-forming bumps heating device 570. The plate heater 171 is controlled by the controller 180 to control the decrease in temperature of the wafer with formed bumps 202. The operation of controlling the decrease in temperature is one of the features of the bump forming apparatus 501 and will be described in detail later.

Front faces of the aluminum plates 163, 173 opposite to the pre-forming bumps wafer 201, wafer with formed bumps 202 in the preheat device 560, and post-forming bumps heating device 570 are preferably treated by an insulating far infrared radiation coating. A heat dissipation efficiency for the pre-forming bumps wafer 201 and the wafer with formed bumps 202 can be improved by the coating.

Among operations in the bump forming apparatus 501 with the above-constituted preheat device 560 and post-forming bumps heating device 570, the charge removal and reduction operation upon the charge appearance semiconductor substrate without bringing the charge appearance semiconductor substrate into contact with the preheat device 560 and the post-forming bumps heating device 570 will now be described below. Similar to the earlier-described bump forming apparatus 101, each part of the bump forming apparatus 501 is controlled in operation by the controller 180, whereby a sequence of operations from forming bumps to the pre-forming bumps wafer 201 to storing the wafer with formed bumps 202 into the second storage container 206 is carried out. The controller 180 also controls the blowing operation for warpage correction performed on the pre-forming bumps wafer 201 and carried out by the bonding stage 110.

In the following description, the contact members for charge removal attached to the wafer holding parts 1411 and 1421 are exemplified by the contact member 14100 shown in FIG. 13 which is applicable to any wafer and substrate such as the above charge appearance semiconductor substrate developing the warpage, etc. Contact members 14107, 14113, 14116, 14120, 14121 or 14122 may be used in place of the contact member 14100.

Figure 74:
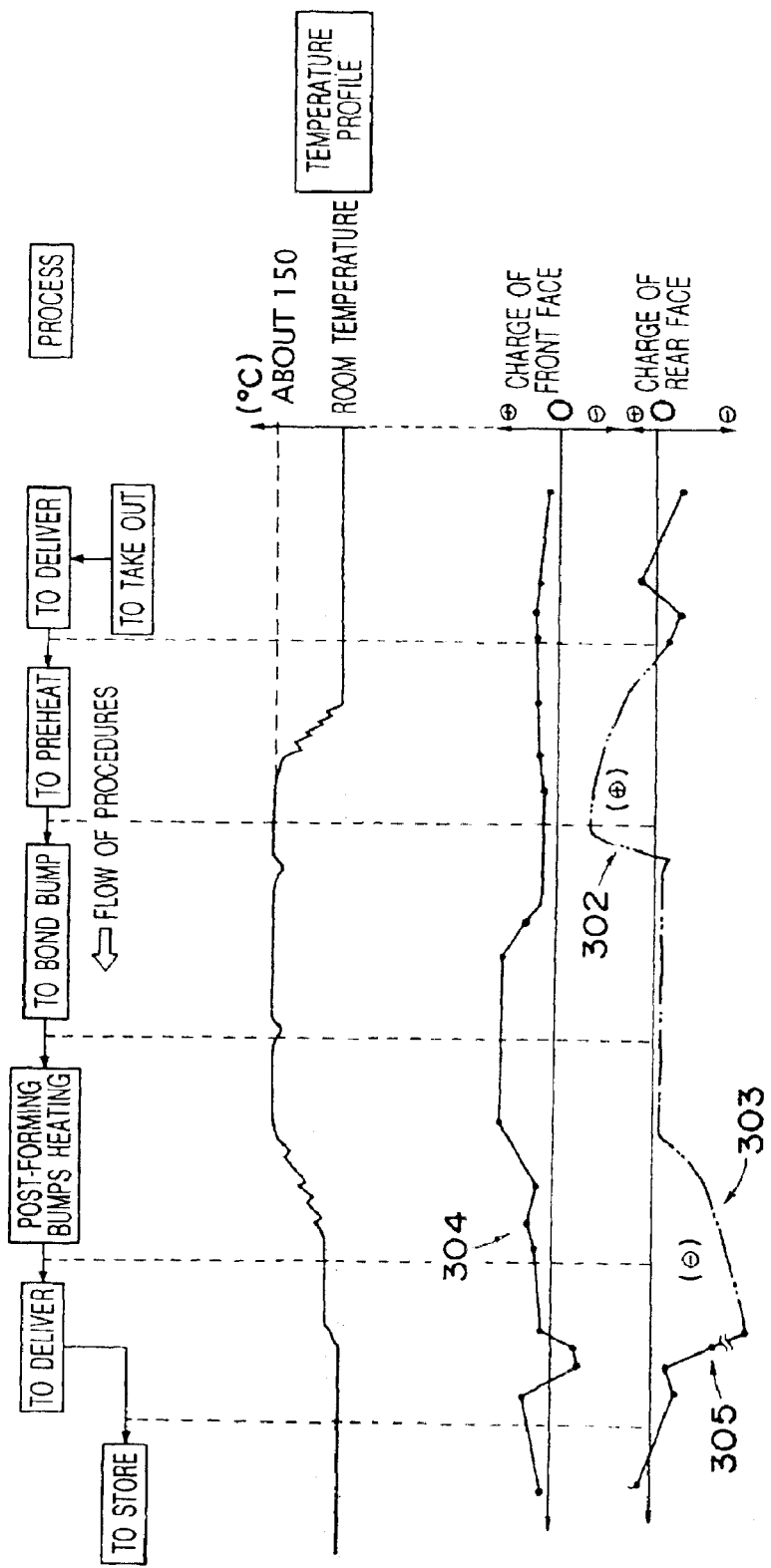
FIG. 74 is a graph of a relationship of a flow of operations in the bump forming apparatus in FIG. 71, a temperature change of the wafer and an amount of charge of the wafer.

The pre-forming bumps wafer 201 and the wafer with formed bumps 202 generate positive charge in accordance with the temperature rise and generate negative charge in accordance with the decrease in temperature. With this phenomenon utilized in the preheating, the pre-forming bumps wafer 201 is not raised from the room temperature to the bump bonding temperature in one stroke, but the temperature rise control is executed by repeatedly carrying out the temperature rise and the decrease in temperature, for example, as shown in FIG. 74, and then the pre-forming bumps wafer 201 is raised to the bump bonding temperature. When the preheating is carried out as described above, positive charge generated through the temperature rise can be neutralized by negative charge generated by the decrease in temperature. In other words, a fundamental concept of the preheating in this example is that an increased amount of charge is eliminated by charge which is generated and an opposite polarity every time the amount of charge is increased, and the amount of charge of the pre-forming bumps wafer is maintained at the initial amount even after the pre-forming bumps wafer is raised to the bump bonding temperature. The preheating operation in the example will be more fully described below.

Figure 75:
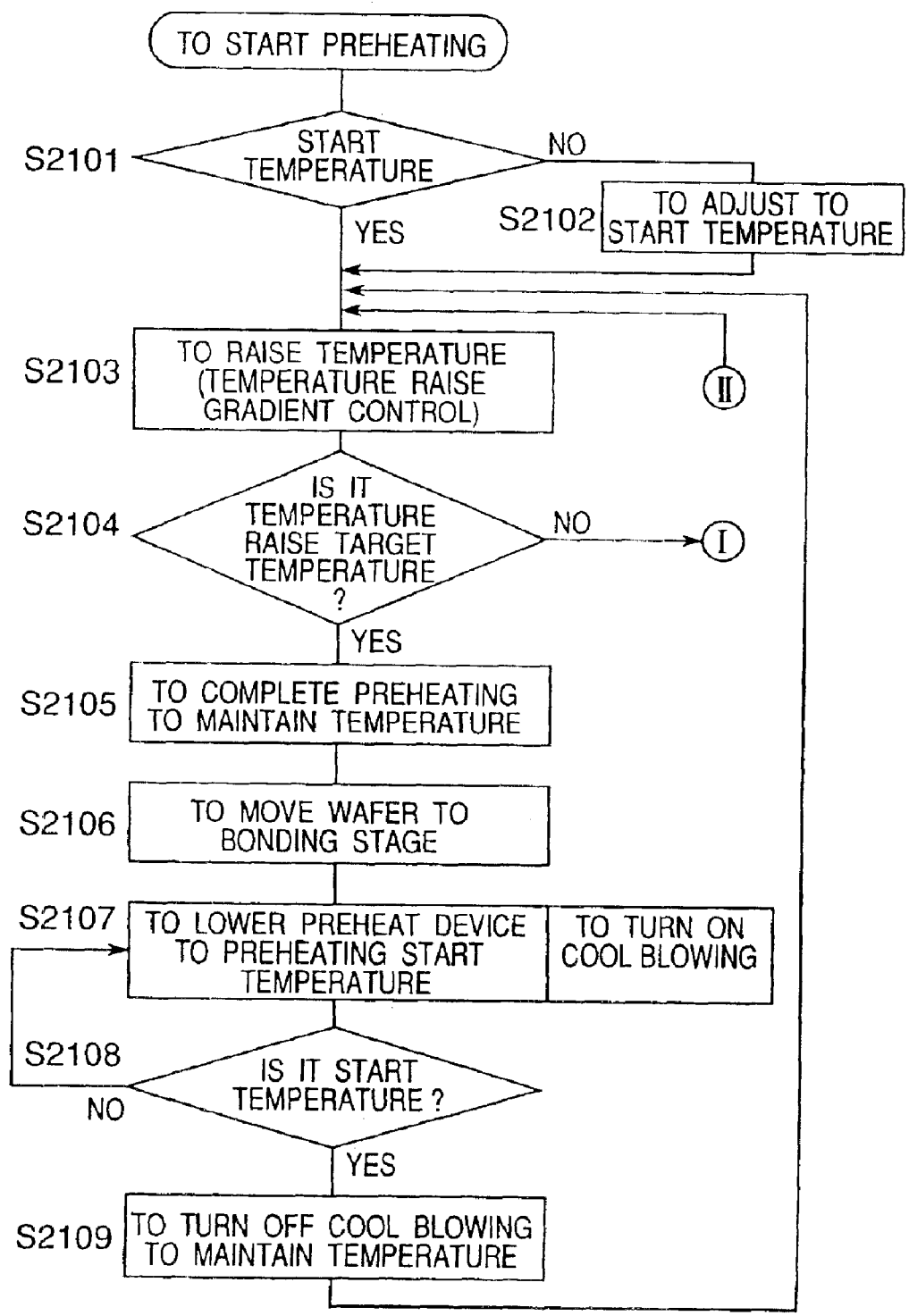
FIG. 75 is a flow chart of the preheating in FIG. 27.

FIG. 75 shows a flow of the entire preheating operation controlled by the controller 180. More specifically, in step 2101, whether the aluminum plate 163 of the preheat device 560 is at a start temperature or not is determined. Unless the aluminum plate is at the start temperature, the aluminum plate is heated by the plate heater 161 or cooled by supplying the air by the air supply device 165, thereby adjusting the temperature to the start temperature in step 2102. The start temperature in the example is 40° C. and the temperature of the aluminum plate 163 is measured by the temperature sensor 166.

Figure 76:
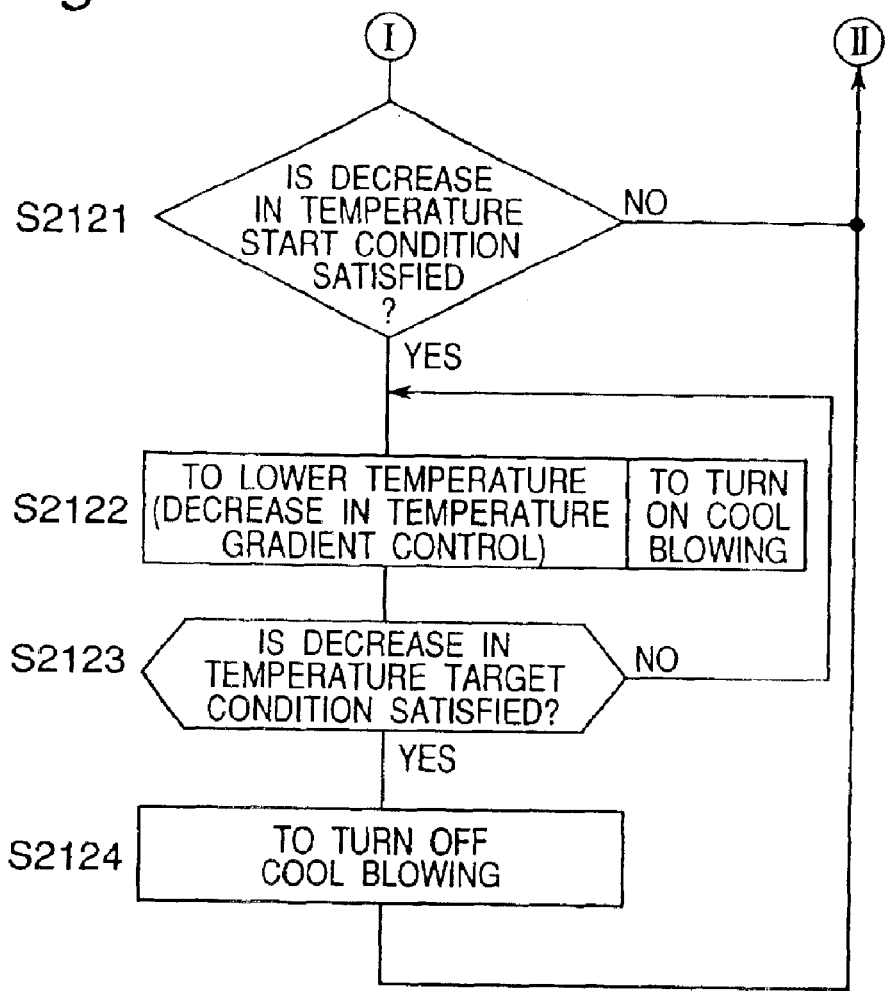
FIG. 76 is a flow chart of a temperature rise control shown in FIG. 75.

In step 2103, a temperature rise gradient is controlled and the aluminum plate 163 (i.e., pre-forming bumps wafer 201) is started to be raised in temperature. In step 2104, it is determined whether or not the aluminum plate 163 has reached a temperature rise target temperature. Since the bump bonding temperature for the pre-forming bumps wafer 201 is approximately 210° C., the temperature rise target temperature of the aluminum plate 163 is approximately 200° C. in the example. When the aluminum plate 163 has not reached the temperature rise target temperature, steps 2121–2124 of FIG. 76 are carried out. As described before, since the bump bonding temperature is variable depending on the material or the like of the pre-forming bumps wafer 201, the temperature rise target temperature can also be changed to conform to the bump bonding temperature.

Through the temperature rise control operation executed in steps 2103, 2104 and 2121–2124, the temperature rise operation is carried out to the bump bonding temperature by alternately repeating the temperature rise and the decrease in temperature which is one of the characteristic operations in the example. The operation for raising the temperature will be further detailed below.

When the aluminum plate is determined to have reached the temperature rise target temperature in step 2104, the operation moves to step 2105, when the preheating operation is completed. The pre-forming bumps wafer 201 is transferred to the bonding stage 110 in step 2106. After the transfer, in step 2107, the air supply by the air supply device 165 is started so as to lower the aluminum plate 163 to the start temperature. In step 2108, it is determined whether or not the aluminum plate is decreased to the start temperature. When the aluminum plate is decreased to the start temperature, the air supply by the air supply device 165 is stopped in step 2109, so that the start temperature is maintained. The operation returns to step 2103 in preparation for the preheating operation of the next pre-forming bumps wafer 201.

The temperature rise control in the above steps 2103, 2104 and 2121–2124 will be depicted.

The temperature of the aluminum plate 163 is raised in accordance with a preliminarily set temperature rise gradient in step 2103. The temperature rise gradient is set to 20° C./min in the example. When the aluminum plate 163 has not reached the temperature rise target temperature in step 2104, the operation moves to step 2121, where it is determined whether a decrease in temperature start condition is satisfied or not. In this case, the temperature of the aluminum plate 163, the period of time after the temperature rise starts, the amount of charge of the rear face 201*b* of the pre-forming bumps wafer 201, or the like can be adopted as a physical quantity to be the decrease in temperature start condition. This example uses the temperature of the aluminum plate 163 as the physical quantity.

Figure 78:
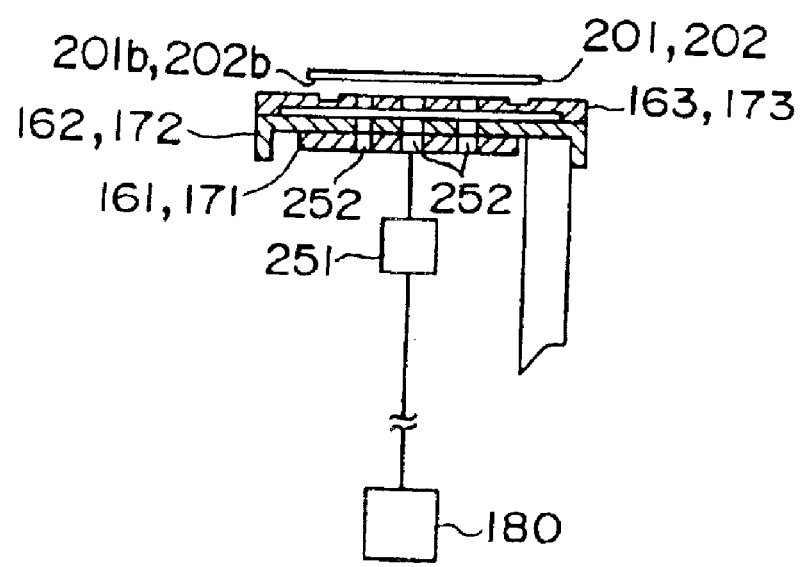
FIG. 78 is a diagram showing a structure for measuring the amount of charge of the wafer in the preheating and post-forming bumps heating by an electrostatic sensor.

In the case where the amount of charge of the rear face 201*b* is to be used as the physical quantity, as indicated in FIG. 78, a plurality of through holes 252 are formed penetrating each of the plate heater 161, the plate heater frame 162 and the aluminum plate 163, and an electrostatic sensor 251 is arranged below the plate heater 161. The amount of charge of the rear face 201*b* is measured by the electrostatic sensor 251 through the through holes 252. The measured value is sent to the controller 180 which in turn obtains the amount of charge. When the amount of charge of the rear face 201*b* is to be measured by the electrostatic sensor 251, or when charge is to be removed with the use of the ion generator 190 as will be described later, inner faces and peripheries of the through holes 252 and surfaces of the plate heater 161, the plate heater frame 162 and the aluminum plate 163 are preferably coated with an insulating material so as to prevent electrostatic ions from being attracted to the conductor thereby hindering correct measurement of the amount of charge or obstructing the charge removal.

Figure 77:
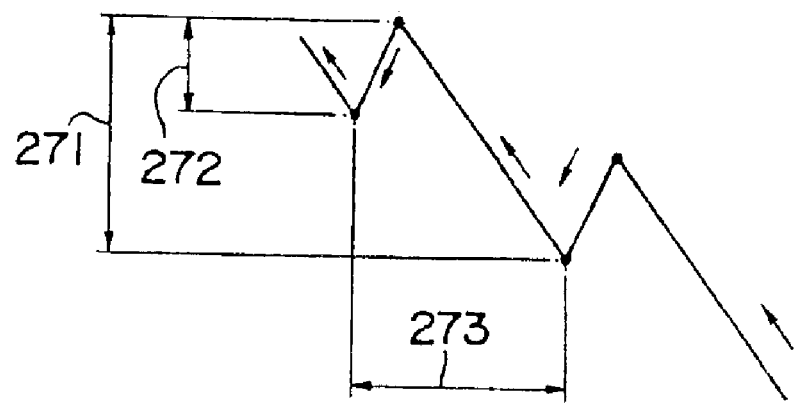
FIG. 77 is a graph of a temperature rise in the temperature rise control of FIG. 76.

When the temperature of the aluminum plate 163 is selected as the physical quantity of the decrease in temperature start condition as in the present example, in step 2121, a temperature width designated by a reference numeral 271 in FIG. 77 is obtained based on a temperatures of the aluminum plate 163 at a start of the temperature rise and at present, and it is determined whether or not the temperature width 271 is a predetermined value. The operation moves to step 2122 when the temperature width has reached the predetermined value, whereas the operation goes back to step 2103 when the temperature width has not reached the predetermined value.

The temperature width 271 is set to 30° C. in the example. When the "time" is selected as the physical quantity of the decrease in temperature start condition, a reference numeral 273 seems more appropriate corresponding to the time. However, the reference numeral 271 can also correspond to the "time". A time from the temperature rise start to the decrease in temperature start can be set to, example, two minutes. When the "amount of charge" is selected, the reference numeral 271 corresponds to a difference in amount of charge which can be set at, for example, 300V±10%.

In step 2122, the air supply by the air supply device 165 to the path 164 is started to start lowering the temperature of the aluminum plate 163. A decrease in temperature gradient in this step is set beforehand, which is set to be −30° C./min in this example.

In step 2123, it is determined whether or not a decrease in temperature target condition is satisfied. The above-mentioned "time", "amount of charge" or the like besides the "temperature" in the example is used as the physical quantity of the decrease in temperature target condition. According to the example, in step 2123, a temperature width denoted by a reference numeral 272 in FIG. 77 is obtained based on each of the temperatures of the aluminum plate 163 at the start of the decrease in temperature and at the present, and whether or not the temperature width 272 has reached a predetermined value is determined. When the temperature width has reached the predetermined value, the operation goes to succeeding step 2124. The step returns to step 2122 when the temperature width operation not reached the predetermined value. The temperature width 272 is a value smaller than the temperature width 271 and approximately ½–⅓ the temperature width 271. The temperature width 272 is set to be 15° C. in the example. When the "time" is selected as the physical quantity of the decrease in temperature target condition, the reference numeral 272 corresponds to the time, and can be set to one minute, for example. When the "amount of charge" is selected as the physical quantity, the reference numeral 272 corresponds to a difference in the amount of charge and can be set to, for example, 100V±10%.

In step 2124, the air supply by the air supply device 165 to the path 164 for cooling material is stopped, thereby stopping the decrease in the temperature of the aluminum plate 163. The step returns to step 2103 after completion of the operation in step 2124.

The temperature of the aluminum plate 163, namely, pre-forming bumps wafer 201 is thus raised to the bump bonding temperature while the temperature rise and the decrease in temperature are alternately repeated through the temperature rise control operation in steps 2103, 2104 and 2121–2124. Since positive charge is increased through the temperature rise while negative charge is generated by the decrease in temperature, the charge primarily of the rear face 201b of the pre-forming bumps wafer 201 is neutralized by repeating the temperature rise and the decrease in temperature alternately as described above. Since the decrease in temperature width is smaller than the temperature rise width as described above, actually, positive charge is accumulated on the rear face 201b of the pre-forming bumps wafer 201 in the preheating operation as is clear from FIG. 74. However, the amount of accumulated charge can be greatly reduced in comparison with the case where the temperature is uniformly raised without alternately repeating the temperature rise and decrease in temperature. In one example, the amount of charge exceeds +2000V up to approximately +3000V when the temperature is raised uniformly, whereas the amount of charge can be suppressed to approximately +100V by alternately repeating the temperature rise and decrease in temperature.

After the above-described preheating operation, step 5 described in conjunction with the bump forming apparatus 101 is started. In step 5, the carry-in side transfer device 141 is moved by the transfer device 1413 from the preheat device 560 to the bonding stage 110. The pre-forming bumps wafer 201 held by the wafer holding part 1411 is placed on the bonding stage 110. When the rear face 201b of the pre-forming bumps wafer 201 comes in contact with the wafer laying stage 111 of a metallic material of the bonding stage 110, part of the charge accumulated on the rear face 201b is grounded to the wafer laying stage 111, and also part of the charge accumulated on the rear face 201b moves towards the front face 201a in some cases. According to the example, however, since the temperature rise control is carried out in the preheating operation, the amount of charge of the front face 201a and the rear face 201b(particularly of the rear face 201b ) is reduced as compared with the conventional example without the temperature rise control. Moreover, the contact member 14100 for charge removal is held in contact with the front face 201a. Therefore, sparking at the front face 201a can be prevented. The amount of charge of the rear face 201b is reduced as represented by a reference numeral 302 in FIG. 74 through the grounding to the wafer laying stage 111 and due to an increase of negative charge subsequent to a slight decrease in temperature of the pre-forming bumps wafer 201 when separated from the preheat device 560.

Figure 88:
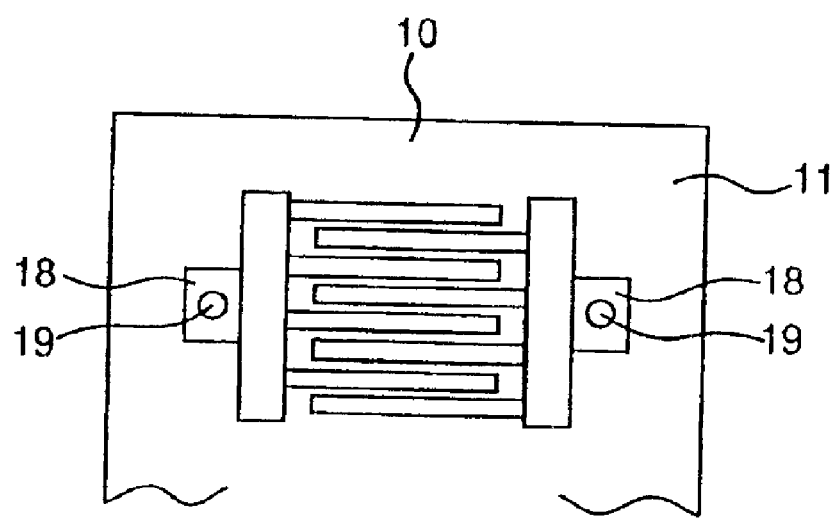
FIG. 88 is a plan view of a state in which bumps are formed to circuit electrode parts.

The pre-forming bumps wafer 201 is, after being loaded on the bonding stage 110, heated by the heater 112 installed on the bonding stage 110 and controlled by the controller 180 so as to reach the bump bonding temperature. Bumps 19 are formed, while carrying out the heating, by the bump forming head 120 to, for example, electrode parts 18 of the circuit on the pre-forming bumps wafer 201 as shown in FIG. 88.

After the bumps are formed, the wafer with formed bumps 202 is moved from the bonding stage 110. In other words, the wafer with formed bumps is positioned above the bonding stage 110. The first holding member 1424 and the second holding member 1425 are opened by the driving part 1422 and the wafer laying stage 111 of the bonding stage 110 is moved up. Due to of the upward movement, the contact member 14100 of the member 1426 for charge removal first comes in contact with the front face 202a of the wafer with formed bumps 202. Then, after the first holding member 1424 and the second holding member 1425 are closed by the driving part 1422, the wafer laying stage 111 of the bonding stage 110 is moved down, whereby the wafer with formed bumps 202 is held to the wafer holding part 1421 of the carry-out side transfer device 142.

The wafer with formed bumps 202 held by the wafer holding part 1421 is positioned above the post-forming bumps heating device 570 as shown in FIG. 71 on the basis that the wafer holding part 1421 is moved in the X direction by the driving of the moving device 1423 of the carry-out side transfer device 142.

In step 7 in FIG. 27, the post-forming bumps heating device 570 controls the decrease in temperature of the wafer 202 by heating the wafer, thereby carrying out the post-forming bumps heating operation upon the wafer with formed bumps 202 from the bump bonding temperature of approximately 210° C. to a temperature exceeding the room temperature by approximately 10° C.

Similar to the earlier-described preheating operation, electric charge is generated on the wafer with formed bumps 202 as a result of the temperature change during the decrease in temperature operation. The front face 202a and the rear face 202b of the wafer are charged as indicated by reference numerals 303 and 304 in FIG. 74.

Under the circumstances, in the post-forming bumps heating operation as well as in the preheating operation, the decrease in temperature is controlled by alternately repeating the decrease in temperature and the temperature rise, thereby suppressing the amount of charge of particularly the rear face 202b. Meanwhile, the charge of the front face 202a is grounded because the contact member 14100 is held in contact with the front face 202a.

Figure 79:
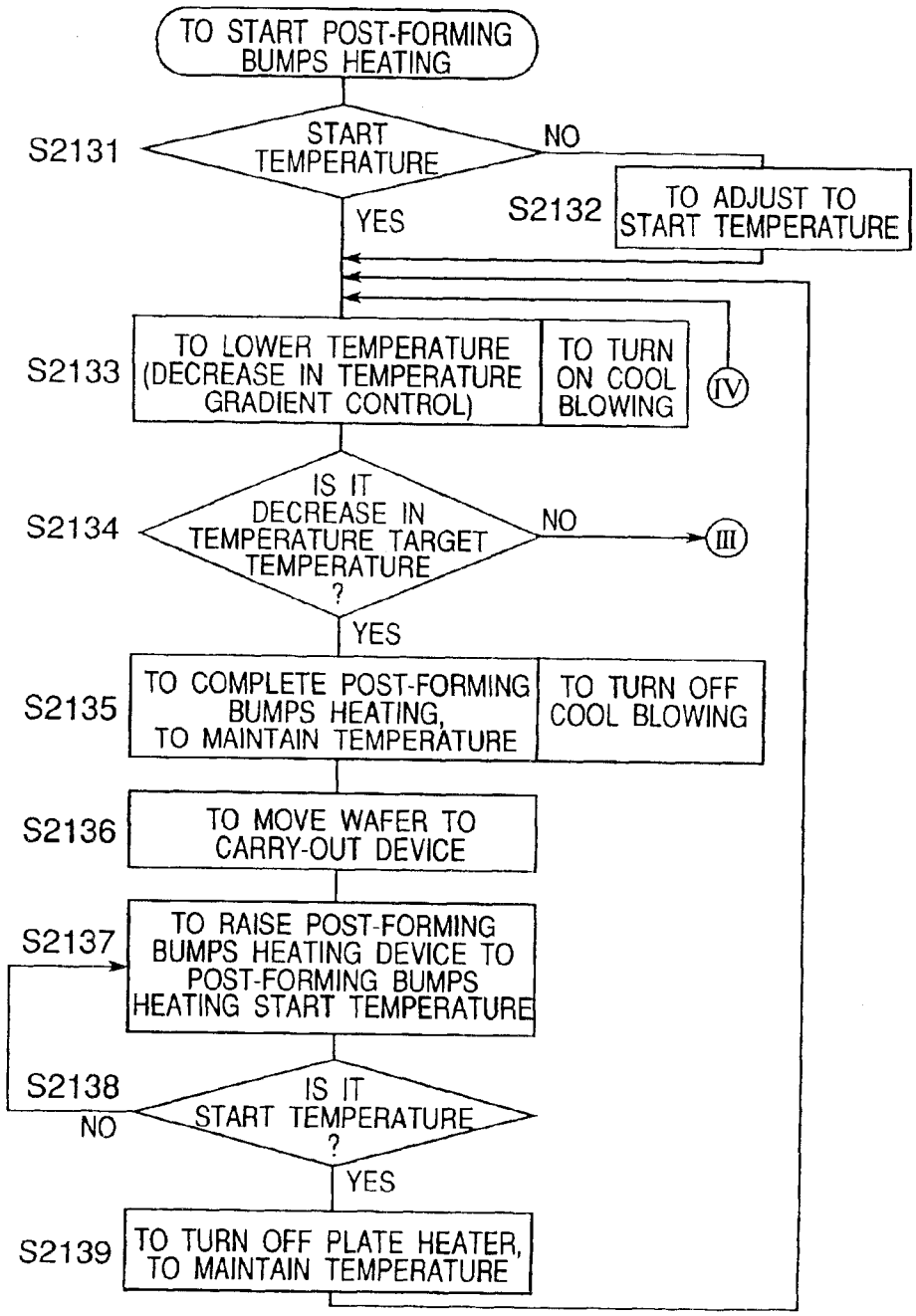
FIG. 79 is a flow chart of the post-forming bumps heating in FIG. 27.

FIG. 79 shows a flow of the entire operation in the above post-forming bumps heating operation. The operation is controlled by the controller 180. Specifically, whether the temperature of the aluminum plate 173 of the post-forming bumps heating device 570 is a start temperature or not is determined in step 2131. When the aluminum plate is not at the start temperature, the aluminum plate is adjusted to the start temperature in step 2132 by heating using the plate heater 171 or by cooling through the air supply by the air supply device 175. The start temperature is approximately 200° C. in the example, and the temperature of the aluminum plate 173 is measured by the temperature sensor 176.

Figure 80:
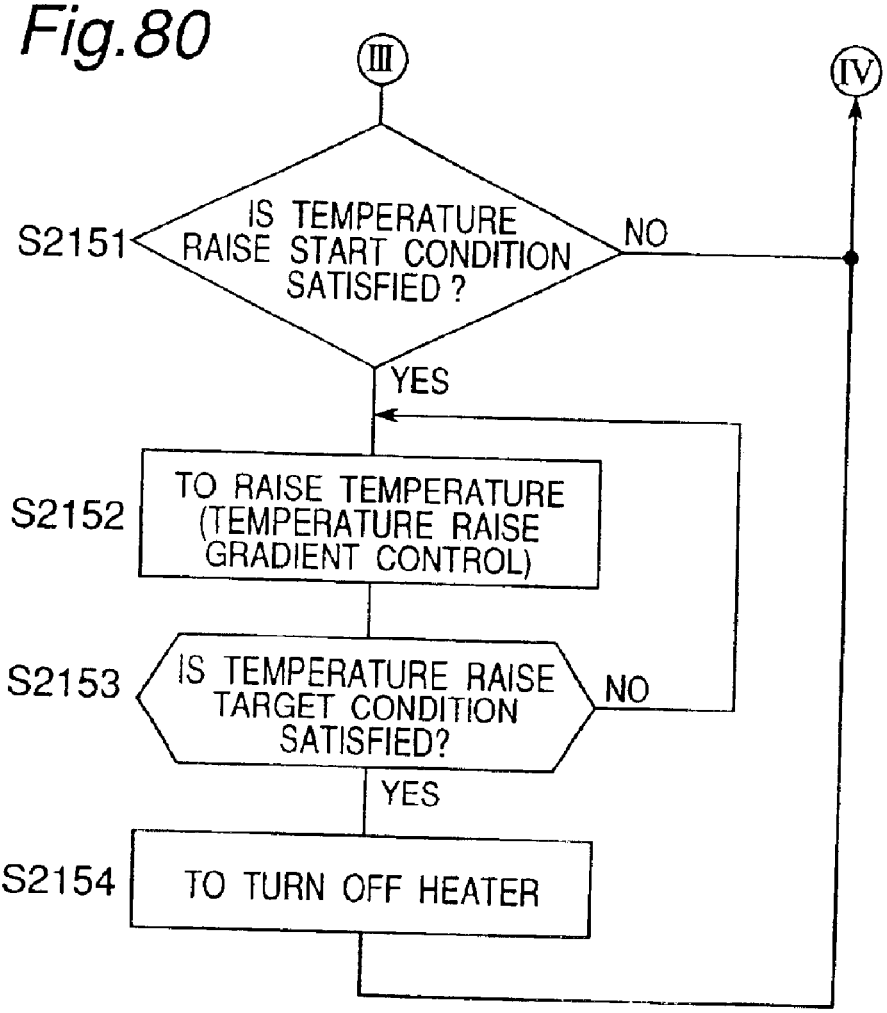
FIG. 80 is a flow chart of a decrease in temperature control in FIG. 79.

In step 2133, with the decrease in temperature gradient being controlled, the decrease in temperature of the aluminum plate 173 (i.e., the wafer with formed bumps 202) is started by the supply of air by the air supply device 175. It is determined in step 2134 whether the aluminum plate 173 reaches a decrease in temperature target temperature or not. The decrease in temperature target temperature at the aluminum plate 173 is 40° C. in the example. Steps 2151–2154 of FIG. 80 are carried out in the event that the aluminum plate 173 has not reached the decrease in temperature target temperature.

The decrease in temperature operation to the decrease in temperature target temperature is executed in this manner by alternately repeating the decrease in temperature and the temperature rise in steps 2133, 2134 and 2151–2154 which is one of characteristic operations of the example. The decrease in temperature control will be described in detail later.

When the aluminum plate is determined to have reached the decrease in temperature target temperature in operation 2134, the step goes to step 2135, where the post-forming bumps heating operation is completed. The wafer with formed bumps 202 is transferred to the carry-out device 142 in step 2136. After the transfer, in step 2137, electricity is started to be supplied to the plate heater 171, thereby raising the temperature of the aluminum plate 173 to the start temperature. Whether the aluminum plate has been raised to the start temperature or not is determined in step 2138. When the aluminum plate is raised to the start temperature, the supply of electricity to the plate heater 171 is stopped to maintain the start temperature. The operation returns to step 2133 to prepare for the post-forming bumps heating operation of the next wafer with formed bumps 202.

The decrease in temperature control in the steps 2133, 2134 and 2151–2154 will now be described.

In step 2133, the aluminum plate 173 is lowered in temperature in accordance with a preliminarily set decrease in temperature gradient. The decrease in temperature gradient is set to be −20° C./min in the example. In step 2134, if the aluminum plate 173 has not reached the decrease in temperature target temperature, the operation goes to step 2151, and it is determined whether or not a temperature rise start condition is satisfied. The temperature of the aluminum plate 173, the period of time after the decrease in temperature starts, an amount of charge of the rear face 202b of the wafer with formed bumps 202, or the like similar to the above preheating control may be used as a physical quantity of the temperature rise start condition, among which the present example uses the temperature of the aluminum plate 173.

When the amount of charge of the rear face 202b is used, as shown in FIG. 78 referred to in the description of the preheating control, a plurality of through holes 252 are formed in the aluminum plate 173 or the like, and the electrostatic sensor 251 is arranged below the plate heater 171. The amount of charge of the rear face 202b is measured by the electrostatic sensor 251 through the through holes 252. The measured value is sent to the controller 180 to obtain the amount of charge.

Figure 81:
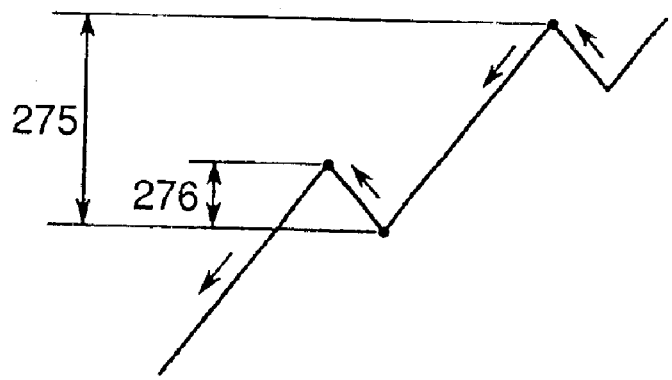
FIG. 81 is a graph of a decrease in temperature in the decrease in temperature control in FIG. 80.

In the case where the temperature of the aluminum plate 163 is selected as the physical quantity of the temperature rise start condition as in the example, in step 2151, a temperature width denoted by a reference numeral 275 in FIG. 81 is obtained based on each temperature of the aluminum plate 163 at the start of the decrease in temperature and at present, and whether the temperature width 275 has reached a predetermined value is determined. The operation goes to step 2152 when the temperature width has reached the predetermined value, or the operation returns to step 2133 when the temperature width has not reached the value.

According to this example, the temperature width 275 is set to be 30° C. The reference numeral 275 also corresponds to a time when the "time" is selected as the physical quantity of the temperature rise start condition. The time can be set to two minutes, for instance. The reference numeral 275 corresponds to an amount of charge when the "amount of charge" is selected, which can be set to, e.g., 300V±10%.

In step 2152, the supply of electricity to the plate heater 171 of the post-forming bumps heating device 570 is started to start raising the temperature of the aluminum plate 173. The temperature rise gradient at this time is set beforehand and is set to be +30° C./min in the example. The supply of air by the air supply device 175 is stopped in response to the start of the power supply to the plate heater 171.

In step 2153, whether or not a temperature rise target condition is satisfied is determined. For a physical quantity to be the temperature rise target condition, a "time", an "amount of charge" or the like is utilizable as well as the "temperature" employed by the example. The temperature width designated by a reference numeral 276 in FIG. 81 is obtained in step 2153 based on temperatures of the aluminum plate 173 at the start of the temperature rise and at the present, and whether or not the temperature width 276 has reached a predetermined value is determined. The step moves to step 2154 when the temperature width has reached the predetermined value. The step returns to step 2152 when the temperature width has not reached the predetermined value. The temperature width 276 is a value smaller than the temperature width 275 (that is, approximately ½ to ⅓ the temperature width 275). The temperature width is set to be 15° C. in the example. The reference numeral 276 corresponds to the time when the "time" is selected as the physical quantity of the temperature rise target condition and can be set to, for example, one minute. The reference numeral 276 corresponds to the difference in the amount of charge when the "amount of charge" is selected, which can be set to, for example, 100V±10%.

In step 2154, the power supply to the plate heater 171 of the post-forming bumps heating device 570 is stopped, whereby the temperature rise of the aluminum plate 173 is stopped. After the operation in step 2154 is completed, the step returns to step 2133.

Through the decrease in temperature control in steps 2133, 2134 and 2151–2154, the temperature of the aluminum plate 173 (namely, wafer with formed bumps 202) is decreased to the decrease in temperature target temperature while the decrease in temperature and the temperature rise are alternately repeatedly carried out. When the decrease in temperature and the temperature rise are alternately repeated, charge of primarily the rear face 202b of the wafer with formed bumps 202 are neutralized, because positive charge is generated through the temperature rise although negative charge is increased by the decrease in temperature. Since the temperature rise width is smaller than the decrease in temperature width as described above, negative charge is actually accumulated on the rear face 202b of the wafer with formed bumps 202 through the post-forming bumps heating operation as indicated by the reference numeral 303 in FIG. 74. However, the amount of charge can be greatly reduced in comparison with a case where the temperature of the wafer is decreased uniformly without alternately repeating the decrease in temperature and the temperature rise. For example, the aluminum plate is charged to approximately −2000V to approximately −3000V in the case of a uniform decrease in temperature, whereas electric charge can be restricted to approximately −100V if the decrease in temperature and the temperature rise are alternately repeated.

After the post-forming bumps heating operation, step 8 in FIG. 27 is started to execute the following operations. The wafer holding part 1421 of the carry-out side transfer device 142 while holding the wafer with formed bumps 202 is moved by the operation of the moving device 1423 in the X direction to above the carry-out device 132. An arrangement after the movement is indicated in FIG. 56.

After the movement, the driving part 1324 of the carry-out device 132 drives, whereby the holding part 1323 is brought into contact with the rear face 202b of the wafer with formed bumps 202 as shown in FIG. 57, and the wafer with formed bumps 202 is moved up to float by approximately 1 mm from the holding hooks 1417 of the wafer holding part 1421. When the holding part 1323 comes in contact with the rear face 202b, the charge of the rear face 202b is grounded through the holding part 1323. The amount of charge of the rear face 202b is accordingly reduced as indicated by a reference numeral 305 in FIG. 74. The contact member 14100 for charge removal is maintained in contact with the front face 202a of the wafer with formed bumps 202 also when the wafer with formed bumps is moved up as described above. Therefore, similar to the case when the wafers 201 and 202 are delivered at the carry-in device 131 and bonding stage 110, even when a charge on the front face 202a is changed due to changing of an amount of charge on the rear face 202b because of the holding part 1323 coming in contact with the rear face 202b of the wafer with formed bumps 202, an amount of charge resulting from the change can be eliminated.

After the wafer with formed bumps is moved up, the wafer is held by the suction to the holding part 1323.

After the holding part 1323 holds the wafer with formed bumps 202, as shown in FIG. 58, the first holding member 1424 and the second holding member 1425 of the wafer holding part 1421 are opened by the driving part 1422, thus freeing the holding of the wafer with formed bumps 202.

As indicated in FIGS. 59 and 60, after the holding is freed, the holding part 1323 descends to place the wafer with formed bumps 202 onto the holding stage 1321. After the wafer with formed bumps is placed thereon, the holding stage 1321 holds the wafer with formed bumps 202 by suction according to the example.

In step 9 of FIG. 27, the holding stage 1321 holding the wafer with formed bumps 202 is moved in the X direction by the operation of the moving device 1322 of the carry-out device, thereby transferring the wafer with formed bumps 202 towards the second storage container 206.

In step 10, the holding stage 1321 stores the wafer with formed bumps 202 into the second storage container 206.

As described hereinabove, according to the bump forming apparatus 501 of the example, charge generated on the charge appearance semiconductor substrate (e.g., a piezoelectric substrate wafer or the like which generates charge in response to the temperature change) can be reduced to a level not damaging the circuit formed on the wafer and not breaking the wafer itself by the temperature rise control and the decrease in temperature control for the wafer without, for example, forming an aluminum film along the dicing lines of the wafer or without forming the aluminum film on the entire rear face of the wafer.

Particularly, in a case where the wafer is 0.2 mm thick or thinner, or where a distance between lines in the circuit formed on the wafer is smaller than 1 μm and especially a difference of line widths of adjacent lines is large, a large charge removal effect is obtained by the above temperature rise control and the decrease in temperature control in the preheating operation and post-forming bumps heating operation.

In the bump forming apparatus 501 of the modified example, the temperature rise gradient in the preheating operation is set to a constant value of 20° C./min, and the decrease in temperature gradient in the post-forming bumps heating operation is set to a constant value of −20° C./min. However, the gradient values are not limited to the above values. For example, different gradient values may be adopted near the start and the end of the preheating and post-forming bumps heating operation, and near the middle of the preheating and post-forming bumps heating operation.

The temperature rise gradient value, the temperature rise target temperature, the decrease in temperature start temperature, the decrease in temperature gradient value, the decrease in temperature target value in the preheating operation, the decrease in temperature gradient value, the decrease in temperature target temperature, the temperature rise start temperature, the temperature rise gradient value, and the temperature rise target value in the post-forming bumps heating operation may be stored beforehand in the memory 181 of the controller 180 for every kind, every material, every size or the like of the wafers to which bumps are to be formed. The control can be changed in accordance with the kind of wafers to be processed.

As described hereinabove in the modified example alike, specific temperature controls are carried out both at the temperature rise operation for the pre-forming bumps wafer 201 and at the decrease in temperature operation for the wafer with formed bumps 202. However, at least the decrease in temperature control only at the decrease in temperature operation from the bump bonding temperature to the room temperature is enough in the example. There is a reason for this as follows. That is, as described above, the wafers 201 and 202 have the characteristic that it is difficult to eliminate charge from once these wafers charged. Further the wafer 202 is stored in the second storage container 206 after being lowered from the bump bonding temperature to the room temperature. Therefore, if the wafer 202 is kept charged when stored in the second storage container, there would be a possibility that problems are caused. Accordingly, electric charge of the wafer 202 should be sufficiently eliminated.

In the example as well as the bump forming apparatus 101 described earlier, as shown in FIG. 61, while the wafer with formed bumps 202 is delivered from the wafer holding part 1421 of the carry-out side transfer device 142 to the carry-out device 132, the ion generator 190 is preferably disposed at least at a side of the rear face 202b of the wafer with formed bumps 202, more preferably to both sides including a side of the front face 202a.

Figure 82:
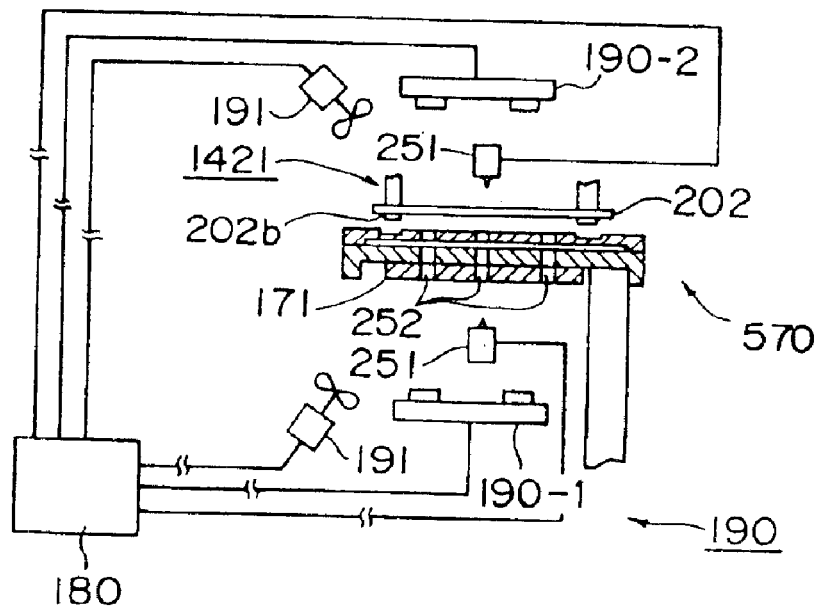
FIG. 82 is a diagram of a state in which the ion generator applies ions to the wafer with formed bumps in the post-forming bumps heating in FIG. 27.

For efficiently removing charge during the post-forming bumps heating operation before delivering the wafer with formed bumps 202 to the carry-out device 132 from the wafer holding part 1421, as shown in FIG. 82, ions by the ion generator 190 are preferably applied to at least the rear face 202b of the wafer with formed bumps 202, and more preferably to both faces including the front face 202a of the wafer with formed bumps. If the blower 191 is added, charge can be more effectively removed. A quantity of ions to be generated by the ion generator 190 and the volume of air to be sent from the blower 191 may be controlled by the controller 180 based on the measured amount of charge of at least the rear face 202b, and preferably both faces including the front face 202a while measuring the amount of charge with the electrostatic sensor 251.

In order to apply the ions to the rear face 202b, the ion generator 190 is arranged below the plate heater 171 of the post-forming bumps heating device 570, which necessitates forming through holes 252 described with reference to FIG. 78, as shown in FIG. 82.

Figure 83:
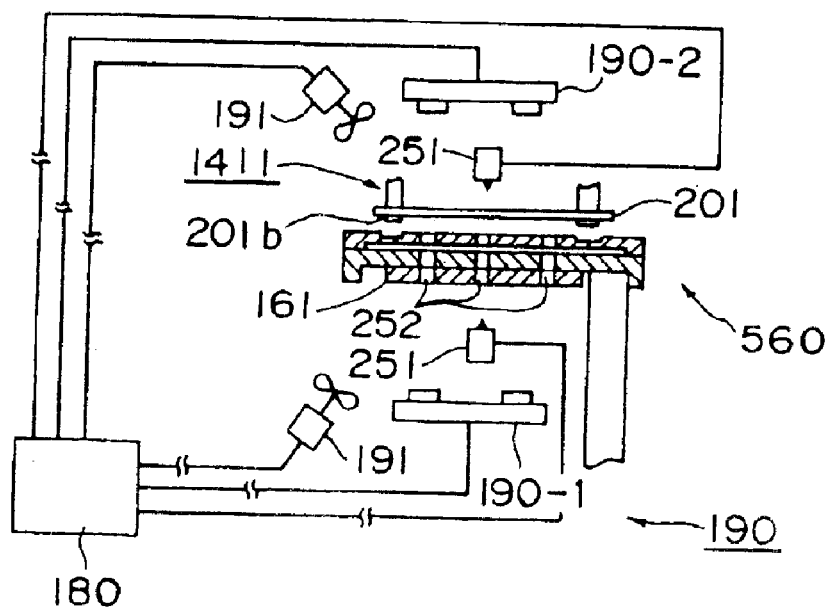
FIG. 83 is a diagram of a state in which the ion generator applies ions to the wafer before forming bumps in the preheating in FIG. 27.

Further, an arrangement is adoptable in which the ions from the ion generator 190 are also able to act in the preheating operation on at least the rear face 201b of the pre-forming bumps wafer 201, and preferably on both faces including the front face 201a. The blower 191 and the electrostatic sensor 251 may be added to the arrangement. Charges can be more efficiently removed in the preheating operation alike in this arrangement, although the preheat device 560 should be provided with through holes 252 as in FIG. 83 to apply the ions to the rear face 201b.

Figure 62:
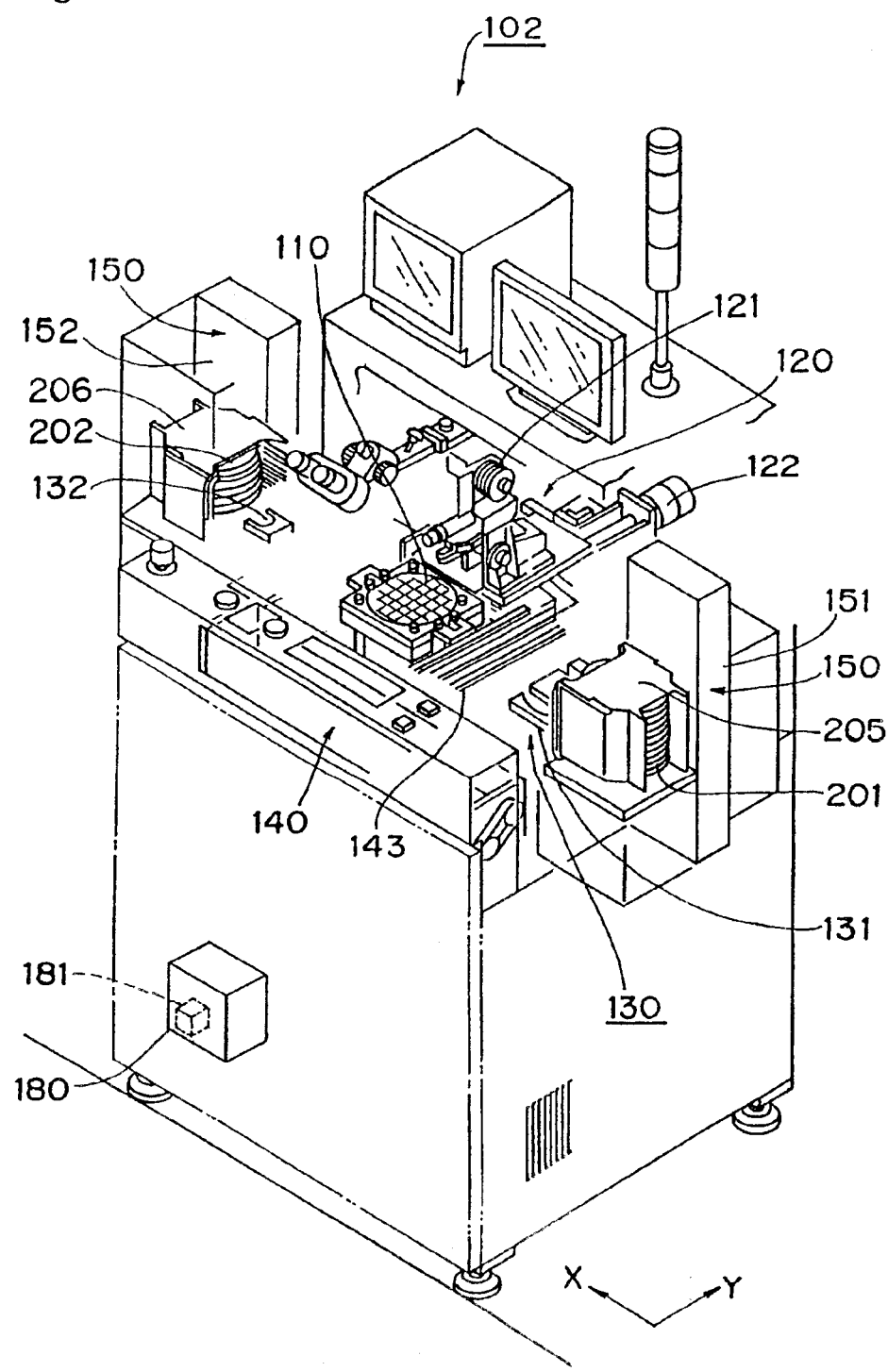
FIG. 62 is a perspective view of a modified example of the bump forming apparatus of FIG. 1.
Figure 84:
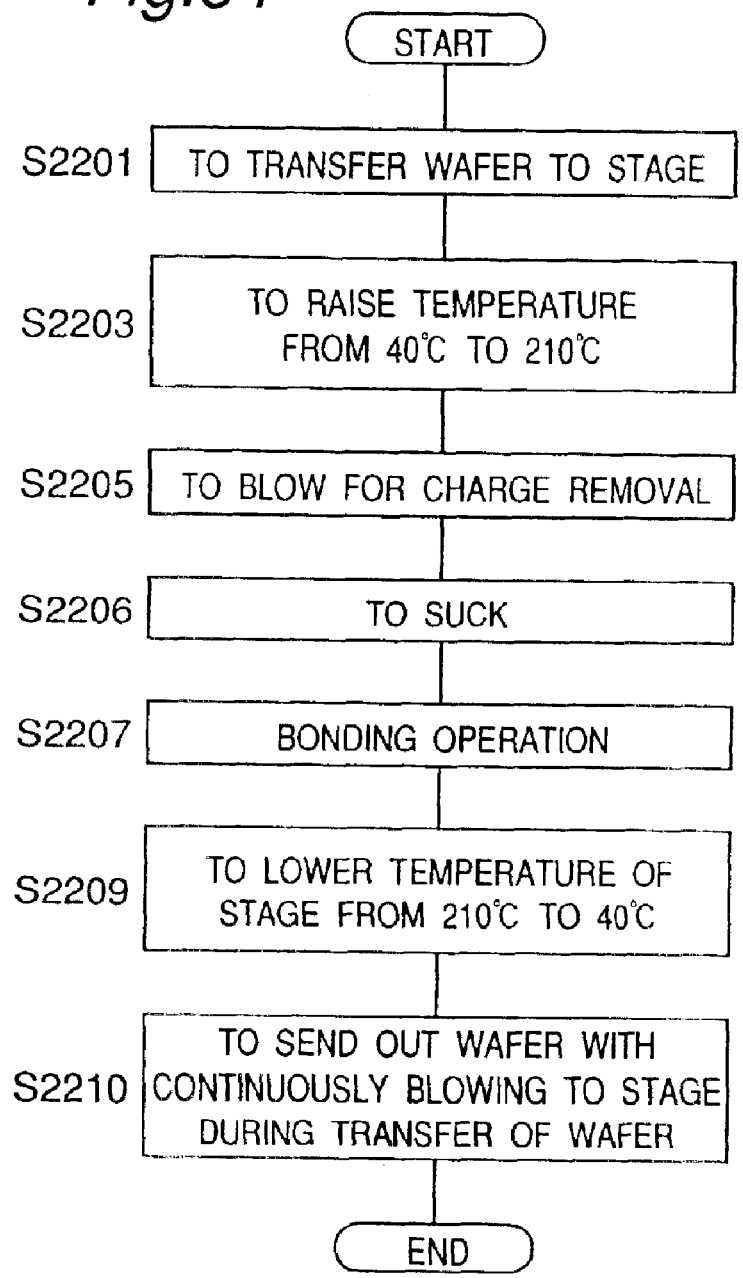
FIG. 84 is a flow chart explanatory of the blowing operation for charge removal which is executed by the bump forming apparatus of FIG. 62.
Figure 85:
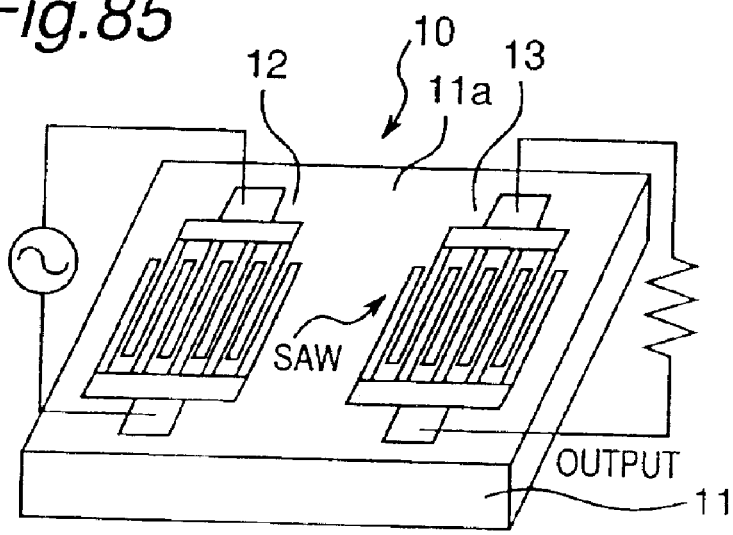
FIG. 85 is a perspective view of a structure of a SAW filter.
Figure 86:
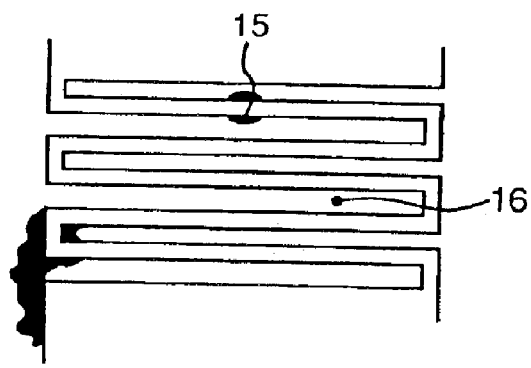
FIG. 86 is a diagram of damage at a comb-toothed circuit part of the SAW filter.
Figure 87:
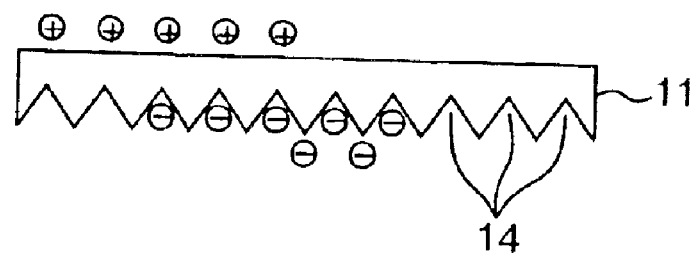
FIG. 87 is a diagram explanatory of a state where front and rear faces of a piezoelectric substrate wafer are charged.

Similar to the description with reference to FIGS. 62 and 63, the preheat device 560 and the post-forming bumps heating device 570 may also be eliminated from the bump forming apparatus 501 of the modified example, wherein the operation shown in FIG. 84 is carried out. That is, the charge appearance semiconductor substrate such as the pre-forming bumps wafer 201 or the like is positioned at a distance of approximately 1-several mm from the wafer laying stage 111, and preheated. After the preheating operation, the charge appearance semiconductor substrate is placed on the wafer laying stage 111 to execute bump bonding. After the bump bonding, the charge appearance semiconductor substrate is arranged in a non-contact state above the wafer laying stage 111 again and heated for post-forming bumps. In step 2201 of FIG. 84, with the use of, for example, the transfer device 143 such as the carry-out side transfer device 141 or the like, the pre-forming bumps wafer 201 which is the charge appearance semiconductor substrate is moved from the carry unit 130 to above the wafer laying stage 111 of the bonding stage 110. The wafer laying stage 111 at this time shows a temperature of approximately 40° C.

In step 2203, as described before, the pre-forming bumps wafer 201 is raised in temperature at the temperature rise rate of 20° C./min while the temperature rise and the decrease in temperature are repeated.

In step 2205, the blower 115 is driven to blow the hot air through air holes 113 of the wafer laying stage 111 to the pre-forming bumps wafer 201. The charge charged on the pre-forming bumps wafer 201 is discharged in the air and removed accordingly. After the blowing, in step 2206, the pre-forming bumps wafer 201 is carried to the wafer laying stage 111, and the suction device 114 is operated to suck the pre-forming bumps wafer 201 onto the wafer laying stage 111.

In step 2207, bump bonding is carried out on the pre-forming bumps wafer 201.

In step 2209, the wafer laying stage 111 is moved up to make the transfer device 143 hold the charge appearance semiconductor substrate. The wafer laying stage 111 is moved down so as to keep the distance between the charge appearance semiconductor substrate and the wafer laying stage 111 about 1-several mm. The temperature of the wafer laying stage 111 is decreased from approximately 210° C. to approximately 40° C. at the decrease in temperature rate of, for example, 20° C./min by repeating the decrease in temperature and the temperature rise. In this operation, the blowing operation for charge removal carried out in step 2205 may be conducted concurrently. In step 2210, the wafer with formed bumps 202 is moved by the transfer device from the wafer laying stage 111 to the carry-out device 132.

In the structure in which the blower is installed on each of the preheat device 560 and the post-forming bumps heating device 570 in the bump forming apparatus 501 equipped with the preheat device 560 and post-forming bumps heating device 570, the above blowing operation for charge removal may be carried out by working the blower to jet the gas also in the preheating operation and the post-forming bumps heating operation in the bump forming apparatus 501 with the preheat device 560 and post-forming bumps heating device 570.

The blowing operation for charge removal enables elimination of charge of the charge appearance semiconductor substrate. Particularly, when the grooves 14 are formed on the rear face of the charge appearance semiconductor substrate, charge in the grooves 14 can be efficiently discharged in the air. Therefore, charge of the charge appearance semiconductor substrate can be more efficiently removed by the blowing operation for charge removal executed concurrently with the zigzag temperature control of the repeated temperature rise and decrease in temperature and, moreover, by the application of the ion to the charge appearance semiconductor substrate.

Processing with the use of the sub plate is possible also in the bump forming apparatus 501 of the example.

The entire disclosure of Japanese Patent Application Nos. 11-189053 filed on Jul. 2, 1999, 11-308955 filed on Oct. 29, 1999, 11-293702 filed on Oct. 15, 1999, 11-323979 filed on Nov. 15, 1999 and 2000-184467 filed on Jun. 20, 2000, including descriptions, claims, drawings and summaries are all incorporated herein by reference.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for removing charge of charge appearance semiconductor substrates which generate electric charge in consequence of a temperature change thereof, which comprises:

forming bumps to electrodes of a circuit on the substrate with the substrate heated to a bump bonding temperature necessary for forming the bumps, allowing the substrate to be cooled after forming bumps, and eliminating electric charge which is generated to the substrate as a result of a decrease in temperature while the substrate is cooled through a load member on which the substrate is placed.

2. The charge removal method for charge appearance semiconductor substrates according to claim 1, further comprising blowing a gas to the substrate placed on the load member for eliminating charge generated to the substrate.

3. The charge removal method for charge appearance semiconductor substrates according to claim 1, further comprising applying ions to the substrate for neutralizing charge accumulated to the substrate.

4. The charge removal method for charge appearance semiconductor substrates according to claim 1, further comprising:

eliminating charge generated to a circuit-formed face of the substrate by bringing a contact member for charge removal into contact with the circuit-formed face of the substrate.

5. A method for removing charge of charge appearance semiconductor substrates which is carried out by a bump forming apparatus, the method comprising:

forming bumps to electrodes formed in a circuit on the substrate which generates electric charge due to a temperature change when the substrate is heated to a bump bonding temperature necessary for forming the bumps;

after the bump-forming, allowing the substrate to be cooled using a cooling device arranged in a non-contact state with respect to the substrate for heating the substrate to thereby adjust a decrease in temperature of the substrate, and when the substrate is cooling, executing a decrease in temperature control for eliminating electric charge generated as a result of the decrease in temperature while cooling the substrate using the cooling device.

6. The charge removal method for charge appearance semiconductor substrates according to claim 5, wherein said executing the decrease in temperature control comprises alternately repeating a decrease in temperature and a temperature rise by a temperature width smaller than a decrease in temperature width of the decrease in temperature.

7. A charge appearance semiconductor substrate with electric charge eliminated by the charge removal method for charge appearance semiconductor substrates according to claim 5.

8. A method for removing charge of charge appearance semiconductor substrates, which comprises:

bringing a charge appearance semiconductor substrate into contact with a contact member for charge removal; and eliminating electric charge generated to the substrate, wherein the charge appearance semiconductor substrate comprises a region for charge removal which is formed to a front face as a circuit-formed face of the charge appearance semiconductor substrate which generates electric charge due to a temperature change, and which is formed of a conductor for eliminating electric charge generated to the substrate, and dicing lines, connected to the region for charge removal, for dicing circuit-formed parts formed to the front face from the substrate, and wherein said eliminating electric charge comprises bringing the contact member for charge removal in contact with the front face of the substrate to remove an amount of charge generated to the front face.

* * * * *